(12) United States Patent
Nakamura et al.

(10) Patent No.: US 12,219,790 B2
(45) Date of Patent: Feb. 4, 2025

(54) ORGANIC DEVICE, GROUP OF MASKS, MASK, AND MANUFACTURING METHOD FOR ORGANIC DEVICE

(71) Applicant: Dai Nippon Printing Co., Ltd., Tokyo (JP)

(72) Inventors: Yoko Nakamura, Tokyo (JP); Yasuyuki Oyagi, Tokyo (JP); Yukio Taniguchi, Tokyo (JP); Ryuji Horiguchi, Tokyo (JP); Isao Inoue, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 617 days.

(21) Appl. No.: 17/646,046

(22) Filed: Dec. 27, 2021

(65) Prior Publication Data
US 2022/0209169 A1    Jun. 30, 2022

(30) Foreign Application Priority Data

Dec. 28, 2020    (JP) ................................ 2020-219385

(51) Int. Cl.
*H10K 71/60*        (2023.01)
*H10K 50/813*      (2023.01)
(Continued)

(52) U.S. Cl.
CPC ......... *H10K 50/813* (2023.02); *H10K 59/121* (2023.02); *H10K 59/65* (2023.02);
(Continued)

(58) Field of Classification Search
CPC ...... H10K 71/60; H10K 71/621; H10K 59/65; H10K 50/813
(Continued)

(56) References Cited

U.S. PATENT DOCUMENTS

2011/0037065 A1    2/2011    Ueno et al.
2011/0163327 A1    7/2011    Ueno et al.
(Continued)

FOREIGN PATENT DOCUMENTS

CN    110767713 A    2/2020
JP    3539597 B2    7/2004
(Continued)

OTHER PUBLICATIONS

Extended European Search Report (Application No. 21217919.6) dated May 25, 2022.
(Continued)

*Primary Examiner* — Christopher M Raabe
(74) *Attorney, Agent, or Firm* — BURR PATENT LAW, PLLC

(57) ABSTRACT

An organic device may include a substrate, first electrodes on the substrate, organic layers on the first electrodes, and a second electrode n the organic layers. When viewed in a direction normal to the substrate, the organic device may include a first display area that includes the second electrode at a first occupancy, and a second display area that includes the second electrode at a second occupancy lower than the first occupancy. In the second display area, the organic layers may be arranged in intersecting first and second directions, and the second electrode may include electrode lines arranged in the first direction. Each electrode line may include electrode sections arranged in the second direction and overlapping the organic layers. Any adjacent two electrode sections in the second direction may be connected. The electrode sections may include first and second electrode sections respectively having different first and second shapes.

25 Claims, 40 Drawing Sheets

(51) Int. Cl.
  *H10K 59/121* (2023.01)
  *H10K 59/65* (2023.01)
  *H10K 71/00* (2023.01)
  *H10K 59/12* (2023.01)

(52) U.S. Cl.
  CPC ........... *H10K 71/00* (2023.02); *H10K 71/621* (2023.02); *H10K 59/1201* (2023.02)

(58) Field of Classification Search
  USPC ............................................................ 430/5
  See application file for complete search history.

(56) References Cited

U.S. PATENT DOCUMENTS

| | | |
|---|---|---|
| 2012/0146010 A1 | 6/2012 | Ueno et al. |
| 2014/0008638 A1 | 1/2014 | Otsuki et al. |
| 2016/0254495 A1 | 9/2016 | Amano et al. |
| 2018/0226581 A1 | 8/2018 | Chang et al. |
| 2019/0140031 A1* | 5/2019 | Lamkin ................ H10K 71/621 |
| 2020/0335730 A1 | 10/2020 | Oh et al. |
| 2020/0381495 A1 | 12/2020 | Jeon et al. |
| 2021/0047536 A1 | 2/2021 | Chang et al. |
| 2021/0065625 A1 | 3/2021 | Wang et al. |
| 2021/0167138 A1* | 6/2021 | Xiao .................... H10K 59/121 |
| 2022/0165984 A1* | 5/2022 | Choi ....................... H10K 59/38 |
| 2022/0209124 A1* | 6/2022 | Nakamura ............ C23C 14/042 |
| 2022/0316043 A1* | 10/2022 | Xue ........................ H10K 50/81 |
| 2022/0319411 A1* | 10/2022 | Cheng ................ H10K 59/1213 |
| 2022/0392969 A1* | 12/2022 | Zhang .................. H10K 59/353 |
| 2022/0399503 A1* | 12/2022 | Nakamura ............ C23C 14/042 |
| 2022/0406853 A1* | 12/2022 | Miyatani ............. H10K 71/621 |
| 2023/0217783 A1* | 7/2023 | Kim ..................... H10K 59/121 |
| | | 257/40 |

FOREIGN PATENT DOCUMENTS

| | | |
|---|---|---|
| JP | 2010-272891 A | 12/2010 |
| JP | 2011-119681 A | 6/2011 |
| JP | WO2012/018082 A1 | 2/2012 |
| JP | 2012-069963 A | 4/2012 |
| JP | 2018-109219 A | 7/2018 |
| WO | 2012/132126 A1 | 10/2012 |
| WO | 2017/072678 A1 | 5/2017 |
| WO | 2019/150327 A1 | 8/2019 |
| WO | 2019/242510 A1 | 12/2019 |

OTHER PUBLICATIONS

Taiwanese Office Action (with English translation) dated Sep. 18, 2024 (Application No. 110149091).

* cited by examiner

ORGANIC DEVICE, GROUP OF MASKS, MASK, AND MANUFACTURING METHOD FOR ORGANIC DEVICE

CROSS-REFERENCE TO RELATED APPLICATIONS

This application is based upon and claims the benefit of priority from Japanese Patent Application No. 2020-219385, filed on Dec. 28, 2020; the entire contents of which are incorporated herein by reference.

BACKGROUND

Field

An embodiment of the present disclosure relates to an organic device, a group of masks, a mask, and a manufacturing method for an organic device.

Background Art

In recent years, in electronic devices, such as smartphones and tablet PCs, a high-resolution display device is desired in the market. The display device has, for example, a pixel density of 400 ppi or higher or a pixel density of 800 ppi or higher.

Since an organic EL device has a high responsivity or a low power consumption or both, the organic EL display device has become a focus of attention. A method of depositing the material of pixels on a substrate by vapor deposition is known as a method of forming the pixels of an organic EL display device. For example, initially, a substrate on which anodes are formed in a pattern corresponding to elements is prepared. Subsequently, an organic layer is formed on each of the anodes by depositing an organic material on the anode via a corresponding one of the through-holes of a mask. After that, a cathode is formed on each of the organic layers by depositing a conductive material on the organic layer via a corresponding one of the through-holes of the mask.

Patent Document 1: Japanese Patent No. 3539597

SUMMARY

As the area of each cathode increases, the electrical resistance of the cathode decreases. On the other hand, as the area of each cathode increases, the transmittance of light in an organic device decreases.

One embodiment of the present disclosure provides an organic device. The organic device may include a substrate, first electrodes disposed on the substrate, organic layers respectively disposed on the first electrodes, and a second electrode disposed on the organic layers. When the organic device is viewed in a direction normal to the substrate, the organic device may include a first display area that includes the second electrode at a first occupancy and a second display area that includes the second electrode at a second occupancy lower than the first occupancy. In the second display area, the organic layers may be arranged in a first direction and in a second direction that intersects with the first direction. In the second display area, the second electrode may include electrode lines arranged in the first direction. Each of the electrode lines may include electrode sections that are arranged in the second direction and that overlap the organic layers. Any adjacent two of the electrode sections in the second direction may be connected to each other. The electrode sections may include a first electrode section having a first shape and a second electrode section having a second shape different from the first shape.

According to the embodiment of the present disclosure, it is possible to increase the transmittance of light in an organic device.

DESCRIPTION OF THE EMBODIMENTS

Figure 1:
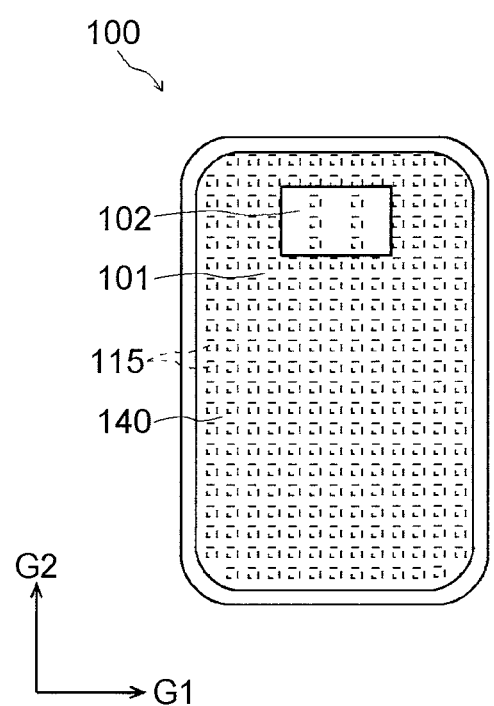
FIG. 1 is a plan view of an example of an organic device according to an embodiment of the present disclosure.

In the specification and the attached drawings, unless otherwise described, terms that mean substances that are the basis of components, such as "substrate", "substrate material", "plate", "sheet", and "film", are not distinguished from one another by the difference in name.

In the specification and the attached drawings, unless otherwise described, terms, such as "parallel" and "orthogonal", values of length and angle, and the like that determine shapes, geometrical conditions and the degrees of them are not limited to strict meanings and are interpreted by including the range of degrees to which similar functions may be expected.

In the specification and the attached drawings, unless otherwise described, when a component of a member, an area, or the like is "on" and "under", "upper side" and "lower side", or "upward" and "downward" of another component of another member, another area, or the like, it includes a case where a component is directly in contact with another component. Furthermore, it also includes a case where further another component is included between a component and another component, that is, a component and another component are indirectly in contact with each other. Unless otherwise described, words "up", "upper side", and "upward", or "down", "lower side", and "downward" may be inverted upside down.

In the specification and the attached drawings, unless otherwise described, the same or similar reference signs denote the same portions or portions having similar functions, and the repeated description can be omitted. The scale ratio of the drawings can be different from the actual ratio for the sake of convenience of illustration, and a portion of components can be omitted from the drawings.

In the specification and the attached drawings, unless otherwise described, an embodiment of the present disclosure may be combined with another embodiment or a modification without any contradiction. Alternatively, other embodiments or another embodiment and a modification may also be combined with each other without any contradiction. Alternatively, modifications may also be combined with each other without any contradiction.

In the specification and the attached drawings, unless otherwise described, when a plurality of steps will be described for a method, such as a manufacturing method, another undisclosed step may be performed between the disclosed steps. The order of disclosed steps may be selected without any contradiction.

In the specification and the attached drawings, unless otherwise described, the range expressed by "X" to "Y" includes numeric values or elements assigned to "X" and For example, a numeric range defined by the expression "34 to 38 percent by mass" is equivalent to a numeric range defined by the expression "higher than or equal to 34 percent by mass and lower than or equal to 38 percent by mass". For example, a range defined by the expression "masks 50A to 50C" includes the masks 50A, 50B, 50C.

In an embodiment of the specification, an example in which a group of masks that includes a plurality of masks is used to form electrodes on a substrate when an organic EL display device is manufactured will be described. However, the uses of the group of the masks are not limited, and the present embodiment may be applied to a group of masks used in various uses. The group of the masks of the present embodiment may be used to, for example, form electrodes of an apparatus for displaying or projecting an image or a video to present virtual reality, so-called VR, or augmented reality, so-called AR. Alternatively, the group of the masks of the present embodiment may also be used to form electrodes of a display device other than an organic EL display device, such as electrodes of a liquid crystal display device. Alternatively, the group of the masks of the present embodiment may also be used to form electrodes of an organic device other than a display device, such as electrodes of a pressure sensor.

According to a first aspect of the present disclosure, an organic device includes a substrate; first electrodes disposed on the substrate; organic layers respectively disposed on the first electrodes; and a second electrode disposed on the organic layers, wherein, when the organic device is viewed in a direction normal to the substrate, the organic device includes a first display area that includes the second electrode at a first occupancy and a second display area that includes the second electrode at a second occupancy lower than the first occupancy, in the second display area, the organic layers are arranged in a first direction and in a second direction that intersects with the first direction, the second electrode includes electrode lines arranged in the first direction, each of the electrode lines includes electrode sections that are arranged in the second direction and that overlap the organic layers, any adjacent two of the electrode sections in the second direction are connected to each other, and the electrode sections include a first electrode section having a first shape and a second electrode section having a second shape different from the first shape.

According to a second aspect of the present disclosure, in the organic device according to the above-described first aspect, the first electrode section may include a first pixel section that overlaps the organic layer, and a first connection section connected to the first pixel section. The second electrode section may include a second pixel section that overlaps the organic layer, and a second connection section connected to the second pixel section. A shape of the first connection section may be different from a shape of the second connection section.

According to a third aspect of the present disclosure, in the organic device according to the above-described second aspect, an area of the first connection section may be different from an area of the second connection section.

According to a fourth aspect of the present disclosure, in the organic device according to the above-described second aspect or the above-described third aspect, the first connection section may include a first connection end connected to the first pixel section, and a second connection end disposed on a side opposite to the first connection end in the second direction. A location of the first connection end in the first direction may be the same as a location of the second connection end in the first direction. The second connection section may include a third connection end connected to the second pixel section, and a fourth connection end disposed on a side opposite to the third connection end in the second direction. A location of the third connection end in the first direction may be different from a location of the fourth connection end in the first direction.

According to a fifth aspect of the present disclosure, in the organic device according to any one of the above-described first aspect to the above-described fourth aspect, the first electrode section may include a first pixel section that overlaps the organic layer, and a first connection section connected to the first pixel section. The second electrode section may include a second pixel section that overlaps the organic layer, and a second connection section connected to the second pixel section. A shape of the first pixel section may be different from a shape of the second pixel section.

According to a sixth aspect of the present disclosure, in the organic device according to the above-described fifth aspect, an area of the first pixel section may be different from an area of the second pixel section.

According to a seventh aspect of the present disclosure, in the organic device according to the above-described fifth aspect or the above-described sixth aspect, a size of the first pixel section in the first direction may be different from a size of the second pixel section in the first direction.

According to an eighth aspect of the present disclosure, in the organic device according to any one of the above-described first aspect to the above-described seventh aspect, the electrode sections may include a first electrode connection at which the first electrode section and the second electrode section are connected in the second direction, and a second electrode connection at which the first electrode section and the first electrode section are connected in the second direction.

According to a ninth aspect of the present disclosure, in the organic device according to any one of the above-described first aspect to the above-described eighth aspect, the electrode sections may include a first electrode array in which the first electrode section and the second electrode section are arranged in the first direction, and a second electrode array in which the first electrode section and the first electrode section are arranged in the first direction.

According to a tenth aspect of the present disclosure, in the organic device according to any one of the above-described first aspect to the above-described ninth aspect, the electrode sections may include a third electrode section having a third shape different from the first shape and different from the second shape.

According to an eleventh aspect of the present disclosure, a group of masks having a first mask direction and a second mask direction that intersects with the first mask direction includes two or more masks, wherein each of the masks includes a blocking area and through-holes, when a mask stack in which the two or more masks are stacked is viewed in a direction normal to the masks, the mask stack includes a through area that overlaps the through-holes, when the mask stack is viewed in the direction normal to the masks, the mask stack has a first mask area that includes the through area with a first open area ratio, and a second mask area that includes the through area with a second open area ratio less than the first open area ratio, in the second mask area, the through area includes through lines arranged in the first mask direction, each of the through lines includes through sections arranged in the second mask direction, any adjacent two of the through sections in the second mask direction are connected to each other, and the through sections include a first through section having a first through shape and a second through section having a second through shape different from the first through shape.

According to a twelfth aspect of the present disclosure, in the group of the masks according to the above-described eleventh aspect, the first through section may include a first main section, and a first sub-section connected to the first main section. The second through section may include a second main section, and a second sub-section connected to the second main section. A shape of the first sub-section may be different from a shape of the second sub-section.

According to a thirteenth aspect of the present disclosure, in the group of the masks according to the above-described twelfth aspect, an area of the first sub-section may be different from an area of the second sub-section.

According to a fourteenth aspect of the present disclosure, in the group of the masks according to the above-described twelfth aspect or the above-described thirteenth aspect, the first sub-section may include a fifth connection end connected to the first main section, and a sixth connection end disposed on a side opposite to the fifth connection end in the second mask direction. A location of the fifth connection end in the first mask direction may be the same as a location of the sixth connection end in first mask direction. The second sub-section may include a seventh connection end connected to the second main section, and an eighth connection end disposed on a side opposite to the seventh connection end in the second mask direction. A location of the seventh connection end in the first mask direction may be different from a location of the eighth connection end in the first mask direction.

According to a fifteenth aspect of the present disclosure, in the group of the masks according to any one of the above-described eleventh aspect to the above-described fourteenth aspect, the first through section may include a first main section, and a first sub-section connected to the first main section. The second through section may include a second main section, and a second sub-section connected to the second main section. A shape of the first main section may be different from a shape of the second main section.

According to a sixteenth aspect of the present disclosure, in the group of the masks according to the above-described fifteenth aspect, an area of the first main section may be different from an area of the second main section.

According to a seventeenth aspect of the present disclosure, in the group of the masks according to the above-described fifteenth aspect or the above-described sixteenth aspect, a size of the first main section in the first mask direction may be different from a size of the second main section in the first mask direction.

According to an eighteenth aspect of the present disclosure, in the group of the masks according to any one of the above-described eleventh aspect to the above-described seventeenth aspect, the through sections may include a first mask connection at which the first through section and the second through section are connected in the second mask direction, and a second mask connection at which the first through section and the first through section are connected in the second mask direction.

According to a nineteenth aspect of the present disclosure, in the group of the masks according to any one of the above-described eleventh aspect to the above-described eighteenth aspect, the through sections may include a first mask array in which the first through section and the second through section are arranged in the first mask direction, and a second mask array in which the first through section and the first through section are arranged in the first mask direction.

According to a twentieth aspect of the present disclosure, in the group of the masks according to any one of the above-described eleventh aspect to the above-described nineteenth aspect, the through sections may include a third through section having a third through shape different from the first through shape and different from the second through shape.

According to a twenty-first aspect of the present disclosure, a mask having a first mask direction and a second mask direction that intersects with the first mask direction includes a blocking area; and through-holes, wherein, when the mask is viewed in a direction normal to the mask, the mask has a third mask area that includes the through-holes at a third open area ratio, and a fourth mask area that includes the through-holes at a fourth open area ratio less than the third open area ratio, in the third mask area, the through-holes are arranged at a fifteenth pitch in the first mask direction, in the fourth mask area, a gap between two of the through-holes arranged in the first mask direction is greater than the fifteenth pitch, and the fourth mask area includes the through-holes each having a shape different from a shape of each of the through-holes of the third mask area.

According to a twenty-second aspect of the present disclosure, in the mask according to the above-described twenty-first aspect, in the third mask area, each of the through-holes may include a main hole and a sub-hole. A gap between the main hole and the sub-hole may be greater than or equal to 5 μm and less than or equal to 40 μm. In the fourth mask area, the through-holes may include first-type through-holes and second-type through-holes. The number of the main holes of the first-type through-holes may be different from the number of the main holes of the second-type through-holes. Alternatively, the number of the sub-holes of the first-type through-holes may be different from the number of the sub-holes of the second-type through-holes.

According to a twenty-third aspect of the present disclosure, in the mask according to the above-described twenty-second aspect, in the fourth mask area, the through-holes may include a first hole array in which the first-type through-hole and the second-type through-hole are arranged in the first mask direction, and a second hole array in which the first-type through-hole and the first-type through-hole are arranged in the first mask direction.

According to a twenty-fourth aspect of the present disclosure, in the mask according to the above-described twenty-second aspect or the above-described twenty-third aspect, in the fourth mask area, the through-holes may include a fourth hole array in which the first-type through-hole and the second-type through-hole are arranged in the second mask direction, and a fifth hole array in which the second-type through-hole and the second-type through-hole are arranged in the second mask direction.

According to a twenty-fifth aspect of the present disclosure, a manufacturing method for an organic device includes a second electrode forming step of forming a second electrode on organic layers respectively on first electrodes on a substrate by using the group of the masks according to any one of the above-described eleventh aspect to the above-described twentieth aspect, wherein the second electrode forming step includes a step of forming a first layer of the second electrode by vapor deposition using a first one of the masks; and a step of forming a second layer of the second electrode by vapor deposition using a second one of the masks.

Hereinafter, an embodiment of the present disclosure will be described in detail with reference to the attached drawings. Embodiments described below are examples of the embodiment of the present disclosure, and the present disclosure should not be interpreted limitedly to only these embodiments.

Initially, an organic device 100 will be described. The organic device 100 includes an electrode formed by using a group of masks according to the present embodiment. FIG. 1 is a plan view of an example of the organic device 100 when viewed in a direction normal to the substrate of the organic device 100. In the following description, a view in a direction normal to the surface of a substance that is a basis for the substrate or the like is also referred to as plan view.

The organic device 100 includes the substrate, and a plurality of elements 115 arranged in the in-plane direction of the substrate. The elements 115 are, for example, pixels. As shown in FIG. 1, the organic device 100 may have a first display area 101 and a second display area 102 in plan view. The second display area 102 may include a smaller area than the first display area 101. As shown in FIG. 1, the second display area 102 may be surrounded by the first display area 101. Although not shown in the drawing, part of the outer edge of the second display area 102 may be located in the same straight line with part of the outer edge of the first display area 101.

Figure 2:
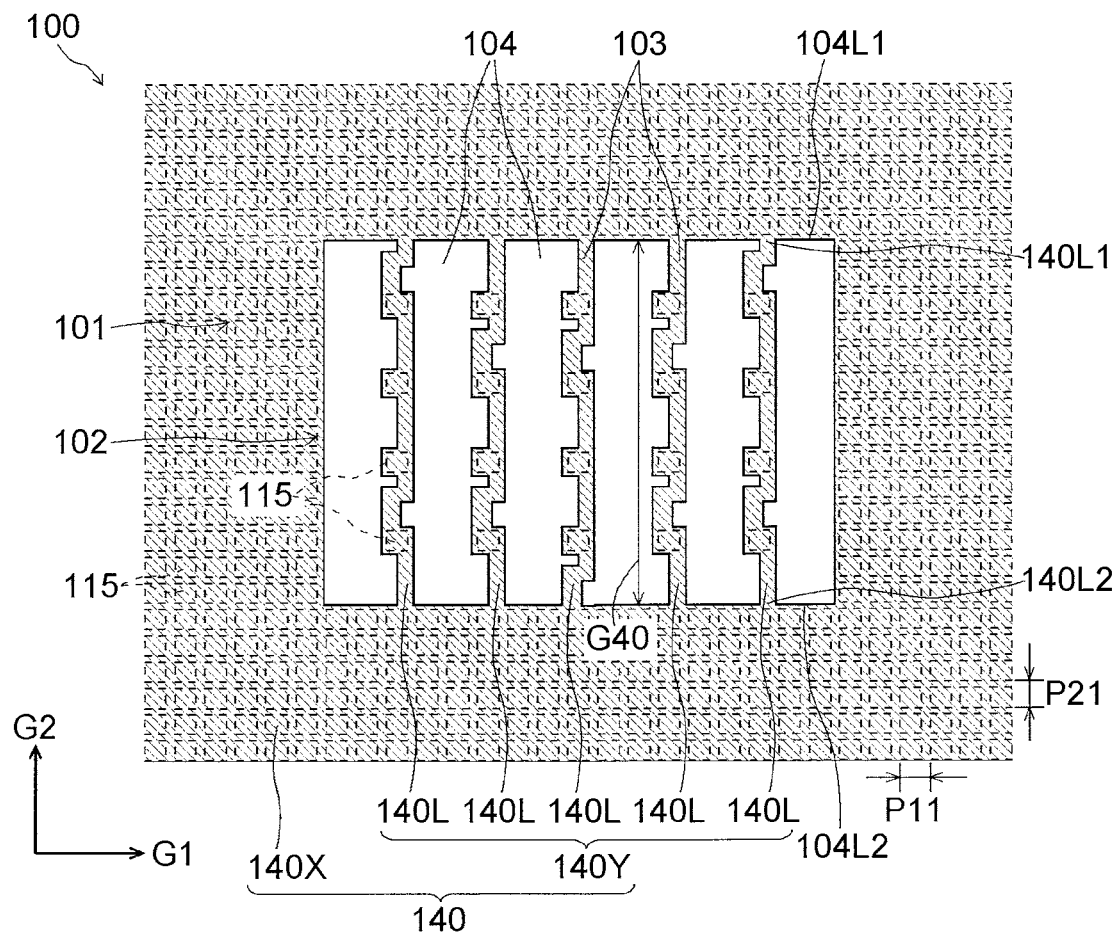
FIG. 2 is a plan view of a second display area of the organic device.

FIG. 2 is an enlarged plan view of the second display area 102 and its surroundings in FIG. 1. In the first display area 101, the elements 115 may be arranged in two different directions. In the example shown in FIGS. 1 and 2, the two or more elements 115 of the first display area 101 may be arranged in a first element direction G1. The two or more elements 115 of the first display area 101 may be arranged in a second element direction G2 that intersects with the first element direction G1. The second element direction G2 may be orthogonal to the first element direction G1.

The organic device 100 includes a second electrode 140. The second electrode 140 is located on organic layers 130 (described later). The second electrode 140 may be electrically connected to the two or more organic layers 130. For example, the second electrode 140 may overlap the two or more organic layers 130 in plan view. The second electrode 140 located in the first display area 101 is also referred to as second electrode 140X. The second electrode 140 located in the second display area 102 is also referred to as second electrode 140Y.

The second electrode 140X has a first occupancy. The first occupancy is calculated by dividing the total area of the second electrode 140 located in the first display area 101 by the area of the first display area 101. The second electrode 140Y has a second occupancy. The second occupancy is calculated by dividing the total area of the second electrode 140 located in the second display area 102 by the area of the second display area 102. The second occupancy may be lower than the first occupancy. For example, as shown in FIG. 2, the second display area 102 may include non-transmission areas 103 and transmission areas 104. The transmission areas 104 do not overlap the second electrode 140Y in plan view. The non-transmission areas 103 overlap the second electrode 140Y in plan view.

The ratio of the second occupancy to the first occupancy, for example, may be greater than or equal to 0.2, may be greater than or equal to 0.3, or may be greater than or equal to 0.4. The ratio of the second occupancy to the first occupancy, for example, may be less than or equal to 0.6, may be less than or equal to 0.7, or may be less than or equal to 0.8. The range of the ratio of the second occupancy to the first occupancy may be determined by a first group consisting of 0.2, 0.3, and 0.4, and/or a second group consisting of 0.6, 0.7, and 0.8. The range of the ratio of the second occupancy to the first occupancy may be determined by a combination of any one of the values in the first group and any one of the values in the second group. The range of the ratio of the second occupancy to the first occupancy may be determined by a combination of any two of the values in the first group. The range of the ratio of the second occupancy to the first occupancy may be determined by a combination of any two of the values in the second group. For example, the ratio of the second occupancy to the first occupancy may be greater than or equal to 0.2 and less than or equal to 0.8, may be greater than or equal to 0.2 and less than or equal to 0.7, may be greater than or equal to 0.2 and less than or equal to 0.6, may be greater than or equal to 0.2 and less than or equal to 0.4, may be greater than or equal to 0.2 and less than or equal to 0.3, may be greater than or equal to 0.3 and less than or equal to 0.8, may be greater than or equal to 0.3 and less than or equal to 0.7, may be greater than or equal to 0.3 and less than or equal to 0.6, may be greater than or equal to 0.3 and less than or equal to 0.4, may be greater than or equal to 0.4 and less than or equal to 0.8, may be greater than or equal to 0.4 and less than or equal to 0.7, may be greater than or equal to 0.4 and less than or equal to 0.6, may be greater than or equal to 0.6 and less than or equal to 0.8, may be greater than or equal to 0.6 and less than or equal to 0.7, or may be greater than or equal to 0.7 and less than or equal to 0.8.

The transmittance of the non-transmission areas 103 is also referred to as first transmittance. The transmittance of the transmission areas 104 is also referred to as second transmittance. Since the transmission areas 104 do not include the second electrode 140Y, the second transmittance is higher than the first transmittance. Therefore, in the second display area 102 that includes the transmission areas 104, light having reached the organic device 100 is able to pass through the transmission areas 104 and reach an optical component or the like on the back side of the substrate. The optical component is a component of, for example, a camera or the like that implements a function by detecting light. Since the second display area 102 includes the non-transmission areas 103, when the elements 115 are pixels, a video is able to be displayed in the second display area 102. In this way, the second display area 102 is able to detect light and display a video. Examples of the function of the second display area 102, implemented by detecting light, include sensors, such as a camera, a fingerprint sensor, and a face recognition sensor. As the second transmittance of the transmission areas 104 of the second display area 102 increases and the second occupancy decreases, the amount of light received by the sensor is able to be increased.

When any one of the size of each non-transmission area 103 in each of the first element direction G1 and the second element direction G2 and the size of each transmission area 104 in each of the first element direction G1 and the second element direction G2 is less than or equal to 1 mm, the first transmittance and the second transmittance are measured by using a microspectrophotometer. Any one of OSP-SP200 made by Olympus Corporation and LCF series made by Otsuka Electronics Co., Ltd. can be used as the microspectrophotometer. Any of the microspectrophotometers is capable of measuring a transmittance in a visible range greater than or equal to 380 nm and less than or equal to 780 nm. Any one of quartz, borosilicate glass for TFT liquid crystal, and non-alkali glass for TFT liquid crystal is used as a reference. Measurement results at 550 nm are used as the first transmittance and the second transmittance. When both the size of each non-transmission area 103 in each of the first element direction G1 and the second element direction G2 and the size of each transmission area 104 in each of the first element direction G1 and the second element direction G2 are greater than 1 mm, the first transmittance and the second transmittance are measured by using a spectrophotometer. Any one of ultraviolet and visible spectrophotometers UV-2600i and UV-3600i Plus made by Shimadzu Corporation can be used as the spectrophotometer. When a micro beam lens unit is attached to the spectrophotometer, the transmittance of an area with a size of up to 1 mm is able to be measured. Atmosphere is used as a reference. Measurement results at 550 nm are used as the first transmittance and the second transmittance.

TR2/TR1 that is the ratio of a second transmittance TR2 to a first transmittance TR1, for example, may be greater than or equal to 1.2, may be greater than or equal to 1.5, or may be greater than or equal to 1.8. TR2/TR1, for example, may be less than or equal to two, may be less than or equal to three, or may be less than or equal to four. The range of TR2/TR1 may be determined by a first group consisting of 1.2, 1.5, and 1.8 and/or a second group consisting of two, three, and four. The range of TR2/TR1 may be determined by a combination of any one of the values in the first group and any one of the values in the second group. The range of TR2/TR1 may be determined by a combination of any two of the values in the first group. The range of TR2/TR1 may be determined by a combination of any two of the values in the second group. For example, TR2/TR1 may be greater than or equal to 1.2 and less than or equal to four, may be greater than or equal to 1.2 and less than or equal to three, may be greater than or equal to 1.2 and less than or equal to two, may be greater than or equal to 1.2 and less than or equal to 1.8, may be greater than or equal to 1.2 and less than or equal to 1.5, may be greater than or equal to 1.5 and less than or equal to four, may be greater than or equal to 1.5 and less than or equal to three, may be greater than or equal to 1.5 and less than or equal to two, may be greater than or equal to 1.5 and less than or equal to 1.8, may be greater than or equal to 1.8 and less than or equal to four, may be greater than or equal to 1.8 and less than or equal to three, may be greater than or equal to 1.8 and less than or equal to two, may be greater than or equal to two and less than or equal to four, may be greater than or equal to two and less than or equal to three, or may be greater than or equal to three and less than or equal to four.

As shown in FIG. 2, the second electrode 140Y may include two or more electrode lines 140L arranged in the first element direction G1. Each of the electrode lines 140L may extend in the second element direction G2. For example, each of the electrode lines 140L may have a first end 140L1 and a second end 140L2 that are connected to the second electrode 140X of the first display area 101. The second end 140L2 is located on the side opposite to the first end 140L1 in the second element direction G2. Although not shown in the drawing, when part of the outer edge of the second display area 102 is located in the same straight line with part of the outer edge of the first display area 101, the number of ends of each of the electrode lines 140L, connected to the second electrode 140X, may be only one.

As shown in FIG. 2, any adjacent two of the electrode lines 140L in the first element direction G1 do not need to be connected to each other. Thus, the transmission areas 104 are able to spread in the second element direction G2 without being blocked by the electrode lines 140L. Therefore, it is possible to avoid the periodicity of each transmission area 104 in the second element direction G2. Thus, it is possible to reduce constructive interference between light waves passing through the transmission areas 104 at locations in the second element direction G2.

As shown in FIG. 2, the transmission areas 104 may cross the second display area 102 in the second element direction G2. For example, each of the electrode lines 140L may have a first end 140L1 and a second end 140L2 that are in contact with the second electrode 140X of the first display area 101. Thus, the size G40 of each transmission area 104 in the second element direction G2 can be further increased. Therefore, it is possible to reduce constructive interference between light waves passing through the transmission areas 104 at locations in the second element direction G2. The second end 140L2 is located on the side opposite to the first end 140L1 in the second element direction G2. The first end 104L1 and the second end 104L2 are respectively adjacent to the first end 140L1 and the second end 140L2 of another one of the electrode lines 140L in the first element direction G1. Although not shown in the drawing, when part of the outer edge of the second display area 102 is located in the same straight line with part of the outer edge of the first display area 101, the number of ends of each transmission area 104 in contact with the second electrode 140X in the second element direction G2 may be only one.

Since the size G40 of each transmission area 104 in the second element direction G2 is large, light having reached the organic device 100 easily passes through the second display area 102. For example, it is possible to further increase the transmittance of the second display area 102. Thus, it is possible to enhance the function of the second display area 102 to detect light.

All the transmission areas 104 do not need to cross the second display area 102. For example, the organic device 100 may include at least two transmission areas 104 that cross the second display area 102 in the second element direction G2. For example, the organic device 100 may include at least one set of the mutually not connected, adjacent two electrode lines 140L in the first element direction G1.

Figure 3:
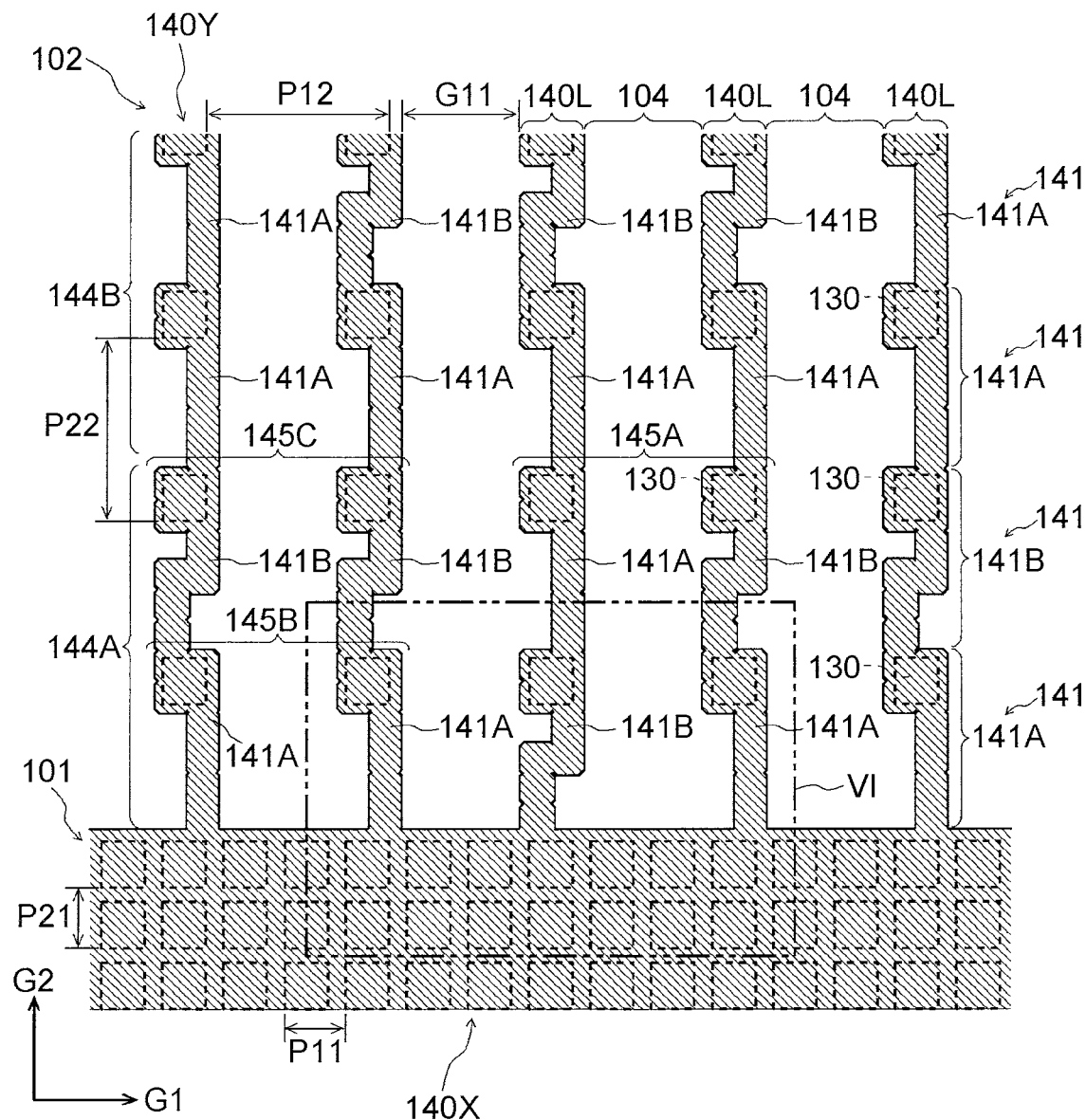
FIG. 3 is a plan view of a second electrode in the second display area.

FIG. 3 is an enlarged plan view of the second electrode 140X of the first display area 101 and the second electrode 140Y of the second display area 102. Each of the second electrode 140X and the second electrode 140Y may overlap the organic layers 130 in plan view. The organic layer 130 is one component of the element 115.

In the first display area 101, the organic layers 130 may be arranged at an eleventh pitch P11 in the first element direction G1. In the second display area 102, the organic layers 130 may be arranged at a twelfth pitch P12 in the first element direction G1. The twelfth pitch P12 may be greater than the eleventh pitch P11. Since the twelfth pitch P12 is greater than the eleventh pitch P11, the second occupancy of the second electrode 140Y decreases. Thus, the area of the transmission areas 104 increases, so it is possible to increase the amount of light received by the sensor. As will be described later, the twelfth pitch P12 may be the same as the eleventh pitch P11.

The ratio of the twelfth pitch P12 to the eleventh pitch P11, for example, may be greater than or equal to 1.0, may be greater than or equal to 1.1, may be greater than or equal to 1.3, or may be greater than or equal to 1.5. The ratio of the twelfth pitch P12 to the eleventh pitch P11, for example, may be less than or equal to 2.0, may be less than or equal to 3.0, or may be less than or equal to 4.0. The range of the ratio of the twelfth pitch P12 to the eleventh pitch P11 may be determined by a first group consisting of 1.0, 1.1, 1.3, and 1.5 and/or a second group consisting of 2.0, 3.0, and 4.0. The range of the ratio of the twelfth pitch P12 to the eleventh pitch P11 may be determined by a combination of any one of the values in the first group and any one of the values in the second group. The range of the ratio of the twelfth pitch P12 to the eleventh pitch P11 may be determined by a combination of any two of the values in the first group. The range of the ratio of the twelfth pitch P12 to the eleventh pitch P11 may be determined by a combination of any two of the values in the second group. For example, the ratio of the twelfth pitch P12 to the eleventh pitch P11 may be greater than or equal to 1.0 and less than or equal to 4.0, may be greater than or equal to 1.0 and less than or equal to 3.0, may be greater than or equal to 1.0 and less than or equal to 2.0, may be greater than or equal to 1.0 and less than or equal to 1.5, may be greater than or equal to 1.0 and less than or equal to 1.3, may be greater than or equal to 1.0 and less than or equal to 1.1, may be greater than or equal to 1.1 and less than or equal to 4.0, may be greater than or equal to 1.1 and less than or equal to 3.0, may be greater than or equal to 1.1 and less than or equal to 2.0, may be greater than or equal to 1.1 and less than or equal to 1.5, may be greater than or equal to 1.1 and less than or equal to 1.3, may be greater than or equal to 1.3 and less than or equal to 4.0, may be greater than or equal to 1.3 and less than or equal to 3.0, may be greater than or equal to 1.3 and less than or equal to 2.0, may be greater than or equal to 1.3 and less than or equal to 1.5, may be greater than or equal to 1.5 and less than or equal to 4.0, may be greater than or equal to 1.5 and less than or equal to 3.0, may be greater than or equal to 1.5 and less than or equal to 2.0, may be greater than or equal to 2.0 and less than or equal to 4.0, may be greater than or equal to 2.0 and less than or equal to 3.0, or may be greater than or equal to 3.0 and less than or equal to 4.0. When the ratio of the twelfth pitch P12 to the eleventh pitch P11 is small, the difference of the pixel density of the second display area 102 from the pixel density of the first display area 101 reduces. Thus, it is possible to reduce the visual difference between the first display area 101 and the second display area 102.

The size G40 of each transmission area 104 in the second element direction G2 may be determined with reference to the twelfth pitch P12. The ratio of the size G40 to the twelfth pitch P12, for example, may be greater than or equal to two, may be greater than or equal to five, or may be greater than or equal to 10. The ratio of the size G40 to the twelfth pitch P12, for example, may be less than or equal to 100, may be less than or equal to 300, may be less than or equal to 1000, or may be less than or equal to 2000. The range of the ratio of the size G40 to the twelfth pitch P12 may be determined by a first group consisting of two, five, and 10 and/or a second group consisting of 100, 300, 1000, and 2000. The range of the ratio of the size G40 to the twelfth pitch P12 may be determined by a combination of any one of the values in the first group and any one of the values in the second group. The range of the ratio of the size G40 to the twelfth pitch P12 may be determined by a combination of any two of the values in the first group. The range of the ratio of the size G40 to the twelfth pitch P12 may be determined by a combination of any two of the values in the second group. For example, the ratio of the size G40 to the twelfth pitch P12 may be greater than or equal to two and less than or equal to 3000, may be greater than or equal to two and less than or equal to 1000, may be greater than or equal to two and less than or equal to 300, may be greater than or equal to two and less than or equal to 100, may be greater than or equal to two and less than or equal to 10, may be greater than or equal to two and less than or equal to five, may be greater than or equal to five and less than or equal to 2000, may be greater than or equal to five and less than or equal to 1000, may be greater than or equal to five and less than or equal to 300, may be greater than or equal to five and less than or equal to 100, may be greater than or equal to five and less than or equal to 10, may be greater than or equal to 10 and less than or equal to 2000, may be greater than or equal to 10 and less than or equal to 1000, may be greater than or equal to 10 and less than or equal to 300, may be greater than or equal to 10 and less than or equal to 100, may be greater than or equal to 100 and less than or equal to 2000, may be greater than or equal to 100 and less than or equal to 1000, may be greater than or equal to 100 and less than or equal to 300, may be greater than or equal to 300 and less than or equal to 2000, may be greater than or equal to 300 and less than or equal to 1000, or may be greater than or equal to 1000 and less than or equal to 2000. When the ratio of the size G40 to the twelfth pitch P12 is increased, it is possible to reduce constructive interference between light waves passing through the transmission areas 104 at locations in the second element direction G2.

The size G40 is calculated by measuring the size, in the second element direction G2, of each of the transmission areas 104 located in the second display area 102 and averaging the measured sizes.

In the first display area 101, the organic layers 130 may be arranged at a twenty-first pitch P21 in the second element direction G2. In the second display area 102, the organic layers 130 may be arranged at a twenty-second pitch P22 in the second element direction G2. The twenty-second pitch P22 may be greater than the twenty-first pitch P21. As will be described later, the twenty-second pitch P22 may be the same as the twenty-first pitch P21.

The ratio of the twenty-second pitch P22 to the twenty-first pitch P21, for example, may be greater than or equal to 1.0, may be greater than or equal to 1.1, may be greater than or equal to 1.3, or may be greater than or equal to 1.5. The ratio of the twenty-second pitch P22 to the twenty-first pitch P21, for example, may be less than or equal to 2.0, may be less than or equal to 3.0, or may be less than or equal to 4.0. The range of the ratio of the twenty-second pitch P22 to the twenty-first pitch P21 may be determined by a first group consisting of 1.0, 1.1, 1.3, and 1.5 and/or a second group consisting of 2.0, 3.0, and 4.0. The range of the ratio of the twenty-second pitch P22 to the twenty-first pitch P21 may be determined by a combination of any one of the values in the first group and any one of the values in the second group. The range of the ratio of the twenty-second pitch P22 to the twenty-first pitch P21 may be determined by a combination of any two of the values in the first group. The range of the ratio of the twenty-second pitch P22 to the twenty-first pitch P21 may be determined by a combination of any two of the values in the second group. For example, the ratio of the twenty-second pitch P22 to the twenty-first pitch P21 may be greater than or equal to 1.0 and less than or equal to 4.0, may be greater than or equal to 1.0 and less than or equal to 3.0, may be greater than or equal to 1.0 and less than or equal to 2.0, may be greater than or equal to 1.0 and less than or equal to 1.5, may be greater than or equal to 1.0 and less than or equal to 1.3, may be greater than or equal to 1.0 and less than or equal to 1.1, may be greater than or equal to 1.1 and less than or equal to 4.0, may be greater than or equal to 1.1 and less than or equal to 3.0, may be greater than or equal to 1.1 and less than or equal to 2.0, may be greater than or equal to 1.1 and less than or equal to 1.5, may be greater than or equal to 1.1 and less than or equal to 1.3, may be greater than or equal to 1.3 and less than or equal to 4.0, may be greater than or equal to 1.3 and less than or equal to 3.0, may be greater than or equal to 1.3 and less than or equal to 2.0, may be greater than or equal to 1.3 and less than or equal to 1.5, may be greater than or equal to 1.5 and less than or equal to 4.0, may be greater than or equal to 1.5 and less than or equal to 3.0, may be greater than or equal to 1.5 and less than or equal to 2.0, may be greater than or equal to 2.0 and less than or equal to 4.0, may be greater than or equal to 2.0 and less than or equal to 3.0, or may be greater than or equal to 3.0 and less than or equal to 4.0. When the ratio of the twenty-second pitch P22 to the twenty-first pitch P21 is small, the difference of the pixel density of the second display area 102 from the pixel density of the first display area 101 reduces. Thus, it is possible to reduce the visual difference between the first display area 101 and the second display area 102.

Each of the electrode lines 140L may overlap two or more organic layers 130 arranged in the second element direction G2 in plan view.

The reference sign G11 indicates the gap between any adjacent two of the electrode lines 140L in the first element direction G1. The gap G11 is determined in accordance with the second transmittance TR2 of the transmission areas 104. The gap G11 may be determined with reference to the eleventh pitch P11 of the organic layers 130.

The ratio of the gap G11 to the eleventh pitch P11, for example, may be greater than or equal to 0.3, may be greater than or equal to 0.5, or may be greater than or equal to 1.0. The ratio of the gap G11 to the eleventh pitch P11, for example, may be less than or equal to 1.5, may be less than or equal to 2.0, or may be less than or equal to 3.0. The range of the ratio of the gap G11 to the eleventh pitch P11 may be determined by a first group consisting of 0.3, 0.5, and 1.0 and/or a second group consisting of 1.5, 2.0, and 3.0. The range of the ratio of the gap G11 to the eleventh pitch P11 may be determined by a combination of any one of the values in the first group and any one of the values in the second group. The range of the ratio of the gap G11 to the eleventh pitch P11 may be determined by a combination of any two of the values in the first group. The range of the ratio of the gap G11 to the eleventh pitch P11 may be determined by a combination of any two of the values in the second group. For example, the ratio of the gap G11 to the eleventh pitch P11 may be greater than or equal to 0.3 and less than or equal to 3.0, may be greater than or equal to 0.3 and less than or equal to 2.0, may be greater than or equal to 0.3 and less than or equal to 1.5, may be greater than or equal to 0.3 and less than or equal to 1.0, may be greater than or equal to 0.3 and less than or equal to 0.5, may be greater than or equal to 0.5 and less than or equal to 3.0, may be greater than or equal to 0.5 and less than or equal to 2.0, may be greater than or equal to 0.5 and less than or equal to 1.5, may be greater than or equal to 0.5 and less than or equal to 1.0, may be greater than or equal to 1.0 and less than or equal to 3.0, may be greater than or equal to 1.0 and less than or equal to 2.0, may be greater than or equal to 1.0 and less than or equal to 1.5, may be greater than or equal to 1.5 and less than or equal to 3.0, may be greater than or equal to 1.5 and less than or equal to 2.0, or may be greater than or equal to 2.0 and less than or equal to 3.0.

The gap G11, for example, may be greater than or equal to 10 μm, may be greater than or equal to 50 μm, may be greater than or equal to 100 μm, or may be greater than or equal to 150 μm. The gap G11, for example, may be less than or equal to 200 μm, may be less than or equal to 250 μm, or may be less than or equal to 300 μm. The range of the gap G11 may be determined by a first group consisting of 10 μm, 50 μm, 100 μm, and 150 μm and/or a second group consisting of 200 μm, 250 μm, and 300 μm. The range of the gap G11 may be determined by a combination of any one of the values in the first group and any one of the values in the second group. The range of the gap G11 may be determined by a combination of any two of the values in the first group. The range of the gap G11 may be determined by a combination of any two of the values in the second group. For example, the gap G11 may be greater than or equal to 10 μm and less than or equal to 300 μm, may be greater than or equal to 10 μm and less than or equal to 250 μm, may be greater than or equal to 10 μm and less than or equal to 200 μm, may be greater than or equal to 10 μm and less than or equal to 150 μm, may be greater than or equal to 10 μm and less than or equal to 100 μm, may be greater than or equal to 10 μm and less than or equal to 50 μm, may be greater than or equal to 50 μm and less than or equal to 300 μm, may be greater than or equal to 50 μm and less than or equal to 250 μm, may be greater than or equal to 50 μm and less than or equal to 200 μm, may be greater than or equal to 50 μm and less than or equal to 150 μm, may be greater than or equal to 50 μm and less than or equal to 100 μm, may be greater than or equal to 100 μm and less than or equal to 300 μm, may be greater than or equal to 100 μm and less than or equal to 250 μm, may be greater than or equal to 100 μm and less than or equal to 200 may be greater than or equal to 100 μm and less than or equal to 150 μm, may be greater than or equal to 150 μm and less than or equal to 300 μm, may be greater than or equal to 150 μm and less than or equal to 250 μm, may be greater than or equal to 150 μm and less than or equal to 200 μm, may be greater than or equal to 200 μm and less than or equal to 300 μm, may be greater than or equal to 200 μm and less than or equal to 250 μm, or may be greater than or equal to 250 μm and less than or equal to 300 μm.

Preferably, the gap G11 is not constant. For example, the gap G11 may vary according to a location in the first element direction G1 or the second element direction G2. Thus, it is possible to reduce constructive interference between light waves diffracted at the time of passing through the transmission areas 104. Therefore, it is possible to reduce entry of high-intensity diffracted light into the sensor. Thus, for example, it is possible to reduce blurring of an image generated by the sensor.

An example of a specific configuration for varying the gap G11 will be described. As shown in FIG. 3, each of the electrode lines 140L may include two or more electrode sections 141 arranged in the second element direction G2. Each of the electrode sections 141 may overlap the organic layer 130 in plan view. For example, one electrode section 141 may overlap one organic layer 130. In other words, the electrode sections 141 may be arranged at the twenty-second pitch P22 in the second element direction G2. Any adjacent two of the electrode sections 141 in the second element direction G2 may be connected to each other.

The electrode sections 141 may include a first electrode section 141A and a second electrode section 141B. For example, each of the electrode sections 141 may be any one of the first electrode section 141A and the second electrode section 141B. The first electrode section 141A may have a first shape. The second electrode section 141B may have a second shape different from the first shape. In other words, the shape of the second electrode section 141B may be different from the shape of the first electrode section 141A. Since the electrode sections 141 include the first electrode section 141A and the second electrode section 141B having mutually different shapes, it is possible to avoid a configuration in which a gap G11 is constant regardless of a location.

The electrode sections 141 may include first electrode connections 144A and second electrode connections 144B. The first electrode connection 144A means a combination of the first electrode section 141A and the second electrode section 141B that are connected in the second element direction G2. The second electrode connection 144B means a combination of the two first electrode sections 141A that are connected in the second element direction G2.

The electrode sections 141 may include first electrode arrays 145A and second electrode arrays 145B. The first electrode array 145A means a combination of the first electrode section 141A and the second electrode section 141B that are arranged in the first element direction G1. The second electrode array 145B means a combination of the two first electrode sections 141A that are arranged in the first element direction G1.

The electrode sections 141 may include the first electrode arrays 145A, the second electrode arrays 145B, and third electrode arrays 145C. The third electrode array 145C means a combination of the two second electrode sections 141B that are arranged in the first element direction G1.

The first electrode sections 141A and the second electrode sections 141B may be disposed such that the gap G11 varies irregularly. For example, the first electrode sections 141A and the second electrode sections 141B may be disposed in accordance with a Fibonacci word.

A Fibonacci word includes $S_0 S_1 S_2 S_3 S_4 S_5 S_6 S_7 S_8 S_9 \ldots S_n$ is obtained by concatenating the previous character string with the character string before the previous one. In other words, $S_n = S_{n-1} S_{n-2}$. n is an integer greater than or equal to two. Where $S_0 = L$ and $S_1 = LS$, a Fibonacci word includes the following sequence. LLSLLSLLSLLSLLSLLSLLSLLSLL SLSLL SLLSLSLLSLS . . . .

For example, the first electrode section 141A is assigned to L, and the second electrode section 141B is assigned to S. Thus, the electrode sections 141 can include the first electrode sections 141A and the second electrode sections 141B that are arranged irregularly in the second element direction G2.

A specific difference between the first shape and the second shape is selected. For example, the area of the second shape may be different from the area of the first shape. For example, the size of the second shape in the first element direction G1 or the second element direction G2 may be different from the size of the first shape in the first element direction G1 or the second element direction G2. For example, the location of an end of the second shape in the first element direction G1 or the second element direction G2 may be different from the location of an end of the first shape in the first element direction G1 or the second element direction G2.

Figure 4:
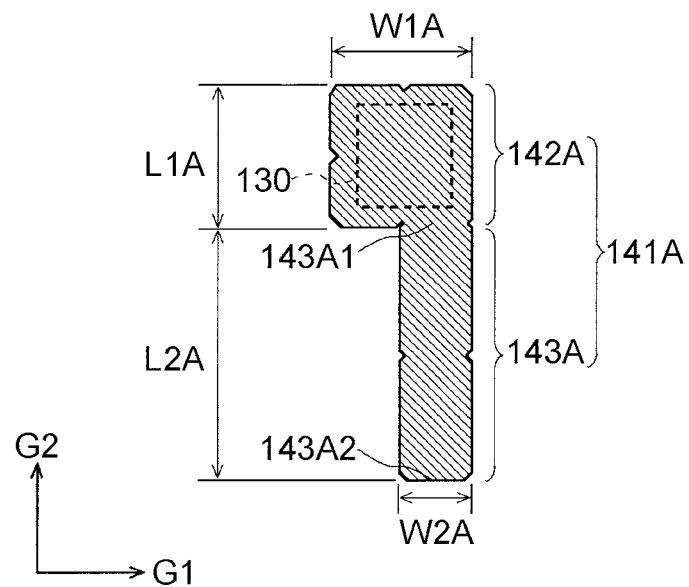
FIG. 4 is a plan view of an example of a first electrode section of the second electrode.
Figure 5:
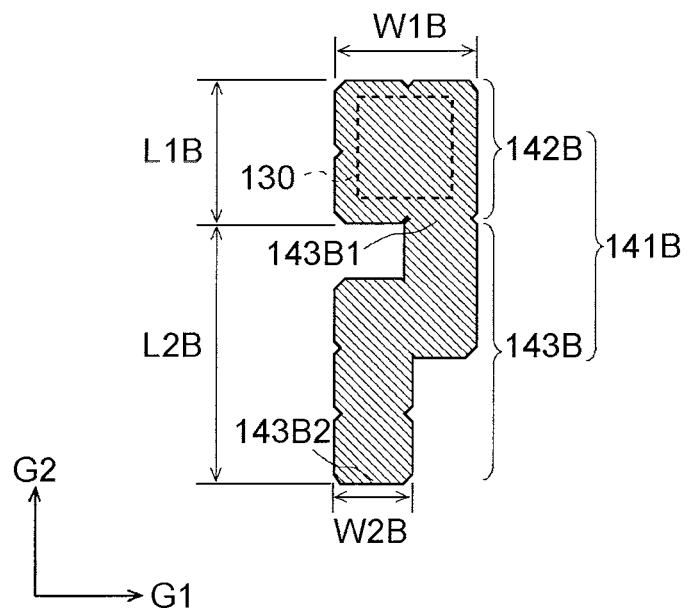
FIG. 5 is a plan view of an example of a second electrode section of the second electrode.

A specific example of the shape of the first electrode section 141A and the shape of the second electrode section 141B will be described with reference to FIGS. 4 and 5. FIG. 4 is a plan view of an example of the first electrode section 141A. FIG. 5 is a plan view of an example of the second electrode section 141B.

As shown in FIG. 4, the first electrode section 141A may have a first pixel section 142A and a first connection section 143A. The first pixel section 142A may overlap the organic layer 130 in plan view. The first connection section 143A may be connected to the first pixel section 142A. The first connection section 143A may have a first connection end 143A1 and a second connection end 143A2. The first connection end 143A1 is connected to the first pixel section 142A. The second connection end 143A2 is located on the side opposite to the first connection end 143A1 in the second element direction G2.

As shown in FIG. 5, the second electrode section 141B may have a second pixel section 142B and a second connection section 143B. The second pixel section 142B may overlap the organic layer 130 in plan view. The second connection section 143B may be connected to the second pixel section 142B. The second connection section 143B may have a third connection end 143B1 and a fourth connection end 143B2. The third connection end 143B1 is connected to the second pixel section 142B. The fourth connection end 143B2 is located on the side opposite to the third connection end 143B1 in the second element direction G2.

The shape of the first connection section 143A may be different from the shape of the second connection section 143B. For example, the area of the first connection section 143A may be different from the area of the second connection section 143B. In the examples shown in FIGS. 4 and 5, the area of the first connection section 143A is less than the area of the second connection section 143B. For example, the average of the size W2A of the first connection section 143A in the first element direction G1 may be different from the average of the size W2B of the second connection section 143B in the first element direction G1. In the examples shown in FIGS. 4 and 5, the average of the size W2A is less than the average of the size W2B. For example, the location of the second connection end 143A2 in the first element direction G1 may be different from the location of the fourth connection end 143B2 in the first element direction G1. The "location" may mean a relative location with respect to the organic layer 130 that overlaps the electrode section 141 in plan view. In the example shown in FIG. 4, the location of the first connection end 143A1 in the first element direction G1 is the same as the location of the second connection end 143A2 in the first element direction G1. In the example shown in FIG. 5, the location of the third connection end 143B1 in the first element direction G1 is different from the location of the fourth connection end 143B2 in the first element direction G1. As shown in FIGS. 4 and 5, the location of the first connection end 143A1 in the first element direction G1 is the same as the location of the third connection end 143B1 in the first element direction G1. On the other hand, the location of the second connection end 143A2 in the first element direction G1 is different from the location of the fourth connection end 143B2 in the first element direction G1. The phrase "the location is the same" means that the difference in location between the midpoints of two connection ends in the first element direction G1 is less than or equal to (Eleventh pitch P11)/4. The phrase "the location is different" means that the difference in location between the midpoints of two connection ends in the first element direction G1 is greater than (Eleventh pitch P11)/4.

The average of the size W2A of the first connection section 143A in the first element direction G1 may be less than the average of the size W1A of the first pixel section 142A in the first element direction G1. The ratio of the average of the size W2A to the average of the size W1A, for example, may be greater than or equal to 0.1, may be greater than or equal to 0.2, or may be greater than or equal to 0.3. The ratio of the average of the size W2A to the average of the size W1A, for example, may be less than or equal to 0.7, may be less than or equal to 0.8, or may be less than or equal to 0.9. The range of the ratio of the average of the size W2A to the average of the size W1A may be determined by a first group consisting of 0.1, 0.2, and 0.3 and/or a second group consisting of 0.7, 0.8, and 0.9. The range of the ratio of the average of the size W2A to the average of the size W1A may be determined by a combination of any one of the values in the first group and any one of the values in the second group. The range of the ratio of the average of the size W2A to the average of the size W1A may be determined by a combination of any two of the values in the first group. The range of the ratio of the average of the size W2A to the average of the size W1A may be determined by a combination of any two of the values in the second group. For example, the ratio of the average of the size W2A to the average of the size W1A may be greater than or equal to 0.1 and less than or equal to 0.9, may be greater than or equal to 0.1 and less than or equal to 0.8, may be greater than or equal to 0.1 and less than or equal to 0.7, may be greater than or equal to 0.1 and less than or equal to 0.3, may be greater than or equal to 0.1 and less than or equal to 0.2, may be greater than or equal to 0.2 and less than or equal to 0.9, may be greater than or equal to 0.2 and less than or equal to 0.8, may be greater than or equal to 0.2 and less than or equal to 0.7, may be greater than or equal to 0.2 and less than or equal to 0.3, may be greater than or equal to 0.3 and less than or equal to 0.9, may be greater than or equal to 0.3 and less than or equal to 0.8, may be greater than or equal to 0.3 and less than or equal to 0.7, may be greater than or equal to 0.7 and less than or equal to 0.9, may be greater than or equal to 0.7 and less than or equal to 0.8, or may be greater than or equal to 0.8 and less than or equal to 0.9.

The size L2A of the first connection section 143A in the second element direction G2 may be determined according to the size IAA of the first pixel section 142A in the second element direction G2. The ratio of the size L2A to the size L1A, for example, may be greater than or equal to 0.2, may be greater than or equal to 0.6, or may be greater than or equal to 0.9. The ratio of the size L2A to the size L1A, for example, may be less than or equal to 2.0, may be less than or equal to 2.5, or may be less than or equal to 3.0. The range of the ratio of the size L2A to the size L1A may be determined by a first group consisting of 0.2, 0.6, and 0.9 and/or a second group consisting of 2.0, 2.5, and 3.0. The range of the ratio of the size L2A to the size L1A may be determined by a combination of any one of the values in the first group and any one of the values in the second group. The range of the ratio of the size L2A to the size L1A may be determined by a combination of any two of the values in the first group. The range of the ratio of the size L2A to the size L1A may be determined by a combination of any two of the values in the second group. For example, the ratio of the size L2A to the size L1A may be greater than or equal to 0.2 and less than or equal to 3.0, may be greater than or equal to 0.2 and less than or equal to 2.5, may be greater than or equal to 0.2 and less than or equal to 2.0, may be greater than or equal to 0.2 and less than or equal to 0.9, may be greater than or equal to 0.2 and less than or equal to 0.6, may be greater than or equal to 0.6 and less than or equal to 3.0, may be greater than or equal to 0.6 and less than or equal to 2.5, may be greater than or equal to 0.6 and less than or equal to 2.0, may be greater than or equal to 0.6 and less than or equal to 0.9, may be greater than or equal to 0.9 and less than or equal to 3.0, may be greater than or equal to 0.9 and less than or equal to 2.5, may be greater than or equal to 0.9 and less than or equal to 2.0, may be greater than or equal to 2.0 and less than or equal to 3.0, may be greater than or equal to 2.0 and less than or equal to 2.5, or may be greater than or equal to 2.5 and less than or equal to 3.0. The ratio is, for example, the ratio of the maximum of the size L2A to the maximum of the size L1A.

The average of the size W2B of the second connection section 143B in the first element direction G1 may be less than the average of the size W1B of the second pixel section 142B in the first element direction G1. The above-described range of the ratio of the average of the size W2A to the average of the size W1A may be adopted as the range of the ratio of the average of the size W2B to the average of the size W1B.

The size L2B of the second connection section 143B in the second element direction G2 may be determined according to the size L1B of the second pixel section 142B in the second element direction G2. The above-described range of the ratio of the size L2A to the size L1A may be adopted as the range of the ratio of the size L2B to the size L1B.

Figure 6:
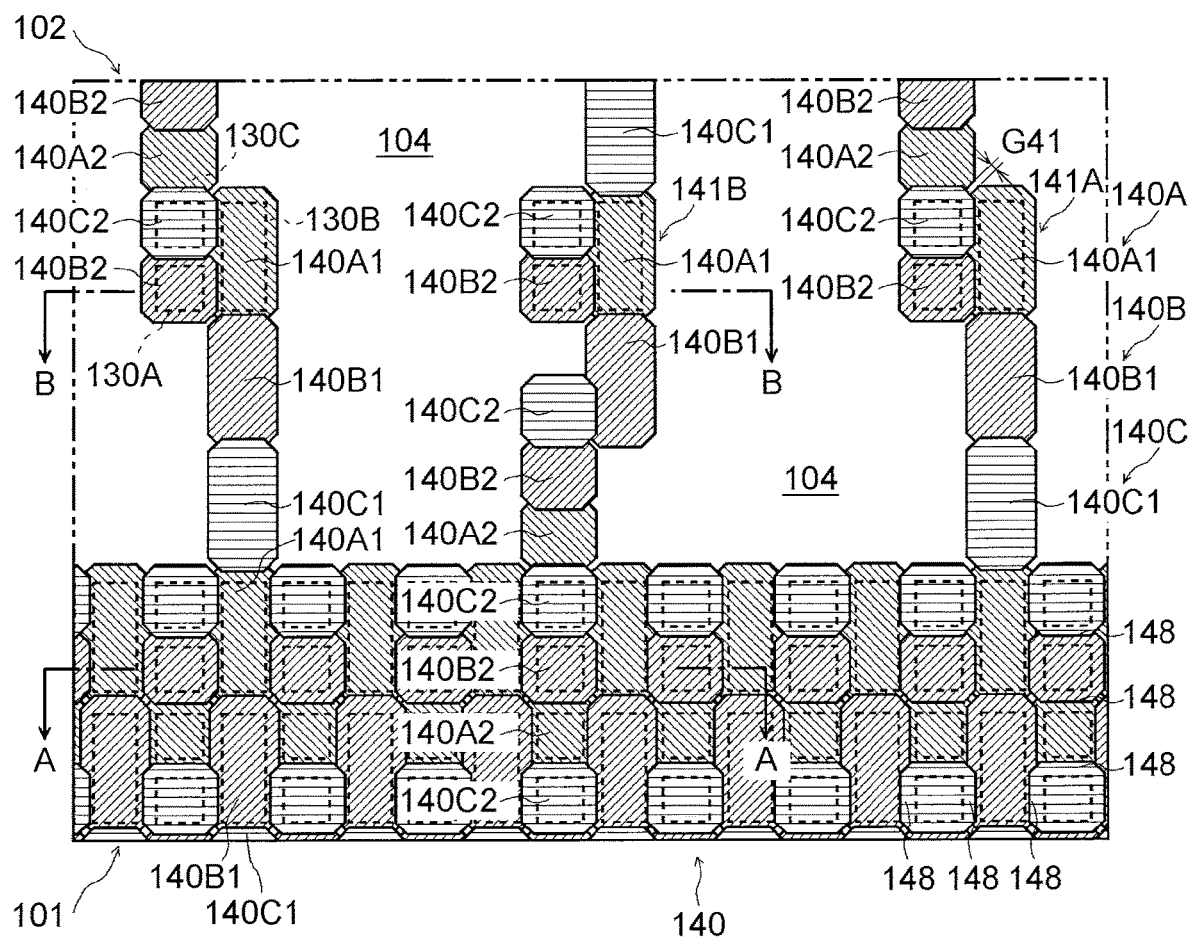
FIG. 6 is a plan view of an area surrounded by the alternate long and two-short dashed line and indicated by the reference sign VI in the organic device shown in FIG. 3.
Figure 6:
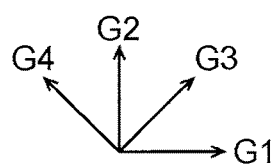

The layer structure of the second electrode 140 will be described. FIG. 6 is an enlarged plan view of the area surrounded by the alternate long and two-short dashed line and indicated by the reference sign VI in the organic device 100 shown in FIG. 3.

The second electrode 140 may include a plurality of layers. For example, the second electrode 140 may include first layers 140A, second layers 140B, and third layers 140C. The first layers 140A are layers formed by vapor deposition using a first mask 50A (described later). The second layers 140B are layers formed by vapor deposition using a second mask 50B (described later). The third layers 140C are layers formed by vapor deposition using a third mask 50C (described later).

The first layers 140A may include first main electrodes 140A1 and first sub-electrodes 140A2. The area of each first main electrode 140A1 may be greater than the area of each first sub-electrode 140A2. The second layers 140B may include second main electrodes 140B1 and second sub-electrodes 140B2. The area of each second main electrode 140B1 may be greater than the area of each second sub-electrode 140B2. The third layers 140C may include third main electrodes 140C1 and third sub-electrodes 140C2. The area of each third main electrode 140C1 may be greater than the area of each third sub-electrode 140C2.

The first main electrode 140A1 may be connected to the second main electrode 140B1 and the third main electrode 140C1 in the second element direction G2. The first main electrode 140A1 may overlap the organic layer 130 in plan view. For example, the first main electrode 140A1 may overlap a second organic layer 130B (described later). The first sub-electrode 140A2 may be connected to the second main electrode 140B1 or the third main electrode 140C1 in the first element direction G1. The first sub-electrode 140A2 may be connected to the second sub-electrode 140B2 and the third sub-electrode 140C2 in the second element direction G2. The first sub-electrode 140A2 does not need to overlap the organic layer 130 in plan view. The first sub-electrode 140A2 may be arranged side by side with the first main electrode 140A1 in a third element direction G3 or a fourth element direction G4.

The third element direction G3 is a direction that intersects with both the first element direction G1 and the second element direction G2. The angle formed by the third element direction G3 with each of the first element direction G1 and the second element direction G2 is, for example, greater than or equal to 30° and less than or equal to 60°. The fourth element direction G4 is a direction that intersects with both the first element direction G1 and the second element direction G2. The angle formed by the fourth element direction G4 with each of the first element direction G1 and the second element direction G2 is, for example, greater than or equal to 30° and less than or equal to 60°. The third element direction G3 intersects with the fourth element direction G4. For example, the third element direction G3 may be orthogonal to the fourth element direction G4.

The reference sign G41 indicates the gap between the first main electrode 140A1 and the first sub-electrode 140A2 in the third element direction G3 or the fourth element direction G4. The gap G41, for example, may be greater than or equal to 5 µm, may be greater than or equal to 10 µm, or may be greater than or equal to 15 µm. The gap G41, for example, may be less than or equal to 30 µm, may be less than or equal to 35 µm, or may be less than or equal to 40 µm. The range of the gap G41 may be determined by a first group consisting of 5 µm, 10 µm, and 15 µm and/or a second group consisting of 30 µm, 35 µm, and 40 µm. The range of the gap G41 may be determined by a combination of any one of the values in the first group and any one of the values in the second group. The range of the gap G41 may be determined by a combination of any two of the values in the first group. The range of the gap G41 may be determined by a combination of any two of the values in the second group. For example, the gap G41 may be greater than or equal to 5 µm and less than or equal to 40 µm, may be greater than or equal to 5 µm and less than or equal to 35 µm, may be greater than or equal to 5 µm and less than or equal to 30 µm, may be greater than or equal to 5 µm and less than or equal to 15 µm, may be greater than or equal to 5 µm and less than or equal to 10 µm, may be greater than or equal to 10 µm and less than or equal to 40 µm, may be greater than or equal to 10 µm and less than or equal to 35 µm, may be greater than or equal to 10 µm and less than or equal to 30 µm, may be greater than or equal to 10 µm and less than or equal to 15 µm, may be greater than or equal to 15 µm and less than or equal to 40 µm, may be greater than or equal to 15 µm and less than or equal to 35 µm, may be greater than or equal to 15 µm and less than or equal to 30 µm, may be greater than or equal to 30 µm and less than or equal to 40 µm, may be greater than or equal to 30 μm and less than or equal to 35 μm, or may be greater than or equal to 35 μm and less than or equal to 40 μm.

The second main electrode 140B1 may be connected to the first main electrode 140A1 and the third main electrode 140C1 in the second element direction G2. The second main electrode 140B1 does not need to overlap the organic layer 130 in plan view. The second sub-electrode 140B2 may be connected to the first main electrode 140A1 or the third main electrode 140C1 in the first element direction G1. The second sub-electrode 140B2 may be connected to the first sub-electrode 140A2 and the third sub-electrode 140C2 in the second element direction G2. The second sub-electrode 140B2 may overlap the organic layer 130 in plan view. For example, the second sub-electrode 140B2 may overlap a first organic layer 130A (described later). The second sub-electrode 140B2 may be arranged side by side with the second main electrode 140B1 in the third element direction G3 or the fourth element direction G4. The above-described range of the gap G41 may be adopted as the range of the gap between the second main electrode 140B1 and the second sub-electrode 140B2.

The third main electrode 140C1 may be connected to the first main electrode 140A1 and the second main electrode 140B1 in the second element direction G2. The third main electrode 140C1 does not need to overlap the organic layer 130 in plan view. The third sub-electrode 140C2 may be connected to the first main electrode 140A1 or the second main electrode 140B1 in the first element direction G1. The third sub-electrode 140C2 may be connected to the first sub-electrode 140A2 and the second sub-electrode 140B2 in the second element direction G2. The third sub-electrode 140C2 may overlap the organic layer 130 in plan view. For example, the third sub-electrode 140C2 may overlap a third organic layer 130C (described later). The third sub-electrode 140C2 may be arranged side by side with the third main electrode 140C1 in the third element direction G3 or the fourth element direction G4. The above-described range of the gap G41 may be adopted as the range of the gap between the third main electrode 140C1 and the third sub-electrode 140C2.

The first electrode section 141A may include the first main electrode 140A1, the second main electrode 140B1, the third main electrode 140C1, the second sub-electrode 140B2, and the third sub-electrode 140C2. The second main electrode 140B1 may be located between the first main electrode 140A1 and the third main electrode 140C1 in the second element direction G2. The second main electrode 140B1 may be connected to the first main electrode 140A1 and the third main electrode 140C1 in the second element direction G2. The second sub-electrode 140B2 and the third sub-electrode 140C2 may be connected to the first main electrode 140A1 in the first element direction G1. The second sub-electrode 140B2 may be connected to the third sub-electrode 140C2 in the second element direction G2.

The second electrode section 141B may include the first main electrode 140A1, the second main electrode 140B1, the first sub-electrode 140A2, the two second sub-electrodes 140B2, and the two third sub-electrodes 140C2. The second main electrode 140B1 may be connected to the first main electrode 140A1 in the second element direction G2. A first one of the second sub-electrodes 140B2 and a first one of the third sub-electrodes 140C2 may be connected to the first main electrode 140A1 in the first element direction G1. The first one of the second sub-electrodes 140B2 may be connected to the first one of the third sub-electrodes 140C2 in the second element direction G2. A second one of the third sub-electrodes 140C2 may be connected to the second main electrode 140B1 in the second element direction G2. A second one of the second sub-electrodes 140B2 may be connected to the second one of the third sub-electrodes 140C2 in the second element direction G2. The first sub-electrode 140A2 may be connected to the second one of the second sub-electrodes 140B2 in the second element direction G2.

In the first display area 101, the first main electrode 140A1, the second main electrode 140B1, and the third main electrode 140C1 may be repeatedly arranged in the second element direction G2. In the first display area 101, the third sub-electrode 140C2, the second sub-electrode 140B2, and the first sub-electrode 140A2 may be repeatedly arranged in the second element direction G2. An array of the first main electrode 140A1, the second main electrode 140B1, and the third main electrode 140C1 and an array of the third sub-electrode 140C2, the second sub-electrode 140B2, and the first sub-electrode 140A2 may be connected in the first element direction G1.

Two layers of the second electrode 140 may partially overlap each other. An area in which a plurality of layers of the second electrode 140 overlaps in plan view is also referred to as electrode overlap area 148. In the present embodiment, the electrode overlap area 148 is an area in which the first layer 140A and the second layer 140B overlap, an area in which the first layer 140A and the third layer 140C overlap, or an area in which the second layer 140B and the third layer 140C overlap.

The area of the electrode overlap area 148 may be less than the area of the first layer 140A. For example, the area of an electrode overlap area 148 may be less than the area of the first main electrode 140A1. The ratio of the area of the electrode overlap area 148 to the area of the first main electrode 140A1, for example, may be greater than or equal to 0.02, may be greater than or equal to 0.05, or may be greater than or equal to 0.10. The ratio of the area of the electrode overlap area 148 to the area of the first main electrode 140A1, for example, may be less than or equal to 0.20, may be less than or equal to 0.30, or may be less than or equal to 0.40. The range of the ratio of the area of the electrode overlap area 148 to the area of the first main electrode 140A1 may be determined by a first group consisting of 0.02, 0.05, and 0.10 and/or a second group consisting of 0.20, 0.30, and 0.40. The range of the ratio of the electrode overlap area 148 to the area of the first main electrode 140A1 may be determined by a combination of any one of the values in the first group and any one of the values in the second group. The range of the ratio of the electrode overlap area 148 to the area of the first main electrode 140A1 may be determined by a combination of any two of the values in the first group. The range of the ratio of the electrode overlap area 148 to the area of the first main electrode 140A1 may be determined by a combination of any two of the values in the second group. For example, the ratio of the area of the electrode overlap area 148 to the area of the first main electrode 140A1 may be greater than or equal to 0.02 and less than or equal to 0.40, may be greater than or equal to 0.02 and less than or equal to 0.30, may be greater than or equal to 0.02 and less than or equal to 0.20, may be greater than or equal to 0.02 and less than or equal to 0.10, may be greater than or equal to 0.02 and less than or equal to 0.05, may be greater than or equal to 0.05 and less than or equal to 0.40, may be greater than or equal to 0.05 and less than or equal to 0.30, may be greater than or equal to 0.05 and less than or equal to 0.20, may be greater than or equal to 0.05 and less than or equal to 0.10, may be greater than or equal to 0.10 and less than or equal to 0.40, may be greater than or equal to 0.10 and less than or equal to 0.30, may be greater than or equal to 0.10 and less than or equal to 0.20, may be greater than or equal to 0.20 and less than or equal to 0.40, may be greater than or equal to 0.20 and less than or equal to 0.30, or may be greater than or equal to 0.30 and less than or equal to 0.40.

The area of the electrode overlap area 148 may be less than the area of the first sub-electrode 140A2. The above-described range of the ratio of the area of the electrode overlap area 148 to the area of the first main electrode 140A1 may be adopted as the range of the ratio of the area of the electrode overlap area 148 to the area of the first sub-electrode 140A2.

The area of the electrode overlap area 148 may be less than the area of the second main electrode 140B1. The above-described range of the ratio of the area of the electrode overlap area 148 to the area of the first main electrode 140A1 may be adopted as the range of the ratio of the area of the electrode overlap area 148 to the area of the second main electrode 140B1.

The area of the electrode overlap area 148 may be less than the area of the second sub-electrode 140B2. The above-described range of the ratio of the area of the electrode overlap area 148 to the area of the first main electrode 140A1 may be adopted as the range of the ratio of the area of the electrode overlap area 148 to the area of the second sub-electrode 140B2.

the area of the electrode overlap area 148 may be less than the area of the third main electrode 140C1. The above-described range of the ratio of the area of the electrode overlap area 148 to the area of the first main electrode 140A1 may be adopted as the range of the ratio of the area of the electrode overlap area 148 to the area of the third main electrode 140C1.

The area of the electrode overlap area 148 may be less than the area of the third sub-electrode 140C2. The above-described range of the ratio of the area of the electrode overlap area 148 to the area of the first main electrode 140A1 may be adopted as the range of the ratio of the area of the electrode overlap area 148 to the area of the third sub-electrode 140C2.

Figure 7:
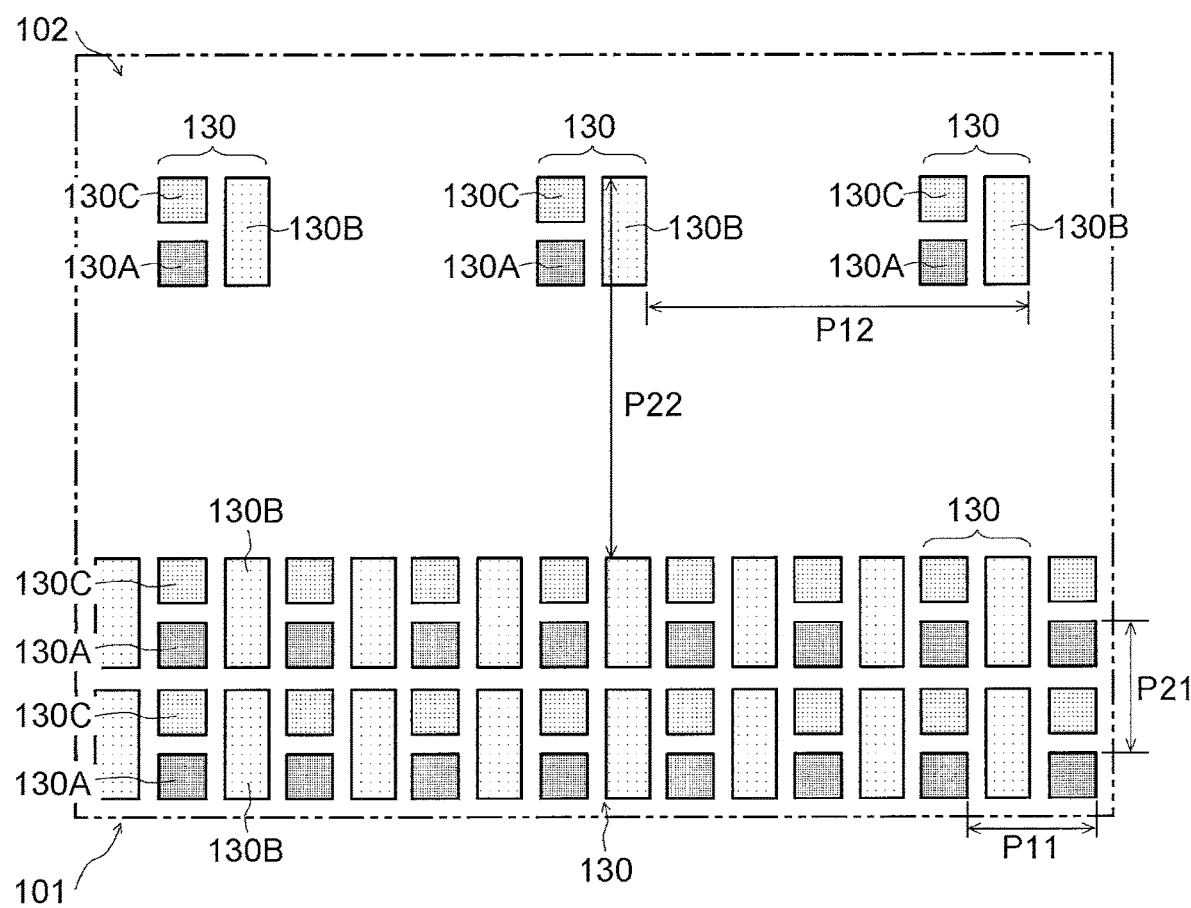
FIG. 7 is a plan view of a state where the second electrode is removed from the organic device shown in FIG. 6.

FIG. 7 is a plan view of a state where the second electrode 140 is removed from the organic device 100 shown in FIG. 6. The organic layers 130 may include the first organic layers 130A, the second organic layers 130B, and the third organic layers 130C. The first organic layer 130A, the second organic layer 130B, and the third organic layer 130C are, for example, a red light emitting layer, a blue light emitting layer, and a green light emitting layer, respectively. In the following description, when the configuration of an organic layer, which is common among the first organic layer 130A, the second organic layer 130B, and the third organic layer 130C, is described, the term and the reference sign "organic layer 130" are used.

The layout of the second electrode 140 and the organic layers 130 in plan view is detected by observing the organic device 100 with a high-powered digital microscope. The above-described occupancies, areas, sizes, gaps, and the like are able to be calculated in accordance with detection results. When the organic device 100 includes a cover, such as a cover glass, the second electrode 140 and the organic layers 130 may be observed after removing the cover by, for example, peeling or breaking the cover. A scanning electron microscope may be used instead of a digital microscope.

Figure 8:
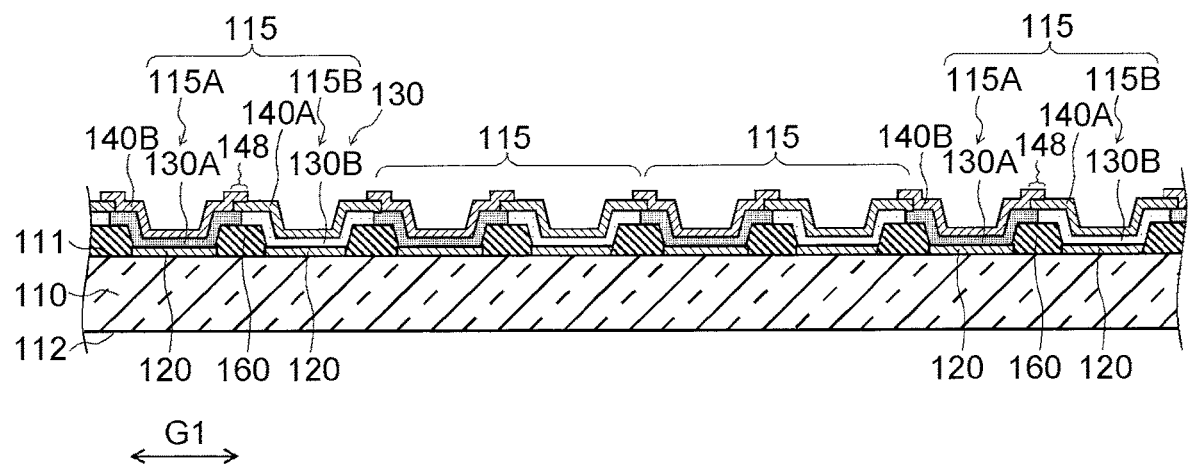
FIG. 8 is a sectional view of the organic device, taken along the line A-A in FIG. 6.
Figure 9:
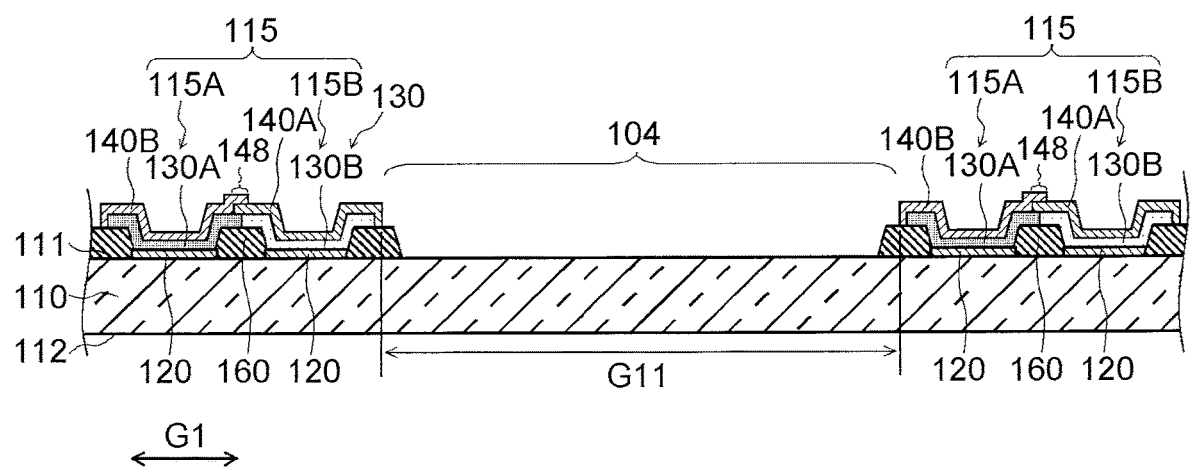
FIG. 9 is a sectional view of the organic device, taken along the line B-B in FIG. 6.

Next, an example of the layer structure of the organic device 100 will be described. FIG. 8 is a sectional view of the organic device, taken along the line A-A in FIG. 6. FIG. 9 is a sectional view of the organic device, taken along the line B-B in FIG. 6.

The organic device 100 includes a substrate 110, and the elements 115 disposed on the substrate 110. Each of the elements 115 may include a first electrode 120, the organic layer 130 disposed on the first electrode 120, and the second electrode 140 disposed on the organic layer 130.

The organic device 100 may include an insulating layer 160 located between any adjacent two of the first electrodes 120 in plan view. The insulating layer 160 includes, for example, polyimide. The insulating layer 160 may overlap the ends of the first electrodes 120. The insulating layer 160 may overlap the electrode overlap areas 148 in plan view. For example, in plan view, the electrode overlap area 148 may be surrounded by the outline of the insulating layer 160. The electrode overlap area 148 includes a plurality of layers of the second electrode 140. Therefore, the electrode overlap area 148 has a lower transmittance than one layer of the second electrode 140. When light passing through the electrode overlap area 148 exits from the organic device 100, the intensity of light can be not uniform. Since the insulating layer 160 overlaps the electrode overlap area 148, it is possible to reduce nonuniformity in the intensity of light.

The organic device 100 may be an active matrix type. For example, although not shown in the drawing, the organic device 100 may include switches. The switches are respectively electrically connected to the elements 115. Each of the switches is, for example, a transistor. Each of the switches is capable of controlling the on/off state of voltage or current to a corresponding one of the elements 115.

The substrate 110 may be a sheet-like member having electrical insulation properties. The substrate 110 preferably has transparency for transmitting light.

When the substrate 110 has a predetermined transparency, the transparency of the substrate 110 is preferably a transparency to such an extent that the substrate 110 is able to transmit light emitted from the organic layers 130 to display. For example, the transmittance of the substrate 110 in a visible light range is preferably higher than or equal to 70% and more preferably higher than or equal to 80%. The transmittance of the substrate 110 is able to be measured by a method of testing a total light transmittance of plastic-transparent material, which is in conformity with JIS K7361-1.

The substrate 110 may have flexibility or does not need to have flexibility. The substrate 110 can be selected as needed according to the uses of the organic device 100.

Examples of the material of the substrate 110 include non-flexible rigid materials, such as quartz glass, Pyrex (registered trademark) glass, synthetic quartz plate, and non-alkali glass, and flexible materials, such as resin film, optical resin sheet, and thin glass. The substrate material may be a multilayer body with a barrier layer on one side or each side of a resin film.

The thickness of the substrate 110 can be selected as needed according to a material used for the substrate 110, the use of the organic device 100, and the like, and, for example, may be greater than or equal to 0.005 mm. The thickness of the substrate 110 may be less than or equal to 5 mm.

Each of the elements 115 is capable of implementing a function when a voltage is applied between the first electrode 120 and the second electrode 140 or when a current flows between the first electrode 120 and the second electrode 140. When, for example, the elements 115 are pixels of an organic EL display device, the elements 115 are capable of emitting light that constitutes a video.

The first electrode 120 includes a material having electrical conductivity. Examples of the first electrode 120 include a metal, a metal oxide having electrical conductivity, and other inorganic materials having electrical conductivity. The first electrode 120 may include a metal oxide having transparency and electrical conductivity, such as indium tin oxide.

A metal, such as Au, Cr, Mo, Ag, and Mg, an inorganic oxide, such as indium tin oxide referred to as ITO, indium zinc oxide referred to as IZO, zinc oxide, and indium oxide, or a conductive polymer, such as metal-doped polythiophene, may be used as the material of the first electrode 120. These conductive materials may be used solely or two or more of these conductive materials may be used in combination. When two or more types are used, layers respectively made of materials may be laminated. Alternatively, an alloy that includes two or more materials may be used. Examples of the alloy include magnesium alloys, such as MgAg.

The organic layer 130 includes an organic material. When the organic layer 130 is energized, the organic layer 130 is capable of exerting a function. Energization means that a voltage is applied to the organic layer 130 or a current flows through the organic layer 130. A light emitting layer that emits light when energized, a layer that varies in transmittance or refractive index of light when energized, or the like may be used as the organic layer 130. The organic layer 130 may include an organic semiconductor material.

A multilayer structure that includes the first electrode 120, the first organic layer 130A, and the second electrode 140 is also referred to as first element 115A. A multilayer structure that includes the first electrode 120, the second organic layer 130B, and the second electrode 140 is also referred to as second element 115B. A multilayer structure that includes the first electrode 120, the third organic layer 130C, and the second electrode 140 is also referred to as third element. When the organic device 100 is an organic EL display device, the first element 115A, the second element 115B, and the third element each are a sub-pixel.

In the following description, when the configuration of an element, which is common among the first element 115A, the second element 115B, and the third element, is described, the term and the reference sign "element 115" are used.

When a voltage is applied between the first electrode 120 and the second electrode 140, the organic layer 130 disposed therebetween is driven. When the organic layer 130 is a light emitting layer, light is emitted from the organic layer 130, and the light is taken out from the second electrode 140 side or the first electrode 120 side.

When the organic layer 130 includes a light emitting layer that emits light when energized, the organic layer 130 may further include a hole injection layer, a hole transport layer, an electron transport layer, an electron injection layer, and the like. When, for example, the first electrode 120 is an anode, the organic layer 130 may include a hole injection and transport layer between the light emitting layer and the first electrode 120. The hole injection and transport layer may be a hole injection layer that has a hole injection function, may be a hole transport layer that has a hole transport function, or may have both the hole injection function and the hole transport function. Alternatively, the hole injection and transport layer may be formed by laminating a hole injection layer and a hole transport layer. When the second electrode 140 is a cathode, the organic layer 130 may have an electron injection and transport layer between the light emitting layer and the second electrode 140. The electron injection and transport layer may be an electron injection layer that has an electron injection function, may be an electron transport layer that has an electron transport function, or may have both the electron injection function and the electron transport function. Alternatively, the electron injection and transport layer may be formed by laminating an electron injection layer and an electron transport layer.

The light emitting layer includes a luminescent material. The light emitting layer may include an additive that improves leveling properties.

Known materials may be used as the luminescent material, and, for example, luminescent materials, such as dye materials, metal complex materials, and polymer materials, may be used. Examples of the dye materials include cyclopentadiene derivatives, tetraphenyl butadiene derivatives, triphenylamine derivatives, oxadiazole derivatives, pyrazolo-quinoline derivatives, distyrylbenzene derivatives, distyrylarylene derivatives, silole derivatives, thiophene ring compounds, pyridine ring compounds, perinone derivatives, perylene derivatives, oligothiophene derivatives, an oxadiazole dimer, and a pyrazoline dimer. Metal complexes that have Al, Zn, Be, or the like, or a rare earth metal, such as Tb, Eu, and Dy, as a central metal and that have oxadiazole, thiadiazole, phenylpyridine, phenylbenzimidazole, a quinoline structure, or the like, as a ligand may be used as the metal complex material. Examples of the metal complex material include aluminum quinolinol complexes, benzoquinolinol beryllium complexes, benzoxazole zinc complexes, benzothiazole zinc complexes, azomethyl zinc complexes, porphyrin zinc complexes, and europium complexes. Examples of the polymer materials include poly(p-phenylene vinylene) derivatives, polythiophene derivatives, poly(p-phenylene) derivatives, polysilane derivatives, polyacetylene derivatives, polyvinylcarbazole derivatives, polyfluorene derivatives, polyquinoxaline derivatives, and copolymers of them.

The light emitting layer may contain a dopant for the purpose of, for example, improving the luminous efficiency and varying the emission wavelength. Examples of the dopant include perylene derivatives, coumarin derivatives, rubrene derivatives, quinacridone derivatives, squarylium derivatives, porphyrin derivatives, styryl dyes, tetracene derivatives, pyrazoline derivatives, decacyclene, phenoxazone, quinoxaline derivatives, carbazole derivatives, and fluorene derivatives. Organic metal complexes that have ions of heavy metals, such as platinum and iridium, as a center and that exhibit phosphorescence may be used as the dopant. One dopant may be used solely or two or more dopants may be used.

For example, the materials described at paragraphs 0094 to 0099 in Japanese Unexamined Patent Application Publication No. 2010-272891 and the materials described at paragraphs 0053 to 0057 in International Publication No. 2012/132126 may also be used as the luminescent material and the dopant.

The thickness of the light emitting layer is not limited as long as the thickness allows to provide a field for recombination between electrons and holes and exert the function of light emission. The thickness, for example, may be greater than or equal to 1 nm and may be less than or equal to 500 nm.

A known material may be used as a hole injection and transport material used for the hole injection and transport layer. Examples of the hole injection and transport material include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxadiazole derivatives, styrylanthracene derivatives, fluorenone derivatives, hydrazone derivatives, stilbene derivatives, silazane derivatives, polythiophene derivatives, polyaniline derivatives, polypyrrole derivatives, phenylamine derivatives, anthracene derivatives, carbazole derivatives, fluorene derivatives, distyrylbenzene derivatives, polyphenylenevinylene derivatives, porphyrin derivatives, and styrylamine derivatives. Examples of the hole injection and transport material also include spiro compounds, phthalocyanine compounds, and metal oxides. For example, the compounds described in Japanese Unexamined Patent Application Publication No. 2011-119681, International Publication No. 2012/018082, Japanese Unexamined Patent Application Publication No. 2012-069963, and at paragraph 0106 in International Publication No. 2012/132126 may also be used as needed.

When the hole injection and transport layer is formed by laminating a hole injection layer and a hole transport layer, the hole injection layer may contain an additive A, the hole transport layer may contain an additive A, or the hole injection layer and the hole transport layer may contain an additive A. The additive A may be a low-molecular compound or may be a polymeric compound. Specifically, fluorine compounds, ester compounds, hydrocarbon compounds, or the like may be used.

A known material may be used as an electron injection and transport material used for the electron injection and transport layer. Examples of the electron injection and transport material include alkali metals, alkali metal alloys, alkali metal halides, alkaline earth metals, alkaline earth metal halides, alkaline earth metal oxides, alkali metal organic complexes, magnesium halides, magnesium oxides, and aluminum oxides. Examples of the electron injection and transport material include bathocuproine, bathophenanthroline, phenanthroline derivatives, triazole derivatives, oxadiazole derivatives, pyridine derivatives, nitro-substituted fluorene derivatives, anthraquinodimethane derivatives, diphenylquinone derivatives, thiopyran dioxide derivatives, aromatic ring tetracarboxylic anhydrides, such as naphthalene and perylene, carbodiimide, fluorenylidenemethane derivatives, anthraquinodimethane derivatives, anthrone derivatives, quinoxaline derivatives, metal complexes, such as quinolinol complexes, phthalocyanine compounds, and distyrylpyrazine derivatives.

An electron transport organic material may be doped with an alkali metal or an alkaline earth metal to form a metal dope layer, and the metal dope layer may be used as the electron injection and transport layer. Examples of the electron transport organic material include bathocuproine, bathophenanthroline, phenanthroline derivatives, triazole derivatives, oxadiazole derivatives, pyridine derivatives, metal complexes, such as tris(8-quinolinolato) aluminum ($Alq_3$), and polymeric derivatives of them. Li, Cs, Ba, Sr, or the like may be used as a dopant metal.

The second electrode 140 includes a material having electrical conductivity, such as a metal. The second electrode 140 is formed on the organic layers 130 by vapor deposition using masks (described later). Examples of the material of the second electrode 140 include platinum, gold, silver, copper, iron, tin, chromium, aluminum, indium, lithium, sodium, potassium, calcium, magnesium, and carbon. These materials may be used solely or two or more types of these materials may be used in combination. When two or more types are used, layers respectively made of materials may be laminated. Alternatively, an alloy that includes two or more materials may be used. Examples of the alloy include magnesium alloys, such as MgAg, aluminum alloys, such as AlLi, AlCa, and AlMg, alkali metal alloys, and alkaline earth metal alloys.

The thickness of the second electrode 140, for example, may be greater than or equal to 5 nm, may be greater than or equal to 10 nm, may be greater than or equal to 50 nm, or may be greater than or equal to 100 nm. The thickness of the second electrode 140, for example, may be less than or equal to 200 nm, may be less than or equal to 500 nm, may be less than or equal to 1 μm, or may be less than or equal to 100 μm. The range of the thickness of the second electrode 140 may be determined by a first group consisting of 5 nm, 10 nm, 50 nm, and 100 nm and/or a second group consisting of 200 nm, 500 nm, 1 μm, and 100 μm. The range of the thickness of the second electrode 140 may be determined by a combination of any one of the values in the first group and any one of the values in the second group. The range of the thickness of the second electrode 140 may be determined by a combination of any two of the values in the first group. The range of the thickness of the second electrode 140 may be determined by a combination of any two of the values in the second group. For example, the thickness of the second electrode 140 may be greater than or equal to 5 nm and less than or equal to 100 μm, may be greater than or equal to 5 nm and less than or equal to 1 μm, may be greater than or equal to 5 nm and less than or equal to 500 nm, may be greater than or equal to 5 nm and less than or equal to 200 nm, may be greater than or equal to 5 nm and less than or equal to 100 nm, may be greater than or equal to 5 nm and less than or equal to 50 nm, may be greater than or equal to 5 nm and less than or equal to 10 nm, may be greater than or equal to 10 nm and less than or equal to 100 μm, may be greater than or equal to 10 nm and less than or equal to 1 μm, may be greater than or equal to 10 nm and less than or equal to 500 nm, may be greater than or equal to 10 nm and less than or equal to 200 nm, may be greater than or equal to 10 nm and less than or equal to 100 nm, may be greater than or equal to 10 nm and less than or equal to 50 nm, may be greater than or equal to 50 nm and less than or equal to 100 μm, may be greater than or equal to 50 nm and less than or equal to 1 μm, may be greater than or equal to 50 nm and less than or equal to 500 nm, may be greater than or equal to 50 nm and less than or equal to 200 nm, may be greater than or equal to 50 nm and less than or equal to 100 nm, may be greater than or equal to 100 nm and less than or equal to 100 μm, may be greater than or equal to 100 nm and less than or equal to 1 μm, may be greater than or equal to 100 nm and less than or equal to 500 nm, may be greater than or equal to 100 nm and less than or equal to 200 nm, may be greater than or equal to 200 nm and less than or equal to 100 μm, may be greater than or equal to 200 nm and less than or equal to 1 μm, may be greater than or equal to 200 nm and less than or equal to 500 nm, may be greater than or equal to 500 nm and less than or equal to 100 μm, may be greater than or equal to 500 nm and less than or equal to 1 μm, or may be greater than or equal to 1 μm and less than or equal to 100 μm. As the thickness of the second electrode 140 reduces, the transmittance of the second electrode 140 increases, and the transmittance of the non-transmission areas 103 also increases. Light entering the non-transmission areas 103 is also able to reach the sensor according to the transmittance of the non-transmission areas 103. When the transmittance of the non-transmission areas 103 is increased, the amount of light received by the sensor is able to be increased.

The thickness of each of the components of the organic device 100, that is, the thickness of the substrate 110, the thickness of the second electrode 140, and the like, can be measured by observing the image of the cross section of the organic device 100 with a scanning electron microscope.

Figure 10:
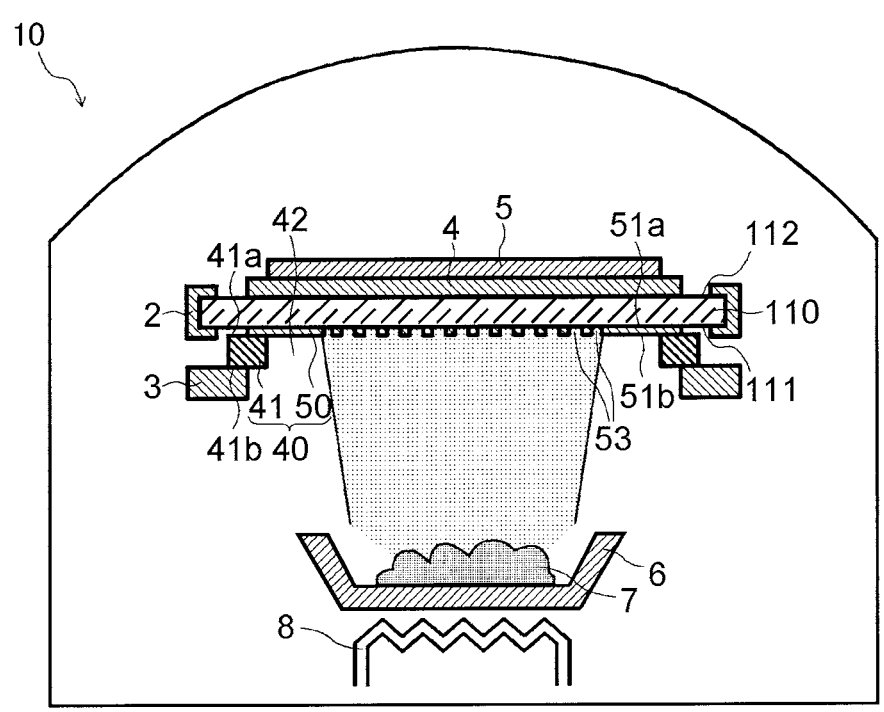
FIG. 10 is a diagram of an example of a vapor deposition system that includes a mask assembly.

Next, a method of forming the second electrode 140 of the organic device 100 by vapor deposition will be described. FIG. 10 is a diagram of a vapor deposition system 10. The vapor deposition system 10 performs a vapor deposition process for depositing a vapor deposition material on an object.

The vapor deposition system 10 may include a vapor deposition source 6, a heater 8, and a mask assembly 40 inside. The vapor deposition system 10 may include an evacuating means for evacuating the inside of the vapor deposition system 10 into a vacuum atmosphere. The vapor deposition source 6 is, for example, a crucible. The vapor deposition source 6 contains a vapor deposition material 7, such as a conductive material. The heater 8 vaporizes the vapor deposition material 7 in a vacuum atmosphere by heating the vapor deposition source 6. The mask assembly 40 is disposed so as to face the crucible 6.

As shown in FIG. 10, the mask assembly 40 may include at least one mask 50 and a frame 41 supporting the mask 50. The frame 41 may have a first frame face 41a and a second frame face 41b. The mask 50 may be fixed to the first frame face 41a. The second frame face 41b is located on the side opposite to the first frame face 41a. The frame 41 may have an opening 42. The opening 42 extends through from the first frame face 41a to the second frame face 41b. The mask 50 may be fixed to the frame 41 so as to cross the opening 42 in plan view. The frame 41 may support the mask 50 in a state where the mask 50 is pulled in a direction along the plane of the mask 50. Thus, it is possible to suppress a deflection of the mask 50.

A first mask 50A, a second mask 50B, or a third mask 50C (described later) may be used as the mask 50. In the following description, when the configuration of the mask, which is common among the first mask 50A, the second mask 50B, and the third mask 50C, is described, the term and the reference sign "mask 50" are used. For the components of the mask, that is, through-holes, a blocking area, and the like (described later), similarly, a configuration common among the first mask 50A, the second mask 50B, and the third mask 50C is described, a reference sign not suffixed with an alphabet and represented by only a numeral, that is, "53", "54", or the like, is used as a reference sign. On the other hand, when a configuration unique to each of the first mask 50A, the second mask 50B, and the third mask 50C is described, a reference sign with a corresponding alphabet, that is, "A", "B", "C", or the like, suffixed to a numeral can be used.

The mask 50 of the mask assembly 40 faces the substrate 110. The substrate 110 is an object on which the vapor deposition material 7 is deposited. The substrate 110 has a first face 111 and a second face 112. The first face 111 faces the mask 50. The mask 50 has a plurality of through-holes 53. The through-holes 53 pass the vapor deposition material 7 flying from the vapor deposition source 6. The vapor deposition material 7 having passed through the through-holes 53 is deposited on the first face 111 of the substrate 110. The mask 50 has a first face 51a and a second face 51b. The first face 51a faces the first face 111. The second face 51b is located on the side opposite to the first face 51a. The through-holes 53 extend through from the first face 51a to the second face 51b.

The vapor deposition system 10 may include a substrate holder 2 that holds the substrate 110. The substrate holder 2 may be movable in the direction along the thickness of the substrate 110. The substrate holder 2 may be movable in the direction along the plane of the substrate 110. The substrate holder 2 may control the inclination of the substrate 110. For example, the substrate holder 2 may include a plurality of chucks attached to the outer edge of the substrate 110. Each of the chucks may be independently movable in the direction along the thickness and the plane of the substrate 110.

The vapor deposition system 10 may include a mask holder 3 that holds the mask assembly 40. The mask holder 3 may be movable in the direction along the thickness of the mask 50. The mask holder 3 may be movable in the direction along the plane of the mask 50. For example, the mask holder 3 may include a plurality of chucks attached to the outer edge of the frame 41. Each of the chucks may be independently movable in the direction along the thickness and the plane of the mask 50.

The position of the mask 50 of the mask assembly 40 with respect to the substrate 110 is able to be adjusted by moving at least any one of the substrate holder 2 and the mask holder 3.

The vapor deposition system 10 may include a cooling plate 4. The cooling plate 4 may be disposed on the second face 112 side of the substrate 110. The cooling plate 4 may have a flow channel for circulating refrigerant inside the cooling plate 4. The cooling plate 4 suppresses an increase in the temperature of the substrate 110 in a vapor deposition process.

The vapor deposition system 10 may include a magnet 5 disposed on the second face 112 side. The magnet 5 may be stacked on the cooling plate 4. The magnet 5 attracts the mask 50 toward the substrate 110 by magnetic force. Thus, it is possible to reduce the gap between the mask 50 and the substrate 110 or eliminate the gap. As a result, it is possible to reduce occurrence of a shadow in the vapor deposition process. Therefore, it is possible to increase the dimensional accuracy and positional accuracy of the second electrode 140. In this specification, a shadow means a phenomenon that a vapor deposition material 7 is included in the gap between the mask 50 and the substrate 110 and then the thickness of the second electrode 140 becomes uneven. Alternatively, the mask 50 may be attracted toward the substrate 110 with an electrostatic chuck by using an electrostatic force.

Figure 11:
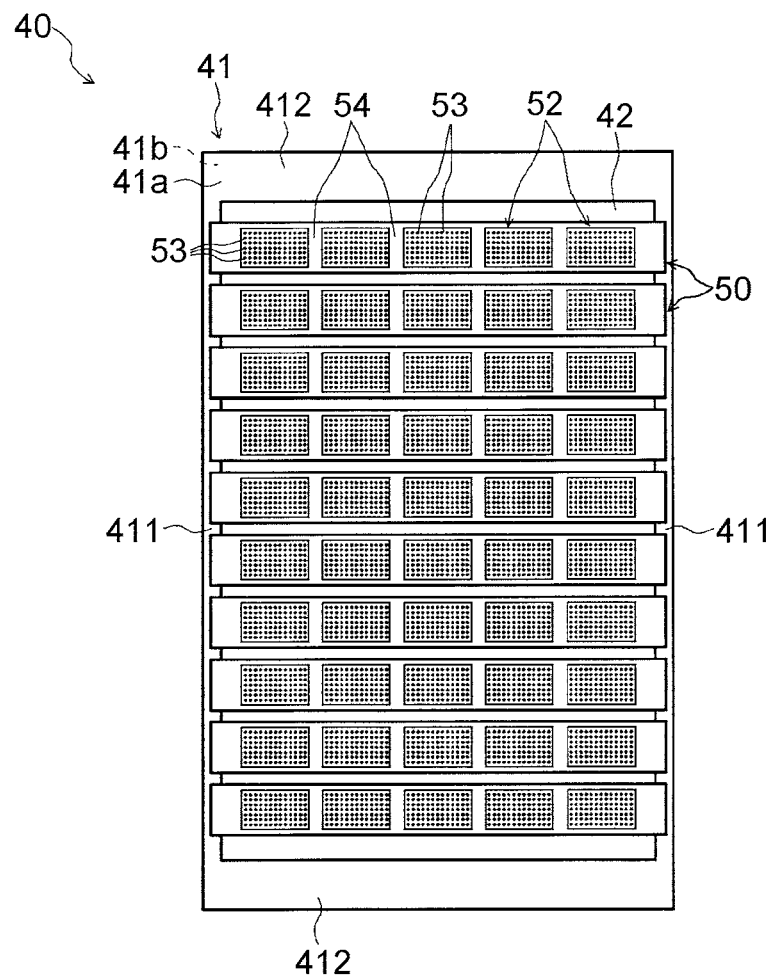
FIG. 11 is a plan view of an example of the mask assembly.

Next, the mask assembly 40 will be described. FIG. 11 is a plan view of the mask assembly 40. The mask assembly 40 may include two or more masks 50. The mask 50 may be fixed to the frame 41 by, for example, welding.

The frame 41 has a pair of first sides 411 and a pair of second sides 412. The frame 41 may have a rectangular outline. The mask 50 to which a tension is applied may be fixed to the first sides 411. The first side 411 may be longer than the second side 412. The frame 41 may have the opening 42 surrounded by the pair of first sides 411 and the pair of second sides 412.

The mask 50 includes at least one cell 52. The cell 52 has through-holes 53 and a blocking area 54. The mask 50 may include two or more cells 52. When a display device, such as an organic EL display device, is manufactured by using the mask 50, one cell 52 may correspond to the display area of one organic EL display device, that is, one screen. One cell 52 may correspond to a plurality of display areas. The mask 50 may have the blocking area 54 located between the cells 52. Although not shown in the drawing, the mask 50 may have the through-hole 53 located between the cells 52.

The cell 52, for example, may have a substantially quadrangular outline in plan view, more accurately, a substantially rectangular outline in plan view. Each cell 52 may have an outline of various shapes according to the shape of the display area of an organic EL display device. For example, each cell 52 may have a circular outline.

Figure 12:
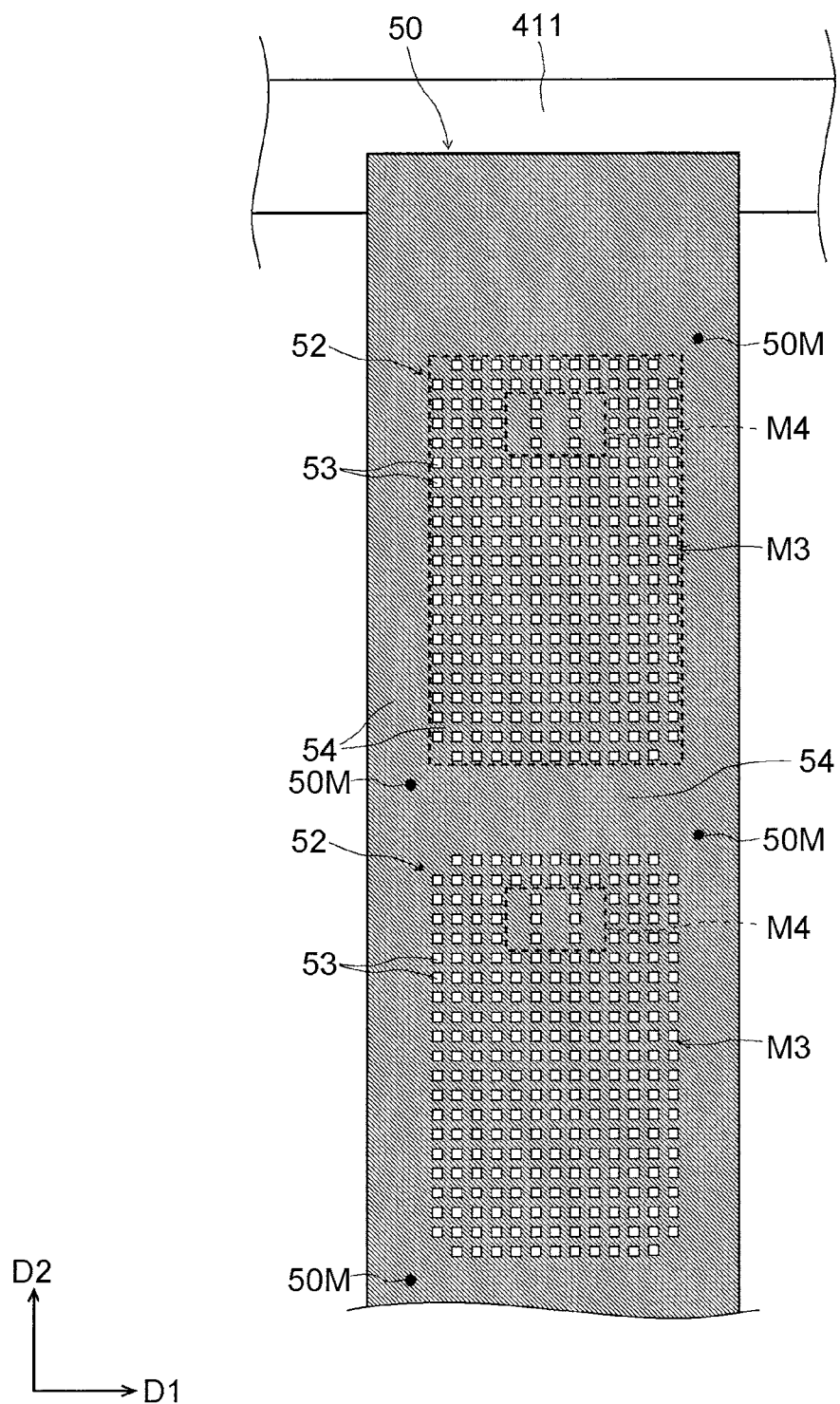
FIG. 12 is a plan view of a mask of the mask assembly.

FIG. 12 is an enlarged plan view of an example of the mask 50. The mask 50 has a first mask direction D1 and a second mask direction D2 that intersects with the first mask direction D1. The first mask direction D1 may be orthogonal to the second mask direction D2. The first mask direction D1 may correspond to the first element direction G1, and the second mask direction D2 may correspond to the second element direction G2.

The mask 50 includes the through-holes 53 and the blocking area 54. The through-holes 53 are arranged in the first mask direction D1 and the second mask direction D2.

When the mask 50 is viewed in the direction normal to the first face 51*a*, the mask 50 has a third mask area M3 and a fourth mask area M4. The third mask area M3 corresponds to the first display area 101 of the organic device 100. The fourth mask area M4 corresponds to the second display area 102 of the organic device 100.

In the third mask area M3, the through-holes 53 have a third open area ratio. The third open area ratio is calculated by dividing the total area of the through-holes 53 located in the third mask area M3 by the area of the third mask area M3. In the fourth mask area M4, the through-holes 53 have a fourth open area ratio. The fourth open area ratio is calculated by dividing the total area of the through-holes 53 located in the fourth mask area M4 by the area of the fourth mask area M4. The fourth open area ratio may be less than the third open area ratio.

The ratio of the fourth open area ratio to the third open area ratio, for example, may be greater than or equal to 0.2, may be greater than or equal to 0.3, or may be greater than or equal to 0.4. The ratio of the fourth open area ratio to the third open area ratio, for example, may be less than or equal to 0.6, may be less than or equal to 0.7, or may be less than or equal to 0.8. The range of the ratio of the fourth open area ratio to the third open area ratio may be determined by a first group consisting of 0.2, 0.3, and 0.4, and/or a second group consisting of 0.6, 0.7, and 0.8. The range of the ratio of the fourth open area ratio to the third open area ratio may be determined by a combination of any one of the values in the first group and any one of the values in the second group. The range of the ratio of the fourth open area ratio to the third open area ratio may be determined by a combination of any two of the values in the first group. The range of the ratio of the fourth open area ratio to the third open area ratio may be determined by a combination of any two of the values in the second group. For example, the ratio of the fourth open area ratio to the third open area ratio may be greater than or equal to 0.2 and less than or equal to 0.8, may be greater than or equal to 0.2 and less than or equal to 0.7, may be greater than or equal to 0.2 and less than or equal to 0.6, may be greater than or equal to 0.2 and less than or equal to 0.4, may be greater than or equal to 0.2 and less than or equal to 0.3, may be greater than or equal to 0.3 and less than or equal to 0.8, may be greater than or equal to 0.3 and less than or equal to 0.7, may be greater than or equal to 0.3 and less than or equal to 0.6, may be greater than or equal to 0.3 and less than or equal to 0.4, may be greater than or equal to 0.4 and less than or equal to 0.8, may be greater than or equal to 0.4 and less than or equal to 0.7, may be greater than or equal to 0.4 and less than or equal to 0.6, may be greater than or equal to 0.6 and less than or equal to 0.8, may be greater than or equal to 0.6 and less than or equal to 0.7, or may be greater than or equal to 0.7 and less than or equal to 0.8.

The mask 50 may have alignment marks 50M. The alignment marks 50M are formed at, for example, the corners of the cell 52 of the mask 50. The alignment marks 50M may be used to align the mask 50 with the substrate 110 in a process of forming the second electrode 140 on the substrate 110 by vapor deposition using the mask 50. The alignment marks 50M may be formed at, for example, locations that overlap the frame 41. In manufacturing the mask assembly 40, the alignment marks 50M may be used to align the mask 50 with the frame 41.

Figure 13:
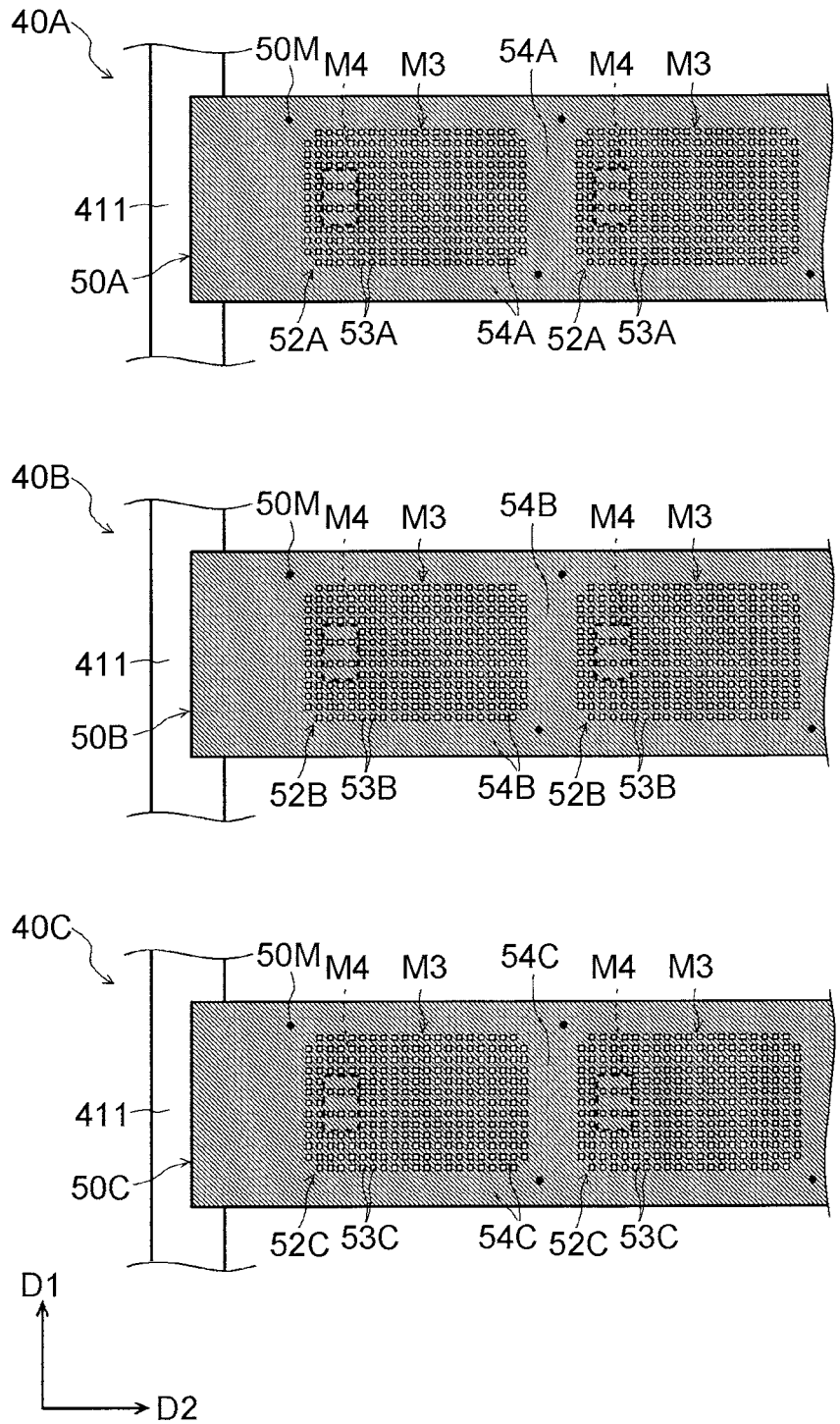
FIG. 13 is a diagram of a first mask assembly, a second mask assembly, and a third mask assembly.

In the process of forming the second electrode 140, a plurality of the masks 50 may be used. For example, as shown in FIG. 13, the masks 50 may include the first mask 50A, the second mask 50B, and the third mask 50C. The first mask 50A, the second mask 50B, and the third mask 50C may respectively make up different mask assemblies 40. The mask assembly 40 that includes the first mask 50A is also referred to as first mask assembly 40A. The mask assembly 40 that includes the second mask 50B is also referred to as second mask assembly 40B. The mask assembly 40 that includes the third mask 50C is also referred to as third mask assembly 40C.

In the process of forming the second electrode 140, for example, the first layers 140A of the second electrode 140 are formed on the substrate 110 by using the first mask assembly 40A in the vapor deposition system 10. Subsequently, the second layers 140B of the second electrode 140 are formed on the substrate 110 by using the second mask assembly 40B in the vapor deposition system 10. Subsequently, the third layers 140C of the second electrode 140 are formed on the substrate 110 by using the third mask assembly 40C in the vapor deposition system 10. In this way, in the process of forming the second electrode 140 of the organic device 100, the plurality of masks 50, that is, the first mask 50A, the second mask 50B, the third mask 50C, and the like, are used sequentially. A group of the plurality of masks 50 used to form the second electrode 140 of the organic device 100 is also referred to as "mask group".

Figure 14:
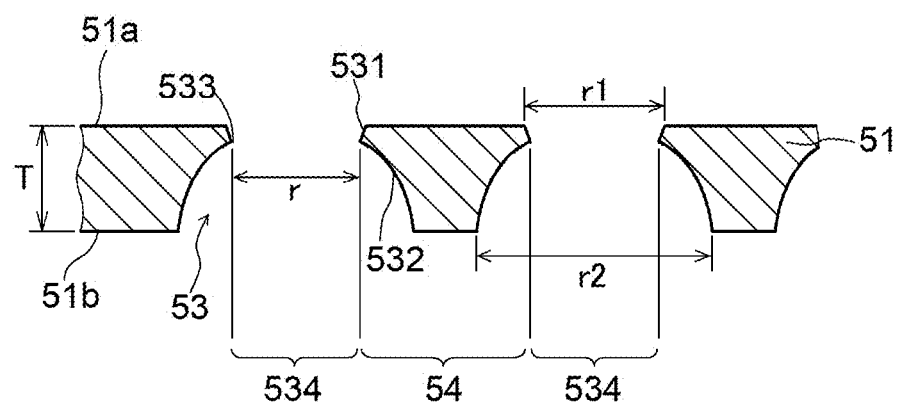
FIG. 14 is a diagram of an example of the sectional structure of the mask.

FIG. 14 is a diagram of an example of the sectional structure of the mask 50. The mask 50 has the plurality of through-holes 53 formed in a metal sheet 51. The through-holes 53 extend through the metal sheet 51 from the first face 51*a* to the second face 51*b*.

Each of the through-holes 53 may have a first recess 531 and a second recess 532. The first recess 531 is located on the first face 51*a* side. The second recess 532 is located on the second face 51*b* side. The first recess 531 is connected to the second recess 532 in the direction along the thickness of the metal sheet 51.

In plan view, the size r2 of the second recess 532 may be greater than the size r1 of the first recess 531. The first recess 531 may be formed by the working of the metal sheet 51 by etching or the like from the first face 51*a* side. The second recess 532 may be formed by the working of the metal sheet 51 by etching or the like from the second face 51*b* side. The first recess 531 and the second recess 532 are connected at a connecting portion 533.

The reference sign 534 indicates a through portion. The open area of the through-hole 53 in plan view is smallest at the through portion 534. The through portion 534 may be defined by the connecting portion 533.

In vapor deposition using the masks 50, the vapor deposition material 7 having passed through the through portions 534 of the through-holes 53 from the second face 51*b* side to the first face 51*a* side is deposited on the substrate 110, with the result that layers, that is, the first layers 140A, the second layers 140B, the third layers 140C, and the like, are formed on the substrate 110. The outline of a layer formed on the substrate 110 in the in-plane direction of the substrate 110 is determined by the outline of the through portion 534 in plan view. The outlines of the through-holes 53 shown in the plan views of FIGS. 15 to 21, and the like (described later) are the outlines of the through portions 534. The area of the through-hole 53 may be the area of the through portion 534. The size of the through-hole 53 in plan view may be the size r of the through portion 534.

The area of the metal sheet 51, other than the through portions 534, is able to block the vapor deposition material 7 heading toward the substrate 110. The area of the metal sheet 51, other than the through portions 534, is also referred to as blocking area 54. In the plan views of the mask 50 of FIGS. 12, 13, 15, 17, 18, and the like, the blocking area 54 is shaded by hatching. The blocking area 54 of the fourth mask area M4 may have a recess that does not extend through the metal sheet 51. When a recess is provided in the fourth mask area M4, the rigidity of the fourth mask area M4 is able to be reduced. Thus, it is possible to reduce the difference between the rigidity of the fourth mask area M4 and the rigidity of the third mask area M3. Therefore, it is possible to reduce occurrence of wrinkles in the mask 50 due to the difference in rigidity. Wrinkles tend to occur when, for example, a tension is applied to the mask 50.

The thickness T of the mask 50, for example, may be greater than or equal to 5 μm, may be greater than or equal to 10 μm, may be greater than or equal to 15 μm, or may be greater than or equal to 20 μm. The thickness T of the mask 50, for example, may be less than or equal to 25 μm, may be less than or equal to 30 μm, may be less than or equal to 50 μm, or may be less than or equal to 100 μm. The range of the thickness T of the mask 50 may be determined by a first group consisting of 5 μm, 10 μm, 15 μm, and 20 μm and/or a second group consisting of 25 μm, 30 μm, 50 μm, and 100 μm. The range of the thickness T of the mask 50 may be determined by a combination of any one of the values in the first group and any one of the values in the second group. The range of the thickness T of the mask 50 may be determined by a combination of any two of the values in the first group. The range of the thickness T of the mask 50 may be determined by a combination of any two of the values in the second group. For example, the thickness T of the mask 50 may be greater than or equal to 5 μm and less than or equal to 100 μm, may be greater than or equal to 5 μm and less than or equal to 50 μm, may be greater than or equal to 5 μm and less than or equal to 30 μm, may be greater than or equal to 5 μm and less than or equal to 25 μm, may be greater than or equal to 5 μm and less than or equal to 20 μm, may be greater than or equal to 5 μm and less than or equal to 15 μm, may be greater than or equal to 5 μm and less than or equal to 10 μm, may be greater than or equal to 10 μm and less than or equal to 100 μm, may be greater than or equal to 10 μm and less than or equal to 50 μm, may be greater than or equal to 10 μm and less than or equal to 30 μm, may be greater than or equal to 10 μm and less than or equal to 25 μm, may be greater than or equal to 10 μm and less than or equal to 20 μm, may be greater than or equal to 10 μm and less than or equal to 15 μm, may be greater than or equal to 15 μm and less than or equal to 100 μm, may be greater than or equal to 15 μm and less than or equal to 50 μm, may be greater than or equal to 15 μm and less than or equal to 30 μm, may be greater than or equal to 15 μm and less than or equal to 25 μm, may be greater than or equal to 15 μm and less than or equal to 20 μm, may be greater than or equal to 20 μm and less than or equal to 100 μm, may be greater than or equal to 20 μm and less than or equal to 50 μm, may be greater than or equal to 20 μm and less than or equal to 30 μm, may be greater than or equal to 20 μm and less than or equal to 25 μm, may be greater than or equal to 25 μm and less than or equal to 100 μm, may be greater than or equal to 25 μm and less than or equal to 50 μm, may be greater than or equal to 25 μm and less than or equal to 30 μm, may be greater than or equal to 30 μm and less than or equal to 100 μm, may be greater than or equal to 30 μm and less than or equal to 50 μm, or may be greater than or equal to 50 μm and less than or equal to 100 μm.

A contact measurement method may be adopted as a method of measuring the thickness T of the mask 50. The length gauge HEIDENHAIN-METRO MT1271 made by HEIDENHAIN, which includes a ball-bearing guide plunger, may be used as the contact measurement method.

The sectional shape of the through-hole 53 is not limited to the shape shown in FIG. 14. A method of forming the through-holes 53 is not limited to etching, and various methods may be adopted. For example, the mask 50 may be formed by plating such that the through-holes 53 are formed.

Examples of the material of the mask 50 include iron alloys that include nickel. The iron alloys may further include cobalt in addition to nickel. Examples of the material of the mask 50 include iron alloys of which the content of nickel and cobalt in total is higher than or equal to 30 percent by mass and lower than or equal to 54 percent by mass and the content of cobalt is higher than or equal to zero percent by mass and lower than or equal to six percent by mass. Examples of the iron alloys that include nickel or nickel and cobalt include Invar that includes nickel higher than or equal to 34 percent by mass and lower than or equal to 38 percent by mass, Super-Invar that includes nickel higher than or equal to 30 percent by mass and lower than or equal to 34 percent by mass and further includes cobalt, and Fe—Ni plating alloys that has a low-thermal expansion and that include nickel higher than or equal to 38 percent by mass and lower than or equal to 54 percent by mass. When such iron alloys are used, it is possible to reduce the thermal expansion coefficient of the mask 50. When, for example, a glass substrate is used as the substrate 110, the thermal expansion coefficient of the mask 50 is able to be set to a low value equivalent to that of the glass substrate. Thus, in the vapor deposition process, it is possible to suppress a decrease in the dimensional accuracy and positional accuracy of vapor deposition layers formed on the substrate 110 due to a difference in thermal expansion coefficient between the mask 50 and the substrate 110.

Figure 15:
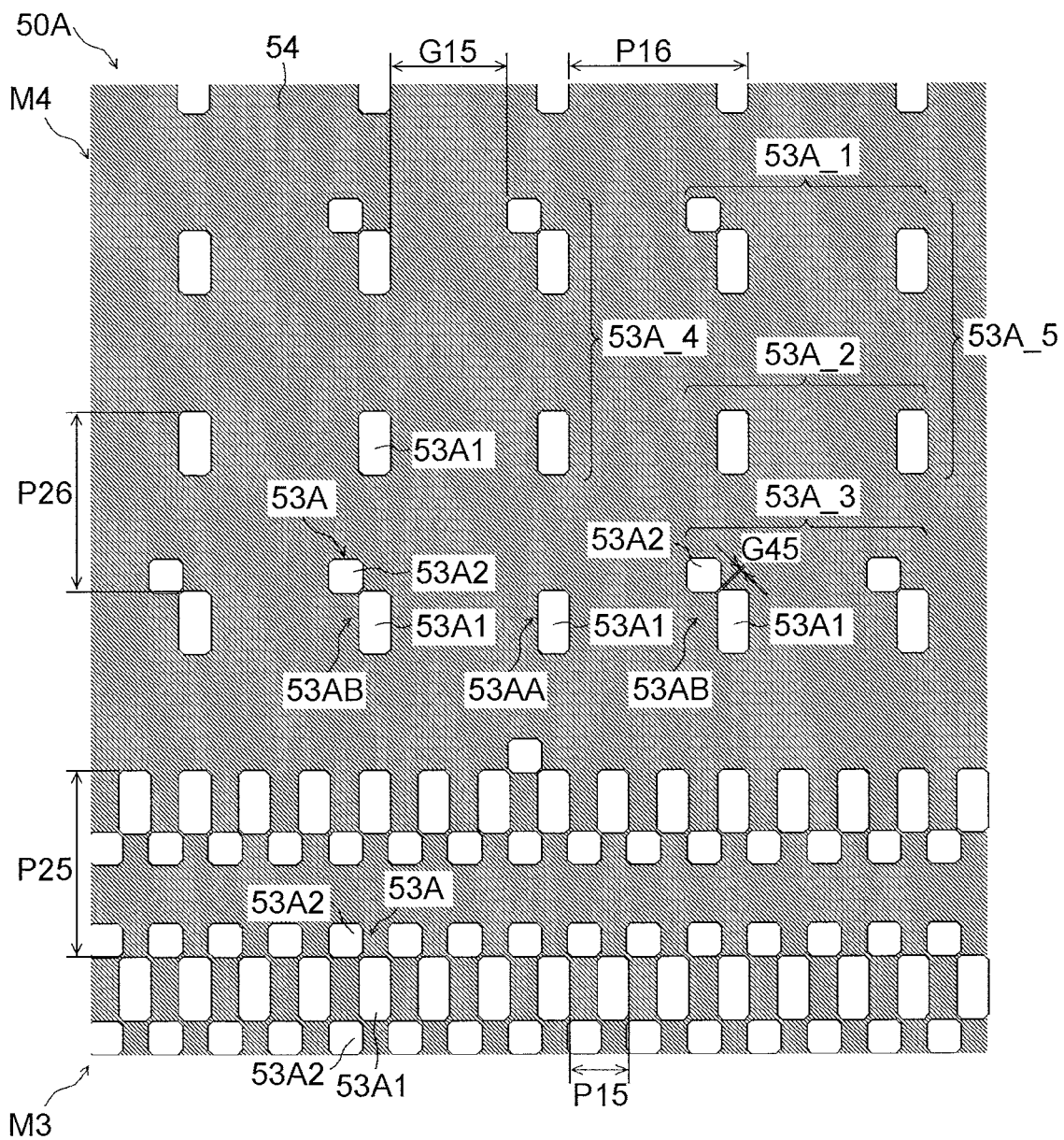
FIG. 15 is a plan view of an example of a first mask.

Next, the first mask 50A will be described in detail. FIG. 15 is an enlarged plan view of the third mask area M3 and the fourth mask area M4 of the first mask 50A. The first mask 50A has first through-holes 53A and a first blocking area 54A. The first through-holes 53A are arranged in the first mask direction D1 and the second mask direction D2.

In the third mask area M3, the first through-holes 53A may be arranged at a fifteenth pitch P15 in the first mask direction D1. In the fourth mask area M4, the first through-holes 53A may be arranged at a sixteenth pitch P16 in the first mask direction D1. The sixteenth pitch P16 may be greater than the fifteenth pitch P15.

The ratio of the sixteenth pitch P16 to the fifteenth pitch P15, for example, may be greater than or equal to 1.1, may be greater than or equal to 1.3, or may be greater than or equal to 1.5. The ratio of the sixteenth pitch P16 to the fifteenth pitch P15, for example, may be less than or equal to 2.0, may be less than or equal to 3.0, or may be less than or equal to 4.0. The range of the ratio of the sixteenth pitch P16 to the fifteenth pitch P15 may be determined by a first group consisting of 1.1, 1.3, and 1.5 and/or a second group consisting of 2.0, 3.0, and 4.0. The range of the ratio of the sixteenth pitch P16 to the fifteenth pitch P15 may be determined by a combination of any one of the values in the first group and any one of the values in the second group. The range of the ratio of the sixteenth pitch P16 to the fifteenth pitch P15 may be determined by a combination of any two of the values in the first group. The range of the ratio of the sixteenth pitch P16 to the fifteenth pitch P15 may be determined by a combination of any two of the values in the second group. For example, the ratio of the sixteenth pitch P16 to the fifteenth pitch P15 may be greater than or equal to 1.1 and less than or equal to 4.0, may be greater than or equal to 1.1 and less than or equal to 3.0, may be greater than or equal to 1.1 and less than or equal to 2.0, may be greater than or equal to 1.1 and less than or equal to 1.5, may be greater than or equal to 1.1 and less than or equal to 1.3, may be greater than or equal to 1.3 and less than or equal to 4.0, may be greater than or equal to 1.3 and less than or equal to 3.0, may be greater than or equal to 1.3 and less than or equal to 2.0, may be greater than or equal to 1.3 and less than or equal to 1.5, may be greater than or equal to 1.5 and less than or equal to 4.0, may be greater than or equal to 1.5 and less than or equal to 3.0, may be greater than or equal to 1.5 and less than or equal to 2.0, may be greater than or equal to 2.0 and less than or equal to 4.0, may be greater than or equal to 2.0 and less than or equal to 3.0, or may be greater than or equal to 3.0 and less than or equal to 4.0.

The reference sign G15 indicates the gap between any adjacent two of the first through-holes 53A in the first mask direction D1 in the fourth mask area M4. The gap G15 may be determined with reference to the fifteenth pitch P15 of the first through-holes 53A in the third mask area M3.

The ratio of the gap G15 to the fifteenth pitch P15, for example, may be greater than or equal to 0.3, may be greater than or equal to 0.5, or may be greater than or equal to 1.0. The ratio of the gap G15 to the fifteenth pitch P15, for example, may be less than or equal to 1.5, may be less than or equal to 2.0, or may be less than or equal to 3.0. The range of the ratio of the gap G15 to the fifteenth pitch P15 may be determined by a first group consisting of 0.3, 0.5, and 1.0 and/or a second group consisting of 1.5, 2.0, and 3.0. The range of the ratio of the gap G15 to the fifteenth pitch P15 may be determined by a combination of any one of the values in the first group and any one of the values in the second group. The range of the ratio of the gap G15 to the fifteenth pitch P15 may be determined by a combination of any two of the values in the first group. The range of the ratio of the gap G15 to the fifteenth pitch P15 may be determined by a combination of any two of the values in the second group. For example, the ratio of the gap G15 to the fifteenth pitch P15 may be greater than or equal to 0.3 and less than or equal to 3.0, may be greater than or equal to 0.3 and less than or equal to 2.0, may be greater than or equal to 0.3 and less than or equal to 1.5, may be greater than or equal to 0.3 and less than or equal to 1.0, may be greater than or equal to 0.3 and less than or equal to 0.5, may be greater than or equal to 0.5 and less than or equal to 3.0, may be greater than or equal to 0.5 and less than or equal to 2.0, may be greater than or equal to 0.5 and less than or equal to 1.5, may be greater than or equal to 0.5 and less than or equal to 1.0, may be greater than or equal to 1.0 and less than or equal to 3.0, may be greater than or equal to 1.0 and less than or equal to 2.0, may be greater than or equal to 1.0 and less than or equal to 1.5, may be greater than or equal to 1.5 and less than or equal to 3.0, may be greater than or equal to 1.5 and less than or equal to 2.0, or may be greater than or equal to 2.0 and less than or equal to 3.0.

The gap G15, for example, may be greater than or equal to 10 μm, may be greater than or equal to 50 μm, may be greater than or equal to 100 μm, or may be greater than or equal to 150 μm. The gap G15, for example, may be less than or equal to 200 μm, may be less than or equal to 250 μm, or may be less than or equal to 300 μm. The range of the gap G15 may be determined by a first group consisting of 10 μm, 50 μm, 100 μm, and 150 μm and/or a second group consisting of 200 μm, 250 μm, and 300 μm. The range of the gap G15 may be determined by a combination of any one of the values in the first group and any one of the values in the second group. The range of the gap G15 may be determined by a combination of any two of the values in the first group. The range of the gap G15 may be determined by a combination of any two of the values in the second group. For example, the gap G15 may be greater than or equal to 10 μm and less than or equal to 300 μm, may be greater than or equal to 10 μm and less than or equal to 250 μm, may be greater than or equal to 10 μm and less than or equal to 200 μm, may be greater than or equal to 10 μm and less than or equal to 150 μm, may be greater than or equal to 10 μm and less than or equal to 100 μm, may be greater than or equal to 10 μm and less than or equal to 50 μm, may be greater than or equal to 50 μm and less than or equal to 300 μm, may be greater than or equal to 50 μm and less than or equal to 250 μm, may be greater than or equal to 50 μm and less than or equal to 200 μm, may be greater than or equal to 50 μm and less than or equal to 150 μm, may be greater than or equal to 50 μm and less than or equal to 100 μm, may be greater than or equal to 100 μm and less than or equal to 300 μm, may be greater than or equal to 100 μm and less than or equal to 250 μm, may be greater than or equal to 100 μm and less than or equal to 200 μm, may be greater than or equal to 100 μm and less than or equal to 150 μm, may be greater than or equal to 150 μm and less than or equal to 300 μm, may be greater than or equal to 150 μm and less than or equal to 250 μm, may be greater than or equal to 150 μm and less than or equal to 200 μm, may be greater than or equal to 200 μm and less than or equal to 300 μm, may be greater than or equal to 200 μm and less than or equal to 250 μm, or may be greater than or equal to 250 μm and less than or equal to 300 μm.

In the third mask area M3, the first through-holes 53A may be arranged at a twenty-fifth pitch P25 in the second mask direction D2. In the fourth mask area M4, the first through-holes 53A may be arranged at a twenty-sixth pitch P26 in the second mask direction D2. The twenty-sixth pitch P26 may be the same as the twenty-fifth pitch P25 or may be different from the twenty-fifth pitch P25.

The first through-holes 53A located in the third mask area M3 may include first main holes 53A1 and first sub-holes 53A2. The area of the first main hole 53A1 may be greater than the area of the first sub-hole 53A2 or may be the same as the area of the first sub-hole 53A2.

Figure 16:
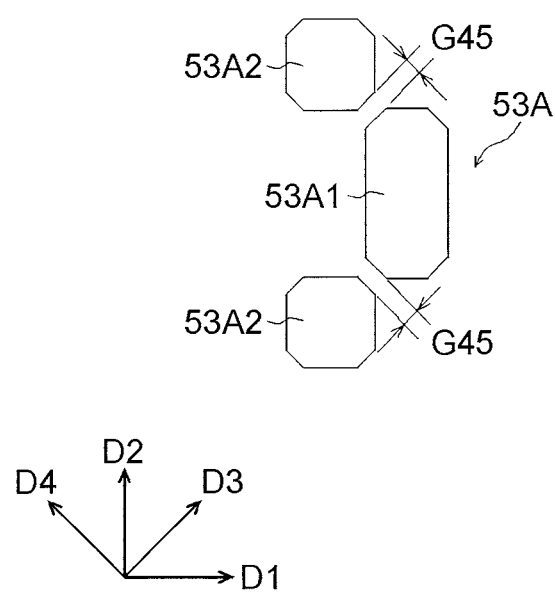
FIG. 16 is a plan view of an example of the first mask.

FIG. 16 is an enlarged plan view of the first through-hole 53A. The first sub-hole 53A2 may be arranged side by side with the first main hole 53A1 in a third mask direction D3 or a fourth mask direction D4. For example, the first through-hole 53A may include the first main hole 53A1, the first sub-hole 53A2 arranged side by side with the first main hole 53A1 in the third mask direction D3, and the first sub-hole 53A2 arranged side by side with the first main hole 53A1 in the fourth mask direction D4.

The third mask direction D3 is a direction that intersects with both the first mask direction D1 and the second mask direction D2. The angle formed by the third mask direction D3 with each of the first mask direction D1 and the second mask direction D2 is, for example, greater than or equal to 20° and less than or equal to 70°. The fourth mask direction D4 is a direction that intersects with both the first mask direction D1 and the second mask direction D2. The angle formed by the fourth mask direction D4 with each of the first mask direction D1 and the second mask direction D2 is, for example, greater than or equal to 20° and less than or equal to 70°. The third mask direction D3 intersects with the fourth mask direction D4. For example, the third mask direction D3 may be orthogonal to the fourth mask direction D4. The third mask direction D3 may correspond to the third element direction G3, and the fourth mask direction D4 may correspond to the fourth element direction G4.

The reference sign G45 indicates the gap between the first main hole 53A1 and the first sub-hole 53A2 in the third mask direction D3 or the fourth mask direction D4. The gap G45, for example, may be greater than or equal to 5 μm, may be greater than or equal to 10 μm, or may be greater than or equal to 15 μm. The gap G45, for example, may be less than or equal to 30 μm, may be less than or equal to 35 μm, or may be less than or equal to 40 μm. The range of the gap G45 may be determined by a first group consisting of 5 μm, 10 μm, and 15 μm and/or a second group consisting of 30 μm, 35 μm, and 40 μm. The range of the gap G45 may be determined by a combination of any one of the values in the first group and any one of the values in the second group. The range of the gap G45 may be determined by a combination of any two of the values in the first group. The range of the gap G45 may be determined by a combination of any two of the values in the second group. For example, the gap G45 may be greater than or equal to 5 μm and less than or equal to 40 μm, may be greater than or equal to 5 μm and less than or equal to 35 μm, may be greater than or equal to 5 μm and less than or equal to 30 μm, may be greater than or equal to 5 μm and less than or equal to 15 μm, may be greater than or equal to 5 μm and less than or equal to 10 μm, may be greater than or equal to 10 μm and less than or equal to 40 μm, may be greater than or equal to 10 μm and less than or equal to 35 μm, may be greater than or equal to 10 μm and less than or equal to 30 μm, may be greater than or equal to 10 μm and less than or equal to 15 μm, may be greater than or equal to 15 μm and less than or equal to 40 μm, may be greater than or equal to 15 μm and less than or equal to 35 μm, may be greater than or equal to 15 μm and less than or equal to 30 μm, may be greater than or equal to 30 μm and less than or equal to 40 μm, may be greater than or equal to 30 μm and less than or equal to 35 μm, or may be greater than or equal to 35 μm and less than or equal to 40 μm.

The first through-hole 53A located in the fourth mask area M4 may have a different shape from the first through-hole 53A located in the third mask area M3. For example, the first through-hole 53A located in the fourth mask area M4 may include a first-type through-hole 53AA or a second-type through-hole 53AB. The first-type through-hole 53AA includes at least any one of the first main hole 53A1 and the first sub-hole 53A2. The second-type through-hole 53AB also includes at least any one of the first main hole 53A1 and the first sub-hole 53A2.

The number of the first main holes 53A1 of the first-type through-hole 53AA is different from the number of the first main holes 53A1 of the second-type through-hole 53AB. Alternatively, the number of the first sub-holes 53A2 of the first-type through-hole 53AA is different from the number of the first sub-holes 53A2 of the second-type through-hole 53AB. For example, the first-type through-hole 53AA includes one first main hole 53A1. The first-type through-hole 53AA does not need to include the first sub-hole 53A2. The second-type through-hole 53AB includes one first main hole 53A1 and one first sub-hole 53A2. The one first sub-hole 53A2 may be arranged side by side with the first main hole 53A1 in the third mask direction D3 or the fourth mask direction D4.

The fourth mask area M4 may include at least two of a first hole array 53A_1, a second hole array 53A_2, and a third hole array 53A_3. The first hole array 53A_1 means a combination of the first-type through-hole 53AA and the second-type through-hole 53AB arranged in the first mask direction D1. The second hole array 53A_2 means a combination of the two first-type through-holes 53AA arranged in the first mask direction D1. The third hole array 53A_3 means a combination of the two second-type through-holes 53AB arranged in the first mask direction D1.

The fourth mask area M4 may include a fourth hole array 53A_4 and a fifth hole array 53A_5. The fourth hole array 53A_4 means a combination of the first-type through-hole 53AA and the second-type through-hole 53AB arranged in the second mask direction D2. The fifth hole array 53A_5 means a combination of the two first-type through-holes 53AA arranged in the second mask direction D2. Although not shown in the drawing, the fourth mask area M4 may include a sixth hole array 53A_6. The sixth hole array 53A_6 means a combination of the two second-type through-holes 53AB arranged in the second mask direction D2.

Figure 17:
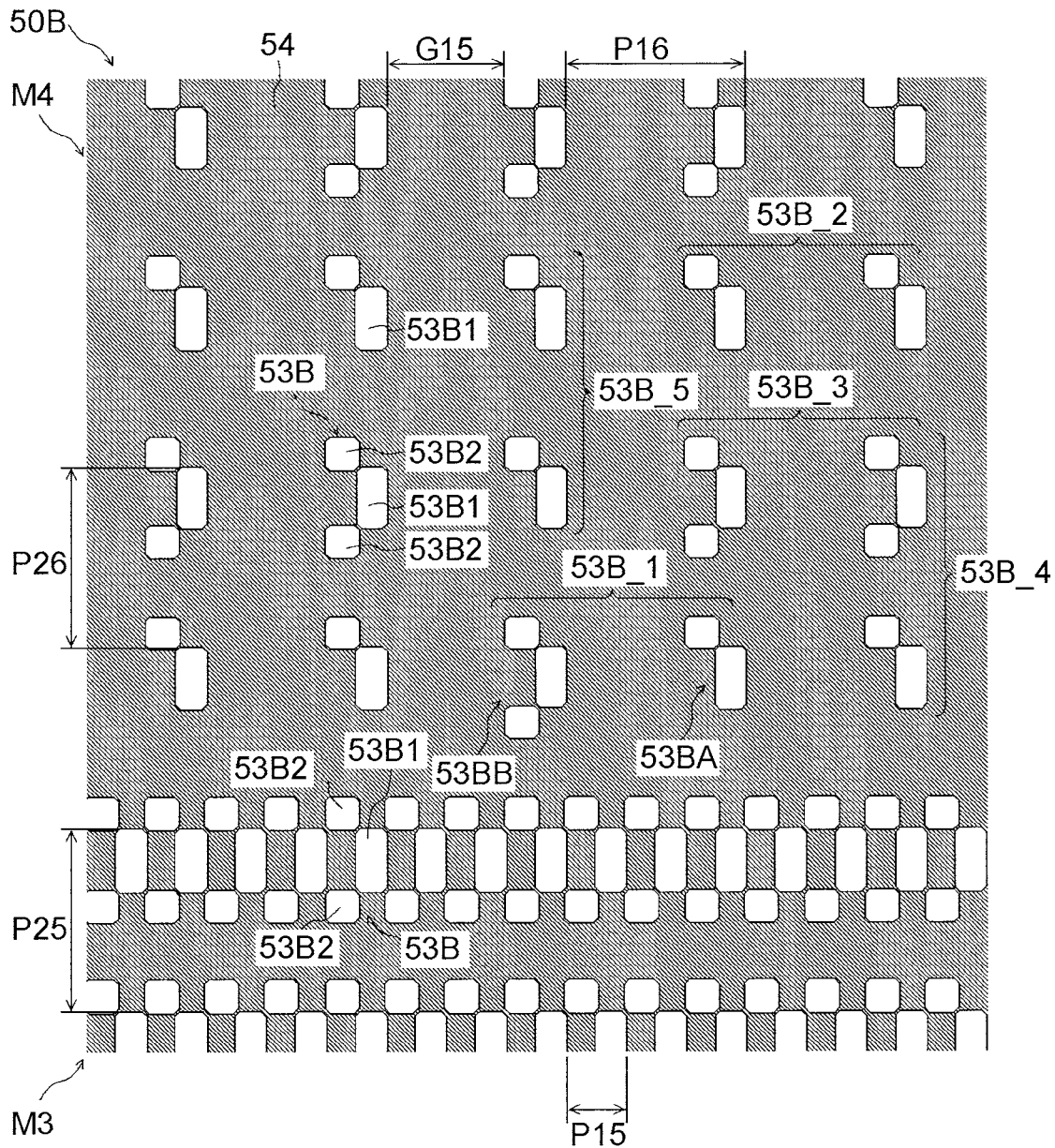
FIG. 17 is a plan view of an example of a second mask.

The second mask 50B will be described with reference to FIG. 17. The description of part of the second mask 50B configured similarly to the first mask 50A may not be repeated.

The second mask 50B has second through-holes 53B and a second blocking area 54B. The second through-holes 53B, as well as the first through-holes 53A, are arranged in the first mask direction D1 and the second mask direction D2.

The second through-holes 53B located in the third mask area M3 may include second main holes 53B1 and second sub-holes 53B2. The area of the second main hole 53B1 may be greater than the area of the second sub-hole 53B2 or may be the same as the area of the second sub-hole 53B2.

The second sub-hole 53B2 may be arranged side by side with the second main hole 53B1 in the third mask direction D3 or the fourth mask direction D4. For example, the second through-hole 53B may include the second main hole 53B1, the second sub-hole 53B2 arranged side by side with the second main hole 53B1 in the third mask direction D3, and the second sub-hole 53B2 arranged side by side with the second main hole 53B1 in the fourth mask direction D4.

The range of the gap G45 may be adopted as the range of the gap between the second main hole 53B1 and the second sub-hole 53B2 in the third mask direction D3 or the fourth mask direction D4.

The second through-hole 53B located in the fourth mask area M4 may have a different shape from the second through-hole 53B located in the third mask area M3. For example, the second through-hole 53B located in the fourth mask area M4 may include a first-type through-hole 53BA or a second-type through-hole 53BB. As in the case of the first mask 50A, the first-type through-hole 53BA includes at least any one of the second main hole 53B1 and the second sub-hole 53B2. The second-type through-hole 53BB also includes at least any one of the second main hole 53B1 and the second sub-hole 53B2.

The number of the second main holes 53B1 of the first-type through-hole 53BA is different from the number of the second main holes 53B1 of the second-type through-hole 53BB. Alternatively, the number of the second sub-holes 53B2 of the first-type through-hole 53BA is different from the number of the second sub-holes 53B2 of the second-type through-hole 53BB. For example, the first-type through-hole 53BA includes one second main hole 53B1 and one second sub-hole 53B2. The one second sub-hole 53B2 may be arranged side by side with the second main hole 53B1 in the third mask direction D3 or the fourth mask direction D4. For example, the second-type through-hole 53BB includes one second main hole 53B1 and two second sub-holes 53B2. The two second sub-holes 53B2 may be respectively arranged side by side with the second main hole 53B1 in the third mask direction D3 and the fourth mask direction D4.

The fourth mask area M4 may include at least two of a first hole array 53B_1, a second hole array 53B_2, and a third hole array 53B_3. The first hole array 53B_1 means a combination of the first-type through-hole 53BA and the second-type through-hole 53BB arranged in the first mask direction D1. The second hole array 53B_2 means a combination of the two first-type through-holes 53BA arranged in the first mask direction D1. The third hole array 53B_3 means a combination of the two second-type through-holes 53BB arranged in the first mask direction D1.

The fourth mask area M4 may include a fourth hole array 53B_4 and a fifth hole array 53B_5. The fourth hole array 53B_4 means a combination of the first-type through-hole 53BA and the second-type through-hole 53BB arranged in the second mask direction D2. The fifth hole array 53B_5 means a combination of the two first-type through-holes 53BA arranged in the second mask direction D2. Although not shown in the drawing, the fourth mask area M4 may include a sixth hole array 53B_6. The sixth hole array 53B_6 means a combination of the two second-type through-holes 53BB arranged in the second mask direction D2.

Figure 18:
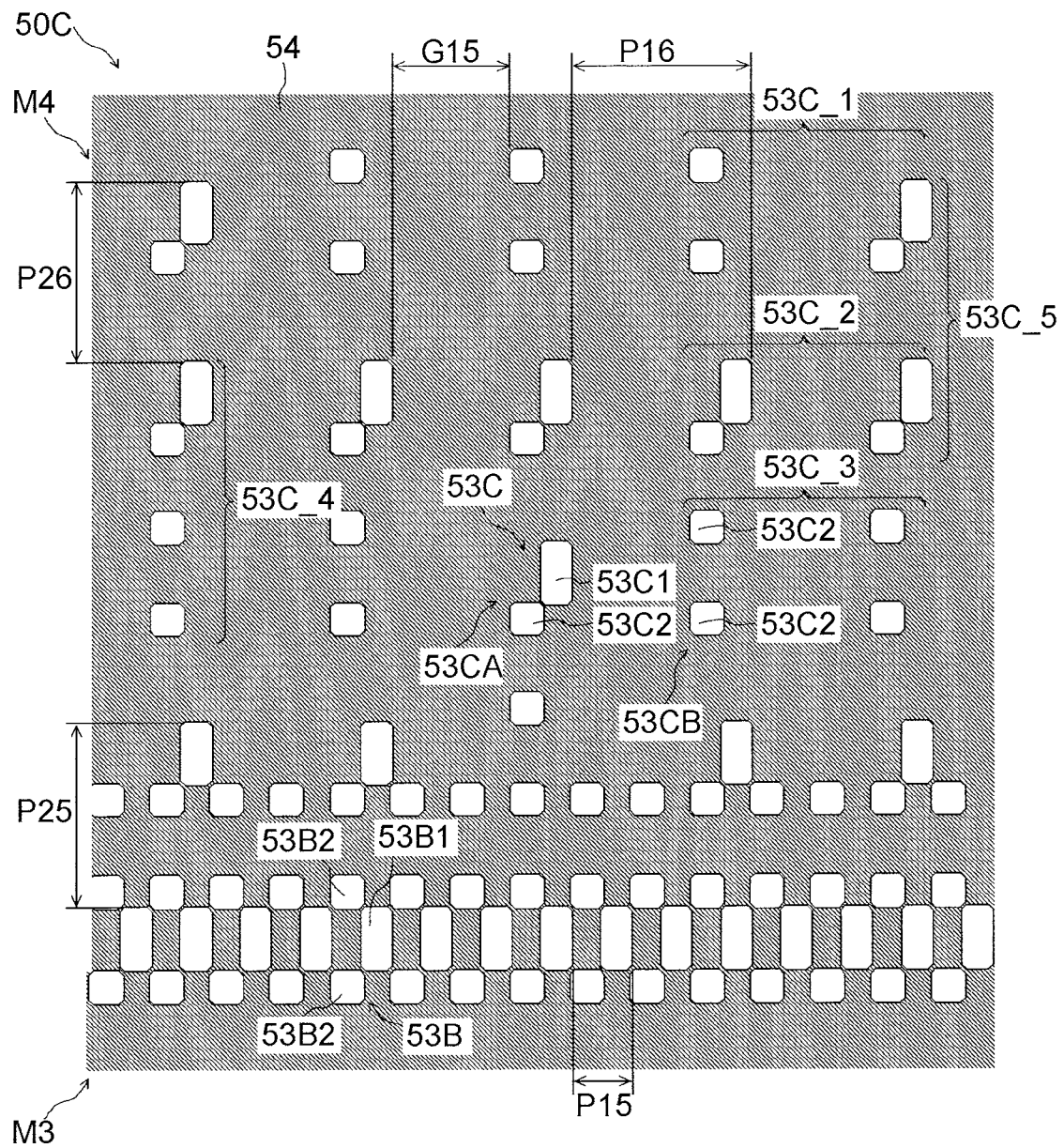
FIG. 18 is a plan view of an example of a third mask.
Figure 18:
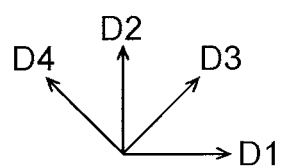

The third mask 50C will be described with reference to FIG. 18. The description of part of the third mask 50C configured similarly to the first mask 50A may not be repeated.

The third mask 50C has third through-holes 53C and a third blocking area 54C. The third through-holes 53C, as well as the first through-holes 53A, are arranged in the first mask direction D1 and the second mask direction D2.

The third through-hole 53C located in the third mask area M3 may include a third main hole 53C1 and a third sub-hole 53C2. The third sub-hole 53C2 may be arranged side by side with the third main hole 53O1 in the third mask direction D3 or the fourth mask direction D4. For example, the third through-hole 53C may include the third main hole 53O1, the third sub-hole 53C2 arranged side by side with the third main hole 53O1 in the third mask direction D3, and the third sub-hole 53C2 arranged side by side with the third main hole 53O1 in the fourth mask direction D4.

The range of the gap G45 may be adopted as the range of the gap between the third main hole 53O1 and the third sub-hole 53C2 in the third mask direction D3 or the fourth mask direction D4.

The third through-hole 53C located in the fourth mask area M4 may have a different shape from the third through-hole 53C located in the third mask area M3. For example, the third through-hole 53C located in the fourth mask area M4 may include a first-type through-hole 53CA or a second-type through-hole 53CB. As in the case of the first mask 50A, the first-type through-hole 53CA includes at least any one of the third main hole 53O1 and the third sub-hole 53C2.

The second-type through-hole 53CB includes at least any one of the third main hole 53O1 and the third sub-hole 53C2.

The number of the third main holes 53O1 of the first-type through-hole 53CA is different from the number of the third main holes 53O1 of the second-type through-hole 53CB. Alternatively, the number of the third sub-holes 53C2 of the first-type through-hole 53CA is different from the number of the third sub-holes 53C2 of the second-type through-hole 53CB. For example, the first-type through-hole 53CA includes one third main hole 53C1 and one third sub-hole 53C2. The one third sub-hole 53C2 may be arranged side by side with the third main hole 53C1 in the third mask direction D3 or the fourth mask direction D4. The second-type through-hole 53CB includes one third main hole 53C1 and two third sub-holes 53C2. The two third sub-holes 53C2 may be respectively arranged side by side with the third main hole 53C1 in the third mask direction D3 and the fourth mask direction D4.

The fourth mask area M4 may include at least two of a first hole array 53C_1, a second hole array 53C_2, and a third hole array 53C_3. The first hole array 53C_1 means a combination of the first-type through-hole 53CA and the second-type through-hole 53CB arranged in the first mask direction D1. The second hole array 53C_2 means a combination of the two first-type through-holes 53CA arranged in the first mask direction D1. The third hole array 53C_3 means a combination of the two second-type through-holes 53CB arranged in the first mask direction D1.

The fourth mask area M4 may include a fourth hole array 53C_4 and a fifth hole array 53C_5. The fourth hole array 53C_4 means a combination of the first-type through-hole 53CA and the second-type through-hole 53CB arranged in the second mask direction D2. The fifth hole array 53C_5 means a combination of the two first-type through-holes 53CA arranged in the second mask direction D2. Although not shown in the drawing, the fourth mask area M4 may include a sixth hole array 53C_6. The sixth hole array 53C_6 means a combination of the two second-type through-holes 53CB arranged in the second mask direction D2.

In a method of measuring the shapes and arrangements of the through-holes 53A to 53C of the masks 50A to 50C, parallel light is caused to enter one of the first face 51a and the second face 51b in the direction normal to each mask. The parallel light exits from the other one of the first face 51a and the second face 51b. The shape of an area occupied by the outgoing light is measured as the shape of the through-hole 53.

Figure 19:
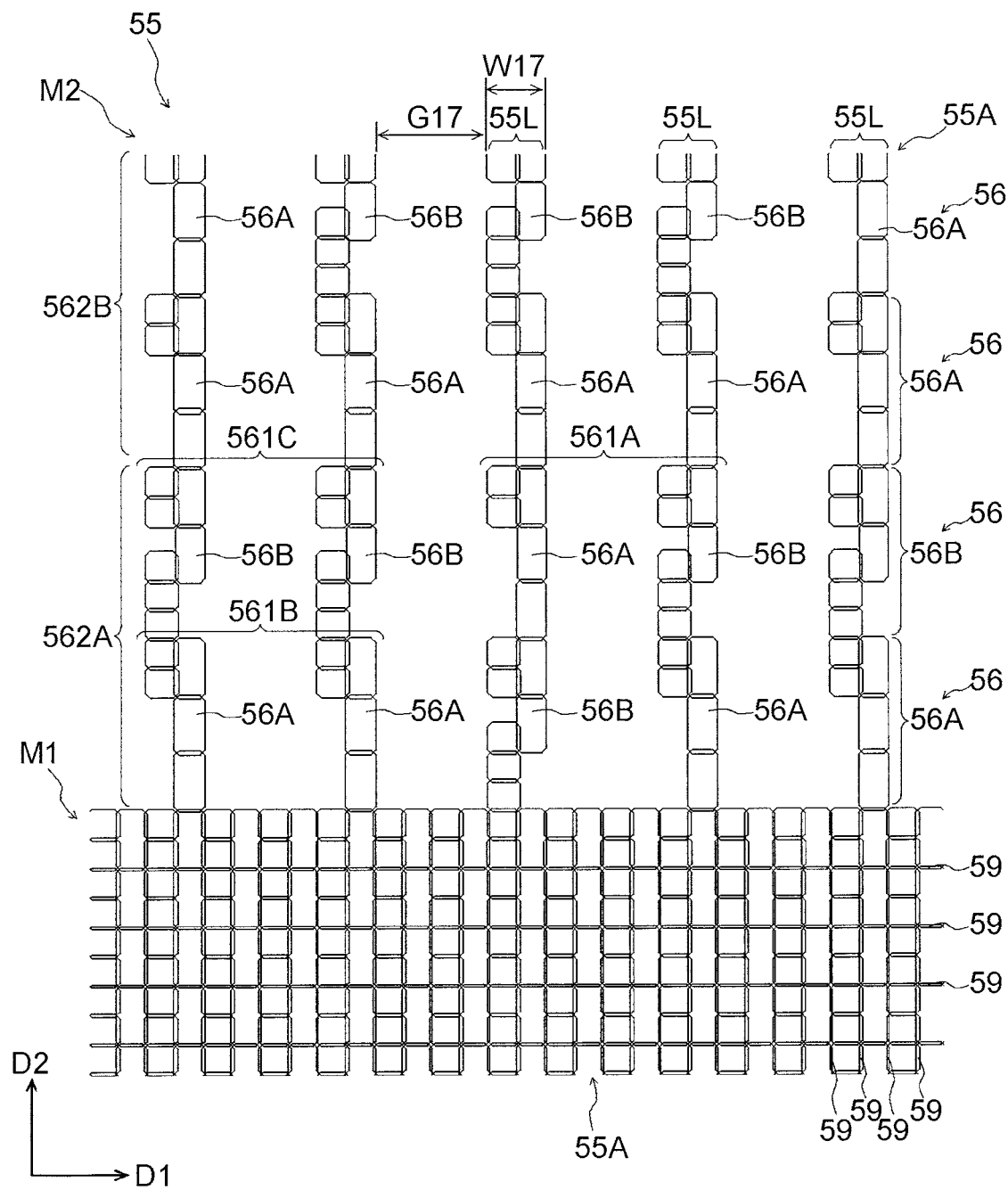
FIG. 19 is a plan view of an example of a mask stack.

Next, the positional relationship among the first mask 50A, the second mask 50B, and the third mask 50C will be described. FIG. 19 is a plan view of a mask stack 55. The mask stack 55 includes two or more stacked masks 50. The mask stack 55 shown in FIG. 19 includes the stacked first mask 50A, second mask 50B, and third mask 50C.

In the mask stack 55, the alignment marks 50M of the masks 50A to 50C may overlap one another. Alternatively, the masks 50A to 50C may be stacked in accordance with the arrangement of the cells 52 of the masks 50A to 50C. Alternatively, the masks 50A to 50C may be stacked in accordance with the arrangement of the through-holes 53A to 53C and blocking areas 54A to 54C of the masks 50A to 50C. In stacking the masks 50A to 50C, a tension may be applied to each of the masks 50A to 50C, or a tension does not need to be applied.

A view in a state where two or more masks 50 are stacked may be obtained by superposing image data of the masks 50. For example, initially, image data on the outline of each of the through-holes 53A to 53C of the masks 50A to 50C is obtained by using an image capturing apparatus. Subsequently, the pieces of image data of the masks 50A to 50C are superposed by using an image processing apparatus. Thus, the view as shown in FIG. 19 is drawn. In acquiring image data, a tension may be applied to each of the masks 50A to 50C, or a tension does not need to be applied. A view in a state where two or more masks 50 are stacked may be obtained by superposing design drawings for manufacturing the masks 50A to 50C.

As shown in FIG. 19, the mask stack 55 includes through areas 55A. The through area 55A includes at least one of the through-holes 53A to 53C of the masks 50A to 50C in plan view. In other words, the through area 55A overlaps at least any one of the through-holes 53A to 53C of the masks 50A to 50C in plan view. Therefore, in the vapor deposition process, at least one-layer second electrode 140 is formed in an area of the substrate 110, corresponding to the through area 55A.

The through area 55A may include a hole overlap area 59. The hole overlap area 59 is an area in which the through-holes 53 of two or more masks 50 overlap in plan view. In other words, the hole overlap area 59 includes at least two of the through-holes 53 of two or more of the masks 50 included in the mask stack 55 in plan view. In the example shown in FIG. 19, the hole overlap area 59 includes an area in which the first through-hole 53A and the second through-hole 53B overlap, an area in which the first through-hole 53A and the third through-hole 53C overlap, or an area in which the second through-hole 53B and the third through-hole 53C overlap in plan view. Therefore, in the vapor deposition process, the second electrode 140 with at least two layers is formed in areas of the substrate 110, corresponding to the hole overlap areas 59.

In plan view, the mask stack 55 includes the first mask area M1 and the second mask area M2. The first mask area M1 corresponds to the first display area 101 of the organic device 100. The second mask area M2 corresponds to the second display area 102 of the organic device 100.

In the first mask area M1, the through area 55A has a first open area ratio. The first open area ratio is calculated by dividing the total area of the through area 55A located in the first mask area M1 by the area of the first mask area M1. In the second mask area M2, the through area 55A has a second open area ratio. The second open area ratio is calculated by dividing the total area of the through area 55A located in the second mask area M2 by the area of the second mask area M2. The second open area ratio may be less than the first open area ratio.

The ratio of the second open area ratio to the first open area ratio, for example, may be greater than or equal to 0.2, may be greater than or equal to 0.3, or may be greater than or equal to 0.4. The ratio of the second open area ratio to the first open area ratio, for example, may be less than or equal to 0.6, may be less than or equal to 0.7, or may be less than or equal to 0.8. The range of the ratio of the second open area ratio to the first open area ratio may be determined by a first group consisting of 0.2, 0.3, and 0.4, and/or a second group consisting of 0.6, 0.7, and 0.8. The range of the ratio of the second open area ratio to the first open area ratio may be determined by a combination of any one of the values in the first group and any one of the values in the second group. The range of the ratio of the second open area ratio to the first open area ratio may be determined by a combination of any two of the values in the first group. The range of the ratio of the second open area ratio to the first open area ratio may be determined by a combination of any two of the values in the second group. For example, the ratio of the second open area ratio to the first open area ratio may be greater than or equal to 0.2 and less than or equal to 0.8, may be greater than or equal to 0.2 and less than or equal to 0.7, may be greater than or equal to 0.2 and less than or equal to 0.6, may be greater than or equal to 0.2 and less than or equal to 0.4, may be greater than or equal to 0.2 and less than or equal to 0.3, may be greater than or equal to 0.3 and less than or equal to 0.8, may be greater than or equal to 0.3 and less than or equal to 0.7, may be greater than or equal to 0.3 and less than or equal to 0.6, may be greater than or equal to 0.3 and less than or equal to 0.4, may be greater than or equal to 0.4 and less than or equal to 0.8, may be greater than or equal to 0.4 and less than or equal to 0.7, may be greater than or equal to 0.4 and less than or equal to 0.6, may be greater than or equal to 0.6 and less than or equal to 0.8, may be greater than or equal to 0.6 and less than or equal to 0.7, or may be greater than or equal to 0.7 and less than or equal to 0.8.

The area of the hole overlap area 59 may be less than the area of the first through-hole 53A. For example, the area of the hole overlap area 59 may be less than the area of the first main hole 53A1. The ratio of the area of the hole overlap area 59 to the area of the first main hole 53A1, for example, may be greater than or equal to 0.02, may be greater than or equal to 0.05, or may be greater than or equal to 0.10. The ratio of the area of the hole overlap area 59 to the area of the first main hole 53A1, for example, may be less than or equal to 0.20, may be less than or equal to 0.30, or may be less than or equal to 0.40. The range of the ratio of the area of the hole overlap area 59 to the area of the first main hole 53A1 may be determined by a first group consisting of 0.02, 0.05, and 0.10 and/or a second group consisting of 0.20, 0.30, and 0.40. The range of the ratio of the area of the hole overlap area 59 to the area of the first main hole 53A1 may be determined by a combination of any one of the values in the first group and any one of the values in the second group. The range of the ratio of the hole overlap area 59 to the area of the first main hole 53A1 may be determined by a combination of any two of the values in the first group. The range of the ratio of the hole overlap area 59 to the area of the first main hole 53A1 may be determined by a combination of any two of the values in the second group. For example, the ratio of the area of the hole overlap area 59 to the area of the first main hole 53A1 may be greater than or equal to 0.02 and less than or equal to 0.40, may be greater than or equal to 0.02 and less than or equal to 0.30, may be greater than or equal to 0.02 and less than or equal to 0.20, may be greater than or equal to 0.02 and less than or equal to 0.10, may be greater than or equal to 0.02 and less than or equal to 0.05, may be greater than or equal to 0.05 and less than or equal to 0.40, may be greater than or equal to 0.05 and less than or equal to 0.30, may be greater than or equal to 0.05 and less than or equal to 0.20, may be greater than or equal to 0.05 and less than or equal to 0.10, may be greater than or equal to 0.10 and less than or equal to 0.40, may be greater than or equal to 0.10 and less than or equal to 0.30, may be greater than or equal to 0.10 and less than or equal to 0.20, may be greater than or equal to 0.20 and less than or equal to 0.40, may be greater than or equal to 0.20 and less than or equal to 0.30, or may be greater than or equal to 0.30 and less than or equal to 0.40.

The area of the hole overlap area 59 may be less than the area of the first sub-hole 53A2. The above-described range of the ratio of the area of the hole overlap area 59 to the area of the first main hole 53A1 may be adopted as the range of the ratio of the area of the hole overlap area 59 to the area of the first sub-hole 53A2.

The area of the hole overlap area 59 may be less than the area of the second main hole 53B1. The above-described range of the ratio of the area of the hole overlap area 59 to the area of the first main hole 53A1 may be adopted as the range of the ratio of the area of the hole overlap area 59 to the area of the second main hole 53B1.

The area of the hole overlap area 59 may be less than the area of the second sub-hole 53B2. The above-described range of the ratio of the area of the hole overlap area 59 to the area of the first main hole 53A1 may be adopted as the range of the ratio of the area of the hole overlap area 59 to the area of the second sub-hole 53B2.

The area of the hole overlap area 59 may be less than the area of the third main hole 53C1. The above-described range of the ratio of the area of the hole overlap area 59 to the area of the first main hole 53A1 may be adopted as the range of the ratio of the area of the hole overlap area 59 to the area of the third main hole 53C1.

The area of the hole overlap area 59 may be less than the area of the third sub-hole 53C2. The above-described range of the ratio of the area of the hole overlap area 59 to the area of the first main hole 53A1 may be adopted as the range of the ratio of the area of the hole overlap area 59 to the area of the third sub-hole 53C2.

As shown in FIG. 19, the through area 55A located in the second mask area M2 may include two or more through lines 55L arranged in the first mask direction D1. Each of the through lines 55L may extend in the second mask direction D2. For example, the through line 55L may have a third end and a fourth end connected to the through area 55A of the first mask area M1. The fourth end is located on the side opposite to the third end in the second mask direction D2.

The reference sign G17 indicates the gap between any adjacent two of the through lines 55L in the first mask direction D1. The reference sign W17 indicates the maximum of the size of the through line 55L in the first mask direction D1. The gap G17 may be determined with reference to the size W17.

The ratio of the gap G17 to the size W17, for example, may be greater than or equal to 0.2, may be greater than or equal to 0.4, or may be greater than or equal to 0.6. The ratio of the gap G17 to the size W17, for example, may be less than or equal to 1.0, may be less than or equal to 2.0, or may be less than or equal to 3.0. The range of the ratio of the gap G17 to the size W17 may be determined by a first group consisting of 0.2, 0.4, and 0.6 and/or a second group consisting of 1.0, 2.0, and 3.0. The range of the ratio of the gap G17 to the size W17 may be determined by a combination of any one of the values in the first group and any one of the values in the second group. The range of the ratio of the gap G17 to the size W17 may be determined by a combination of any two of the values in the first group. The range of the ratio of the gap G17 to the size W17 may be determined by a combination of any two of the values in the second group. For example, the ratio of the gap G17 to the size W17 may be greater than or equal to 0.2 and less than or equal to 3.0, may be greater than or equal to 0.2 and less than or equal to 2.0, may be greater than or equal to 0.2 and less than or equal to 1.0, may be greater than or equal to 0.2 and less than or equal to 0.6, may be greater than or equal to 0.2 and less than or equal to 0.4, may be greater than or equal to 0.4 and less than or equal to 3.0, may be greater than or equal to 0.4 and less than or equal to 2.0, may be greater than or equal to 0.4 and less than or equal to 1.0, may be greater than or equal to 0.4 and less than or equal to 0.6, may be greater than or equal to 0.6 and less than or equal to 3.0, may be greater than or equal to 0.6 and less than or equal to 2.0, may be greater than or equal to 0.6 and less than or equal to 1.0, may be greater than or equal to 1.0 and less than or equal to 3.0, may be greater than or equal to 1.0 and less than or equal to 2.0, or may be greater than or equal to 2.0 and less than or equal to 3.0.

The gap G17, for example, may be greater than or equal to 10 µm, may be greater than or equal to 50 µm, may be greater than or equal to 100 µm, or may be greater than or equal to 150 µm. The gap G17, for example, may be less than or equal to 200 µm, may be less than or equal to 250 µm, or may be less than or equal to 300 µm. The range of the gap G17 may be determined by a first group consisting of 10 µm, 50 µm, 100 µm, and 150 µm and/or a second group consisting of 200 µm, 250 µm, and 300 µm. The range of the gap G17 may be determined by a combination of any one of the values in the first group and any one of the values in the second group. The range of the gap G17 may be determined by a combination of any two of the values in the first group. The range of the gap G17 may be determined by a combination of any two of the values in the second group. For example, the gap G17 may be greater than or equal to 10 µm and less than or equal to 300 µm, may be greater than or equal to 10 µm and less than or equal to 250 µm, may be greater than or equal to 10 µm and less than or equal to 200 µm, may be greater than or equal to 10 µm and less than or equal to 150 µm, may be greater than or equal to 10 µm and less than or equal to 100 µm, may be greater than or equal to 10 µm and less than or equal to 50 µm, may be greater than or equal to 50 µm and less than or equal to 300 µm, may be greater than or equal to 50 µm and less than or equal to 250 µm, may be greater than or equal to 50 µm and less than or equal to 200 µm, may be greater than or equal to 50 µm and less than or equal to 150 µm, may be greater than or equal to 50 µm and less than or equal to 100 µm, may be greater than or equal to 100 µm and less than or equal to 300 µm, may be greater than or equal to 100 µm and less than or equal to 250 µm, may be greater than or equal to 100 µm and less than or equal to 200 µm, may be greater than or equal to 100 µm and less than or equal to 150 µm, may be greater than or equal to 150 µm and less than or equal to 300 µm, may be greater than or equal to 150 µm and less than or equal to 250 µm, may be greater than or equal to 150 µm and less than or equal to 200 µm, may be greater than or equal to 200 µm and less than or equal to 300 µm, may be greater than or equal to 200 µm and less than or equal to 250 µm, or may be greater than or equal to 250 µm and less than or equal to 300 µm.

Preferably, the gap G17 is not constant. For example, the gap G17 may vary according to a location in the first mask direction D1 or the second mask direction D2. Thus, the gap G11 between two electrode lines 140L of the organic device 100 can be varied according to a location.

As shown in FIG. 19, each of the through lines 55L may include two or more through sections 56 arranged in the second mask direction D2. Each of the through sections 56 may overlap the organic layer 130 in the vapor deposition process. For example, one through section 56 may overlap one organic layer 130. Any adjacent two of the through sections 56 in the second mask direction D2 may be connected to each other.

The through sections 56 may include a first through section 56A and a second through section 56B. The first through section 56A may have a first shape. The second through section 56B may have a second shape different from the first shape. In other words, the shape of the second through section 56B may be different from the shape of the first through section 56A. Since the through sections 56 include the first through section 56A and the second through section 56B having mutually different shapes, it is possible to avoid a configuration in which a gap G17 is constant regardless of a location. The shape of the through section 56 is also referred to as through shape.

The through sections 56 may include a first mask connection 562A and a second mask connection 562B. The first mask connection 562A means a combination of the first through section 56A and the second through section 56B that are connected in the second mask direction G2. The second mask connection 562B means a combination of the two first through sections 56A that are connected in the second mask direction D2.

The through sections 56 may include first mask arrays 561A and second mask arrays 561B. The first mask array 561A means a combination of the first through section 56A and the second through section 56B that are arranged in the first mask direction D1. The second mask array 561B means a combination of the two first through sections 56A that are arranged in the first mask direction D1.

The through sections 56 may include the first mask arrays 561A, the second mask arrays 561B, and third mask arrays 561C. The third mask array 561C means a combination of the two second through sections 56B that are arranged in the first mask direction D1.

The first through section 56A and the second through section 56B may be disposed such that the gap G17 varies irregularly. For example, the first through section 56A and the second through section 56B may be disposed in accordance with a Fibonacci word.

A specific difference between a first through shape and a second through shape is selected. For example, the area of the second through shape may be different from the area of the first through shape. For example, the size of the second through shape in the first mask direction D1 or the second mask direction D2 may be different from the size of the first through shape in the first mask direction D1 or the second mask direction D2. For example, the location of an end of the second through shape in the first mask direction D1 or the second mask direction D2 may be different from the location of an end of the first through shape in the first mask direction D1 or the second mask direction D2.

Figure 20:
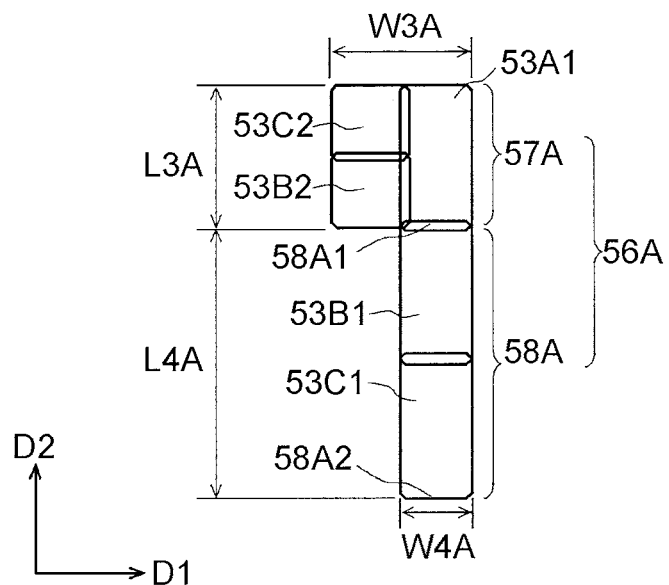
FIG. 20 is a plan view of an example of a first through section of the mask stack.
Figure 21:
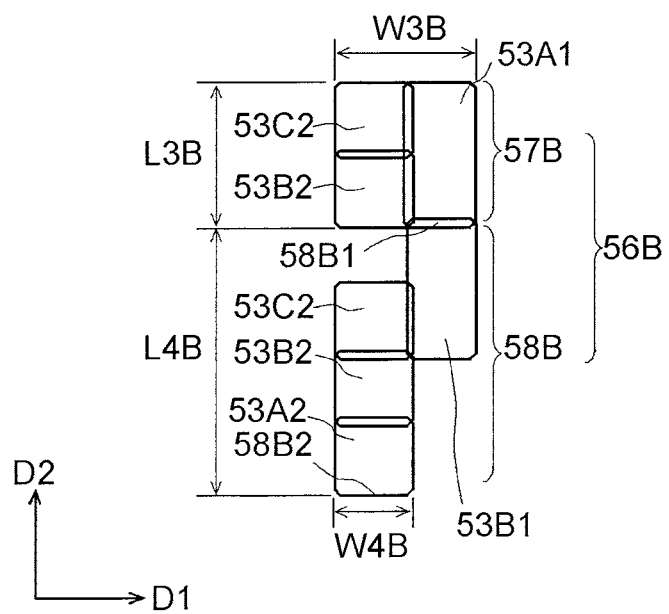
FIG. 21 is a plan view of an example of a second through section of the mask stack.

A specific example of the shape of the first through section 56A and the shape of the second through section 56B will be described with reference to FIGS. 20 and 21. FIG. 20 is a plan view of an example of the first through section 56A. FIG. 21 is a plan view of an example of the second through section 56B. The first electrode section 141A shown in FIG. 4 may be formed by a vapor deposition material having passed through the first through section 56A. The second electrode section 141B shown in FIG. 5 may be formed by a vapor deposition material having passed through the second through section 56B.

As shown in FIG. 20, the first through section 56A may include a first main section 57A and a first sub-section 58A. The first main section 57A may overlap the organic layer 130 in plan view in the vapor deposition process. The first sub-section 58A may be connected to the first main section 57A. The first sub-section 58A may have a fifth connection end 58A1 and a sixth connection end 58A2. The fifth connection end 58A1 is connected to the first main section 57A. The sixth connection end 58A2 is located on the side opposite to the fifth connection end 58A1 in the second mask direction D2.

As shown in FIG. 21, the second through section 56B may include a second main section 57B and a second sub-section 58B. The second main section 57B may overlap the organic layer 130 in plan view in the vapor deposition process. The second sub-section 58B may be connected to the second main section 57B. The second sub-section 58B may have a seventh connection end 58B1 and an eighth connection end 58B2. The seventh connection end 58B1 is connected to the second main section 57B. The eighth connection end 58B2 is located on the side opposite to the seventh connection end 58B1 in the second mask direction D2.

The shape of the first sub-section 58A may be different from the shape of the second sub-section 58B. For example, the area of the first sub-section 58A may be different from the area of the second sub-section 58B. In the example shown in FIGS. 20 and 21, the area of the first sub-section 58A is less than the area of the second sub-section 58B. For example, the average of the size W4A of the first sub-section 58A in the first mask direction D1 may be different from the average of the size W4B of the second connection section 143B in the first mask direction D1. In the examples shown in FIGS. 20 and 21, the average of the size W4A is less than the average of the size W4B. For example, the location of the sixth connection end 58A2 in the first mask direction D1 may be different from the location of the eighth connection end 58B2 in the first mask direction D1. The "location" may mean a relative location with respect to the organic layer 130 that overlaps the through section 56 in the vapor deposition process. In the example shown in FIG. 20, the location of the fifth connection end 58A1 in the first mask direction D1 is the same as the location of the sixth connection end 58A2 in the first mask direction D1. In the example shown in FIG. 21, the location of the seventh connection end 58B1 in the first mask direction D1 is different from the location of the eighth connection end 58B2 in the first mask direction D1. As shown in FIGS. 20 and 21, the location of the fifth connection end 58A1 in the first mask direction D1 is the same as the location of the seventh connection end 58B1 in the first mask direction D1. On the other hand, the location of the sixth connection end 58A2 in the first mask direction D1 is different from the location of the eighth connection end 58B2 in the first mask direction D1. The phrase "the location is the same" means that the difference in location between the midpoints of two connection ends in the first mask direction D1 is less than or equal to (Size W17)/4. The phrase "the location is different" means that the difference in location between the midpoints of two connection ends in the first element direction G1 is greater than (Size W17)/4.

The average of the size W4A of the first sub-section 58A in the first mask direction D1 may be less than the average of the size W3A of the first main section 57A in the first mask direction D1. The ratio of the average of the size W4A to the average of the size W3A, for example, may be greater than or equal to 0.1, may be greater than or equal to 0.2, or may be greater than or equal to 0.3. The ratio of the average of the size W4A to the average of the size W3A, for example, may be less than or equal to 0.7, may be less than or equal to 0.8, or may be less than or equal to 0.9. The range of the ratio of the average of the size W4A to the average of the size W3A may be determined by a first group consisting of 0.1, 0.2, and 0.3 and/or a second group consisting of 0.7, 0.8, and 0.9. The range of the ratio of the average of the size W4A to the average of the size W3A may be determined by a combination of any one of the values in the first group and any one of the values in the second group. The range of the ratio of the average of the size W4A to the average of the size W3A may be determined by a combination of any two of the values in the first group. The range of the ratio of the average of the size W4A to the average of the size W3A may be determined by a combination of any two of the values in the second group. For example, the ratio of the average of the size W4A to the average of the size W3A may be greater than or equal to 0.1 and less than or equal to 0.9, may be greater than or equal to 0.1 and less than or equal to 0.8, may be greater than or equal to 0.1 and less than or equal to 0.7, may be greater than or equal to 0.1 and less than or equal to 0.3, may be greater than or equal to 0.1 and less than or equal to 0.2, may be greater than or equal to 0.2 and less than or equal to 0.9, may be greater than or equal to 0.2 and less than or equal to 0.8, may be greater than or equal to 0.2 and less than or equal to 0.7, may be greater than or equal to 0.2 and less than or equal to 0.3, may be greater than or equal to 0.3 and less than or equal to 0.9, may be greater than or equal to 0.3 and less than or equal to 0.8, may be greater than or equal to 0.3 and less than or equal to 0.7, may be greater than or equal to 0.7 and less than or equal to 0.9, may be greater than or equal to 0.7 and less than or equal to 0.8, or may be greater than or equal to 0.8 and less than or equal to 0.9.

The size L4A of the first sub-section 58A in the second mask direction D2 may be determined according to the size L3A of the first main section 57A in the second mask direction D2. The ratio of the size L4A to the size L3A, for example, may be greater than or equal to 0.2, may be greater than or equal to 0.6, or may be greater than or equal to 0.9. The ratio of the size L4A to the size L3A, for example, may be less than or equal to 2.0, may be less than or equal to 2.5, or may be less than or equal to 3.0. The range of the ratio of the size L4A to the size L3A may be determined by a first group consisting of 0.2, 0.6, and 0.9 and/or a second group consisting of 2.0, 2.5, and 3.0. The range of the ratio of the size L4A to the size L3A may be determined by a combination of any one of the values in the first group and any one of the values in the second group. The range of the ratio of the size L4A to the size L3A may be determined by a combination of any two of the values in the first group. The range of the ratio of the size L4A to the size L3A may be determined by a combination of any two of the values in the second group. For example, the ratio of the size L4A to the size L3A may be greater than or equal to 0.2 and less than or equal to 3.0, may be greater than or equal to 0.2 and less than or equal to 2.5, may be greater than or equal to 0.2 and less than or equal to 2.0, may be greater than or equal to 0.2 and less than or equal to 0.9, may be greater than or equal to 0.2 and less than or equal to 0.6, may be greater than or equal to 0.6 and less than or equal to 3.0, may be greater than or equal to 0.6 and less than or equal to 2.5, may be greater than or equal to 0.6 and less than or equal to 2.0, may be greater than or equal to 0.6 and less than or equal to 0.9, may be greater than or equal to 0.9 and less than or equal to 3.0, may be greater than or equal to 0.9 and less than or equal to 2.5, may be greater than or equal to 0.9 and less than or equal to 2.0, may be greater than or equal to 2.0 and less than or equal to 3.0, may be greater than or equal to 2.0 and less than or equal to 2.5, or may be greater than or equal to 2.5 and less than or equal to 3.0. The ratio is, for example, the ratio of the maximum of the size L4A to the maximum of the size L3A.

The average of the size W4B of the second sub-section 58B in the first mask direction D1 may be less than the average of the size W3B of the second main section 57B in the first mask direction D1. The above-described range of the ratio of the average of the size W4A to the average of the size W3A may be adopted as the range of the ratio of the average of the size W4B to the average of the size W3B.

The size L4B of the second sub-section 58B in the second mask direction D2 may be determined according to the size L3B of the second main section 57B in the second mask direction D2. The above-described range of the ratio of the size L4A to the size L3A may be adopted as the range of the ratio of the size L4B to the size L3B.

As shown in FIG. 20, the first through section 56A may include the first main hole 53A1, the second main hole 53B1, the third main hole 53C1, the second sub-hole 53B2, and the third sub-hole 53C2. The second main hole 53B1 may be located between the first main hole 53A1 and the third main hole 53C1 in the second mask direction D2. The second main hole 53B1 may be connected to the first main hole 53A1 and the third main hole 53C1 in the second mask direction D2. The second sub-hole 53B2 and the third sub-hole 53C2 may be connected to the first main hole 53A1 in the first mask direction D1. The second sub-hole 53B2 may be connected to the third sub-hole 53C2 in the second mask direction D2.

The second through section 56B may include the first main hole 53A1, the second main hole 53B1, the first sub-hole 53A2, the two second sub-holes 53B2, and the two third sub-holes 53C2. The second main hole 53B1 may be connected to the first main hole 53A1 in the second mask direction D2. A first one of the second sub-holes 53B2 and a first one of the third sub-holes 53C2 may be connected to the first main hole 53A1 in the first mask direction D1. The first one of the second sub-holes 53B2 may be connected to the first one of the third sub-holes 53C2 in the second mask direction D2. A second one of the third sub-holes 53C2 may be connected to the second main hole 53B1 in the first mask direction D1. A second one of the second sub-holes 53B2 may be connected to the second one of the third sub-holes 53C2 in the second mask direction D2. The first sub-hole 53A2 may be connected to the second one of the second sub-holes 53B2 in the second mask direction D2.

In the first mask area M1, the first main hole 53A1, the second main hole 53B1, and the third main hole 53C1 may be repeatedly arranged in the second mask direction D2. In the first display area 101, the third sub-hole 53C2, the second sub-hole 53B2, and the first sub-hole 53A2 may be repeatedly arranged in the second mask direction D2. An array of the first main hole 53A1, the second main hole 53B1, and the third main hole 53C1 and an array of the third sub-hole 53C2, the second sub-hole 53B2, and the first sub-hole 53A2 may be connected in the first mask direction D1.

Next, an example of the method of manufacturing the organic device 100 will be described.

Initially, the substrate 110 on which the first electrodes 120 are formed is prepared. The first electrodes 120 are formed by, for example, forming a conductive layer that makes up the first electrodes 120 on the substrate 110 by sputtering or the like and then patterning the conductive layer by photolithography or the like. The insulating layer 160 located between any adjacent two of the first electrodes 120 in plan view may be formed on the substrate 110.

Subsequently, as shown in FIG. 7, the organic layers 130 that include the first organic layers 130A, the second organic layers 130B, and the third organic layers 130C are formed on the first electrodes 120. The first organic layers 130A may be formed by, for example, vapor deposition using a mask having through-holes corresponding to the first organic layers 130A. For example, the first organic layers 130A are able to be formed by depositing an organic material or the like on the first electrodes 120 corresponding to the first organic layers 130A via the mask. The second organic layers 130B may also be formed by, for example, vapor deposition using a mask having through-holes corresponding to the second organic layers 130B. The third organic layers 130C may also be formed by, for example, vapor deposition using a mask having through-holes corresponding to the third organic layers 130C.

Subsequently, a second electrode forming process may be carried out. In the second electrode forming process, the second electrode 140 is formed on the organic layers 130 by using the above-described mask group. Initially, a process of forming the first layers 140A of the second electrode 140 by vapor deposition using the first mask 50A may be performed. For example, a conductive material or the like, such as a metal, is deposited on the organic layers 130 and the like via the first mask 50A. Thus, the first layers 140A are formed. Subsequently, a process of forming the second layers 140B of the second electrode 140 by vapor deposition using the second mask 50B may be performed. For example, a conductive material or the like, such as a metal, is deposited on the organic layers 130 and the like via the second mask 50B. Thus, the second layers 140B are formed. Subsequently, a process of forming the third layers 140C of the second electrode 140 by vapor deposition using the third mask 50C may be performed. For example, a conductive material or the like, such as a metal, is deposited on the organic layers 130 and the like via the third mask 50C. Thus, the third layers 140C are formed. In this way, as shown in FIG. 6, the second electrode 140 that includes the first layers 140A, the second layers 140B, and the third layers 140C is formed.

The order in which the first layers 140A, the second layers 140B, and the third layers 140C are formed is not limited. For example, a vapor deposition process may be performed in order of the third layers 140C, the second layers 140B, and the first layers 140A.

The advantageous effects of the embodiment of the present disclosure will be summarized.

When the second display area 102 of the organic device 100 includes the transmission areas 104, light having reached the organic device 100 is able to pass through the transmission areas 104 and reach an optical component or the like on the back side of the substrate. Therefore, the second display area 102 is able to detect light and display a video. Therefore, the function of the sensor, such as a camera and a fingerprint sensor, can be implemented in the second display area 102.

When the gap G11 between two electrode lines 140L is not constant, it is possible to reduce constructive interference between light waves diffracted at the time of passing through the transmission areas 104. Therefore, it is possible to reduce entry of high-intensity diffracted light into the sensor. Thus, for example, it is possible to reduce blurring of an image generated by the sensor.

Figure 22:
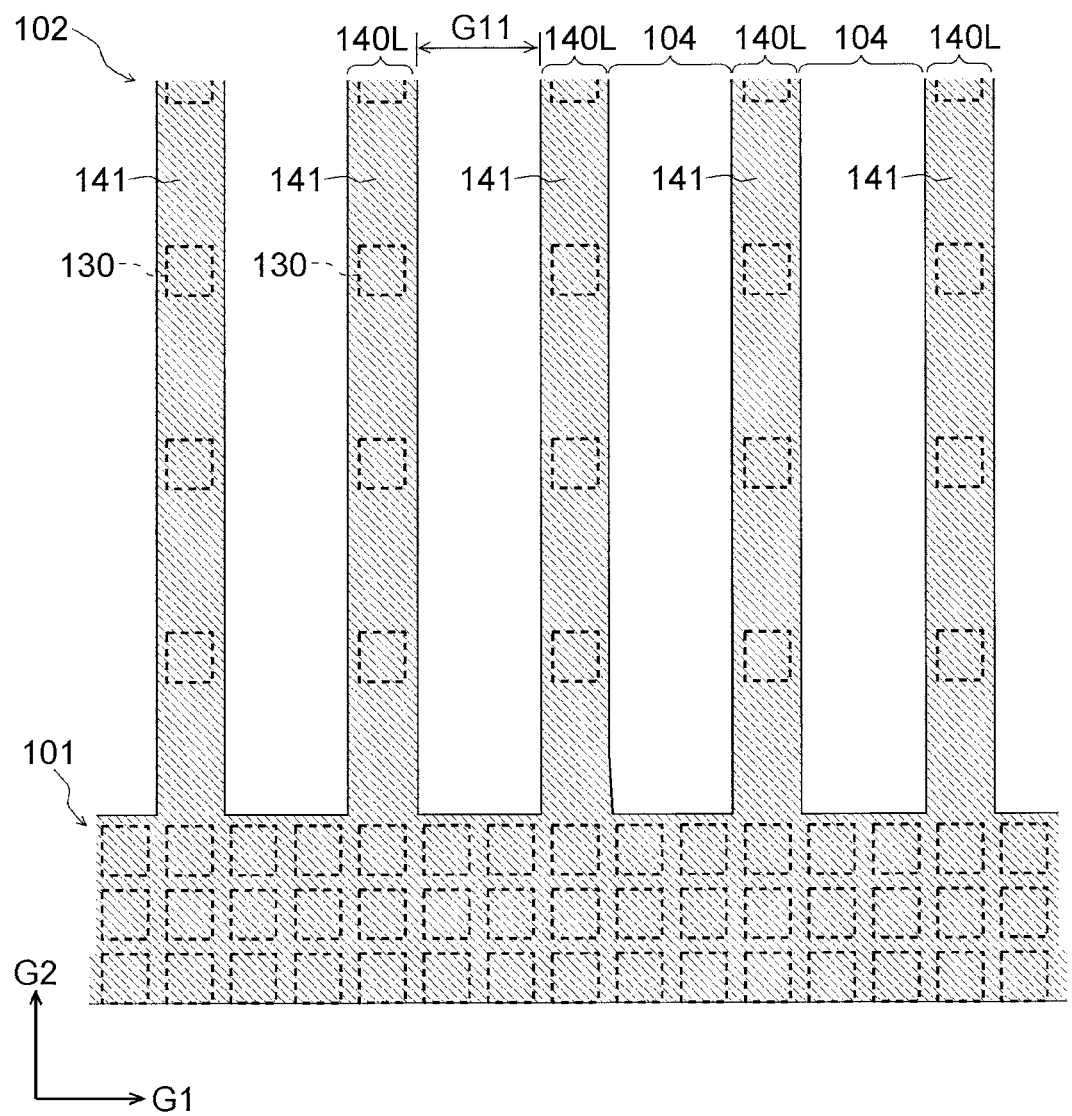
FIG. 22 is a plan view of an example of a second display area according to a reference embodiment.

FIG. 22 is an enlarged plan view of an example of the second display area 102 according to a reference embodiment. In the example shown in FIG. 22, the gap G11 between two electrode lines 140L is constant. In this case, light waves diffracted at the time of passing through the transmission areas 104 can reinforce each other in a specific direction. Therefore, an image generated by the sensor provided in the second display area 102 can be blurred.

In contrast, according to the example of FIG. 3, since the gap G11 is not constant, it is possible to reduces constructive interference between light waves diffracted at the time of passing through the transmission areas 104. Therefore, it is possible to reduce entry of high-intensity diffracted light into the sensor. Thus, for example, it is possible to reduce blurring of an image generated by the sensor.

Various modifications may be applied to the above-described embodiment. Hereinafter, other embodiments will be described with reference to the attached drawings as needed. In the following description and the drawings used in the following description, like reference signs to the reference signs used for corresponding portions in the above-described embodiment are used for portions that can be similarly configured to those of the above-described embodiment, and the description thereof will not be repeated. When the operation and advantageous effects obtained in the above-described embodiment are also apparently obtained in the other embodiments, the description thereof may be omitted.

Figure 23:
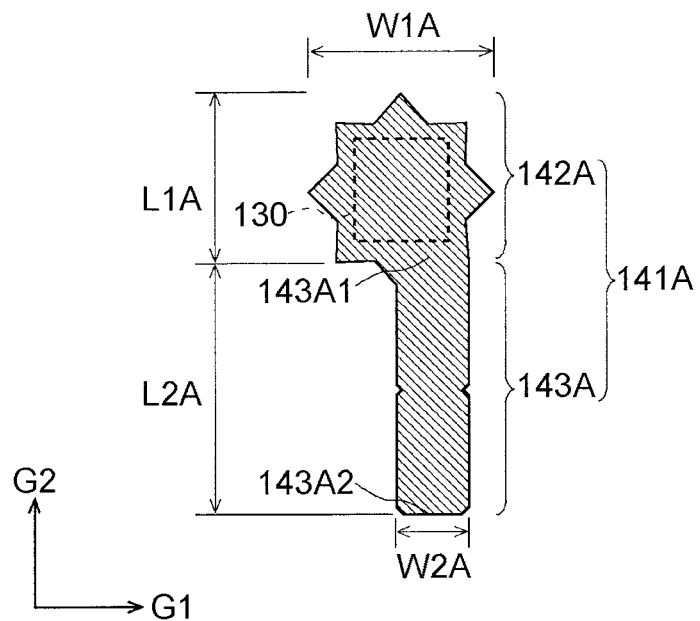
FIG. 23 is a plan view of an example of a first electrode section.
Figure 24:
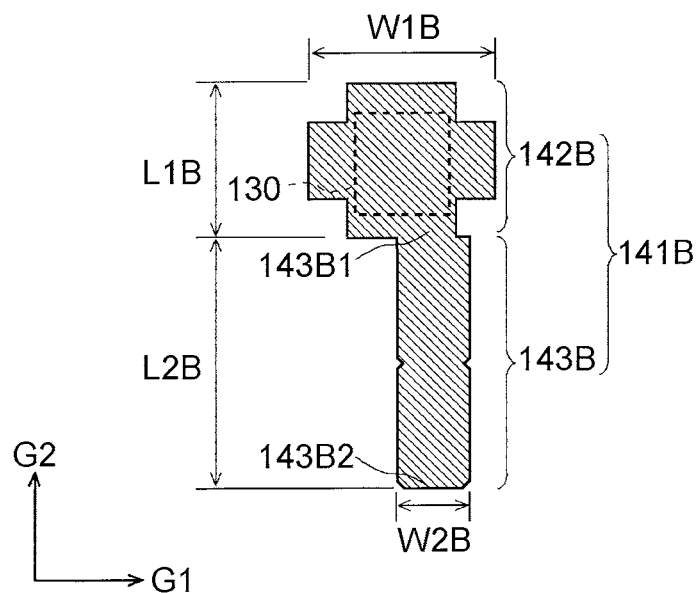
FIG. 24 is a plan view of an example of a second electrode section.

FIG. 23 is a plan view of an example of the first electrode section 141A. FIG. 24 is a plan view of an example of the second electrode section 141B. As shown in FIGS. 23 and 24, the shape of the first pixel section 142A may be different from the shape of the second pixel section 142B. For example, the area of the first pixel section 142A may be different from the area of the second pixel section 142B. For example, the average of the size W1A of the first pixel section 142A in the first element direction G1 may be different from the average of the size W1B of the second pixel section 142B in the first element direction G1.

Figure 25:
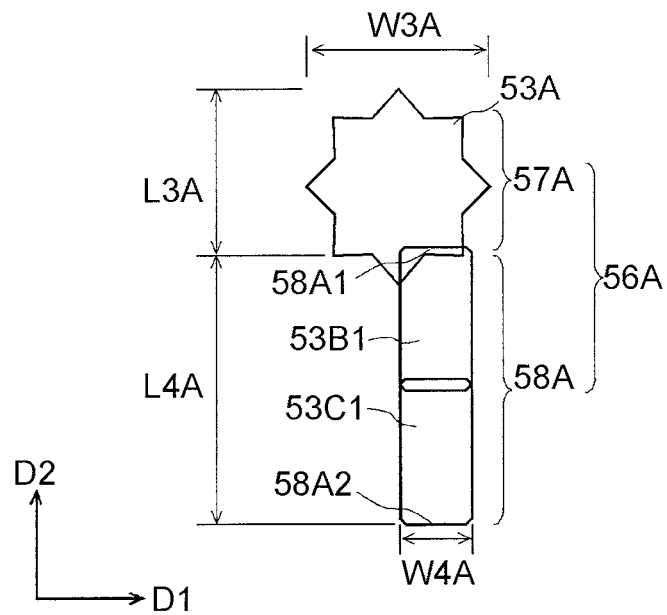
FIG. 25 is a plan view of an example of a first through section.
Figure 26:
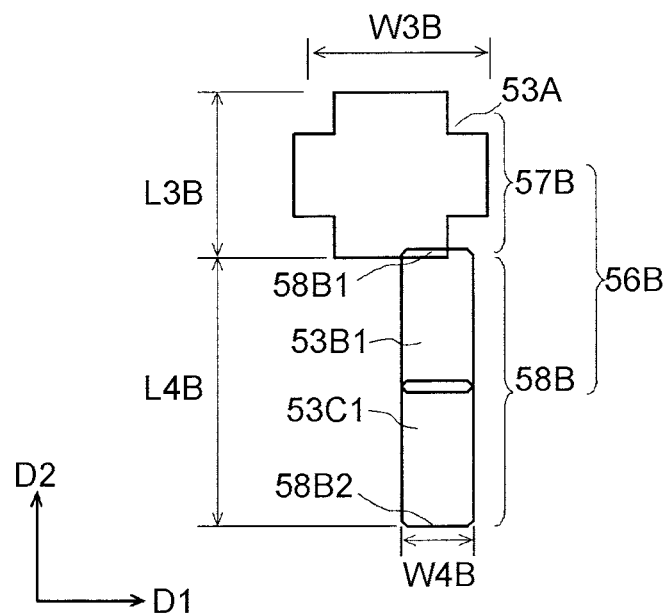
FIG. 26 is a plan view of an example of a second through section.

FIG. 25 is a plan view of an example of the first through section 56A. FIG. 26 is a plan view of an example of the second through section 56B. The first electrode section 141A shown in FIG. 23 may be formed by a vapor deposition material having passed through the first through section 56A. The second electrode section 141B shown in FIG. 24 may be formed by a vapor deposition material having passed through the second through section 56B.

As shown in FIGS. 25 and 26, the shape of the first main section 57A may be different from the shape of the second main section 57B. For example, the area of the first main section 57A may be different from the area of the second main section 57B. For example, the average of the size W3A of the first main section 57A in the first mask direction D1 may be different from the average of the size W3B of the second main section 57B in the first mask direction D1.

In the examples shown in FIGS. 23 to 26 as well, the gap G11 between two electrode lines 140L can be varied according to a location. Therefore, it is possible to reduce constructive interference between light waves diffracted at the time of passing through the transmission areas 104. Therefore, it is possible to reduce entry of high-intensity diffracted light into the sensor. Thus, for example, it is possible to reduce blurring of an image generated by the sensor.

Figure 27:
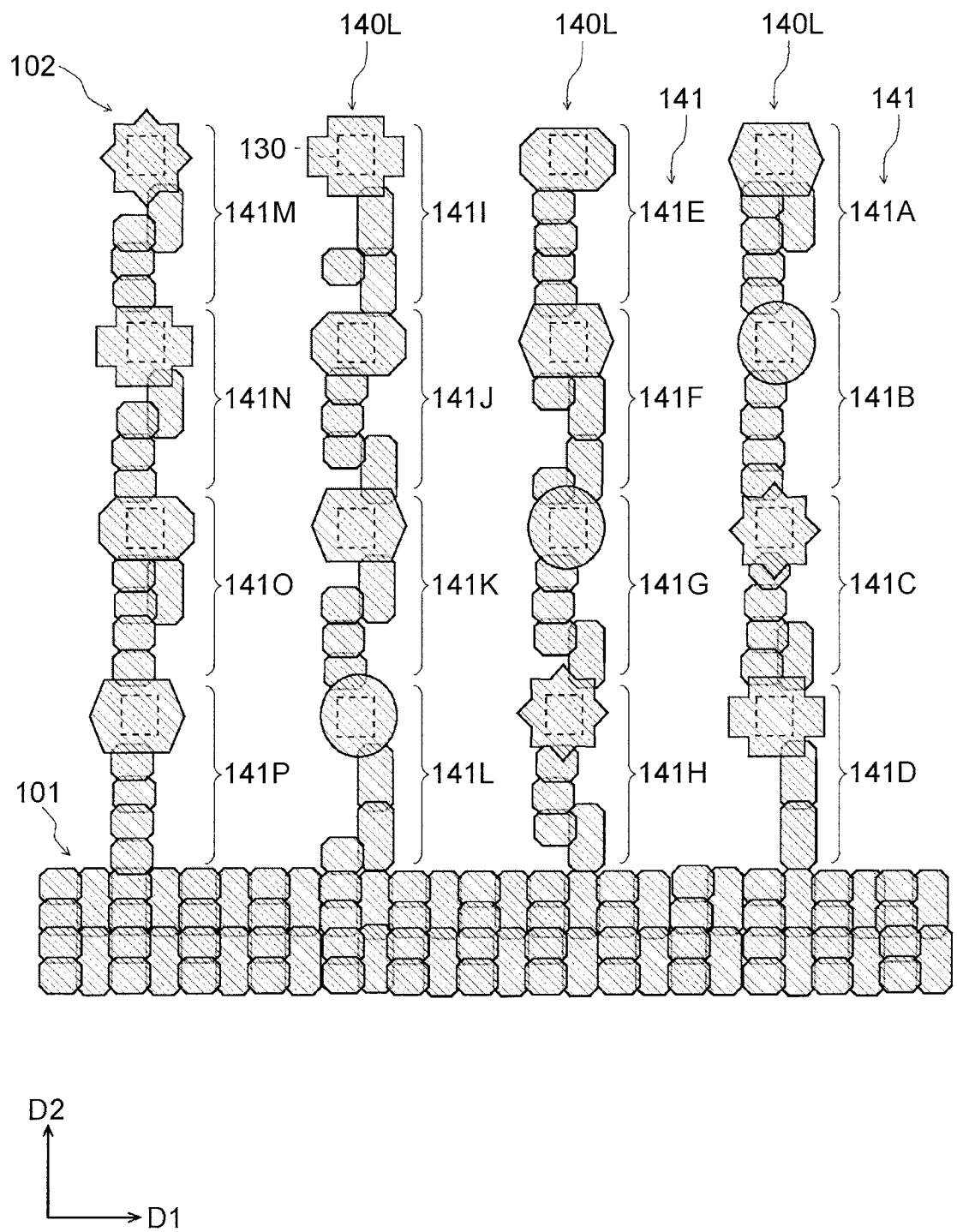
FIG. 27 is a plan view of an example of the second electrode in the second display area.

FIG. 27 is a plan view of an example of the electrode lines 140L in the second display area 102. The electrode sections 141 of each of the electrode lines 140L may have three or more shapes. For example, the electrode sections 141 may include a third electrode section 141C in addition to the first electrode section 141A and the second electrode section 141B. The shape of the third electrode section 141C is different from the shape of the first electrode section 141A and is also different from the shape of the second electrode section 141B. In this case, the through sections 56 may include a third through section in addition to the first through section 56A and the second through section 56B. The third through section corresponds to the third electrode section 141C. The third through section has a third through shape different from the first through shape and different from the second through shape.

The electrode sections 141 may include a fourth electrode section 141D. The shape of the fourth electrode section 141D is different from the shape of the first electrode section 141A, and is also different from the shape of the second electrode section 141B, and is also different from the shape of the third electrode section 141C. In this case, the through sections 56 may include a fourth through section in addition to the first through section 56A, the second through section 56B, and the third through section. The fourth through section corresponds to the fourth electrode section 141D. The fourth through section has a fourth through shape different from the first through shape, different from the second through shape, and different from the third through shape.

In the example shown in FIG. 27, the electrode sections 141 include the first electrode section 141A to a sixteenth electrode section 141P. The shapes of the first electrode section 141A to the sixteenth electrode section 141P may be different from one another.

Figure 28:
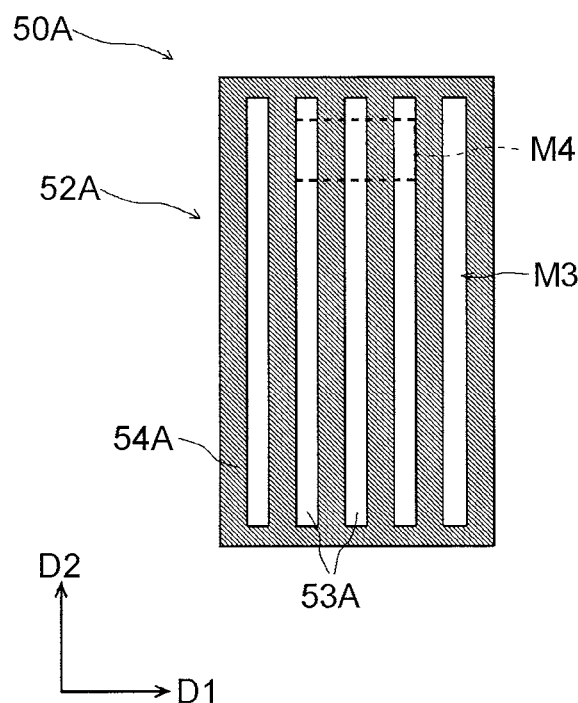
FIG. 28 is a plan view of an example of the first mask.
Figure 29:
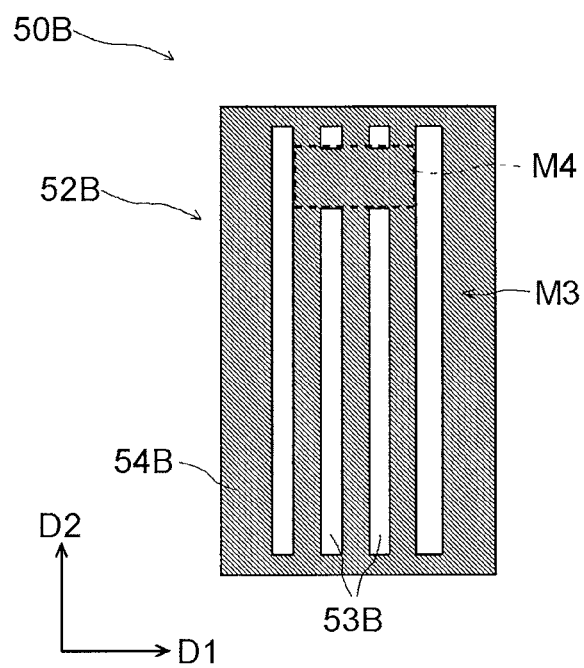
FIG. 29 is a plan view of an example of the second mask.

An example in which the second electrode 140 is formed by using two masks 50 will be described with reference to FIGS. 28 to 31. FIG. 28 is a plan view of an example of the first mask 50A. FIG. 29 is a plan view of an example of the second mask 50B.

As shown in FIG. 28, the third mask area M3 and the fourth mask area M4 of the first mask 50A may have two or more first through-holes 53A arranged in the first mask direction D1. The first through-holes 53A may extend in the second mask direction D2.

As shown in FIG. 29, the third mask area M3 and the fourth mask area M4 of the second mask 50B may have two or more second through-holes 53B arranged in the first mask direction D1. The second through-holes 53B may extend in the second mask direction D2. The fourth mask area M4 of the second mask 50B does not need to have the second through-hole 53B.

Although not shown in the drawing, in the mask stack 55 that includes the first mask 50A and the second mask 50B, each of the second through-holes 53B may be located between two first through-holes 53A arranged in the first mask direction D1. In the mask stack 55, each second through-hole 53B may be connected to two first through-holes 53A.

Figure 30:
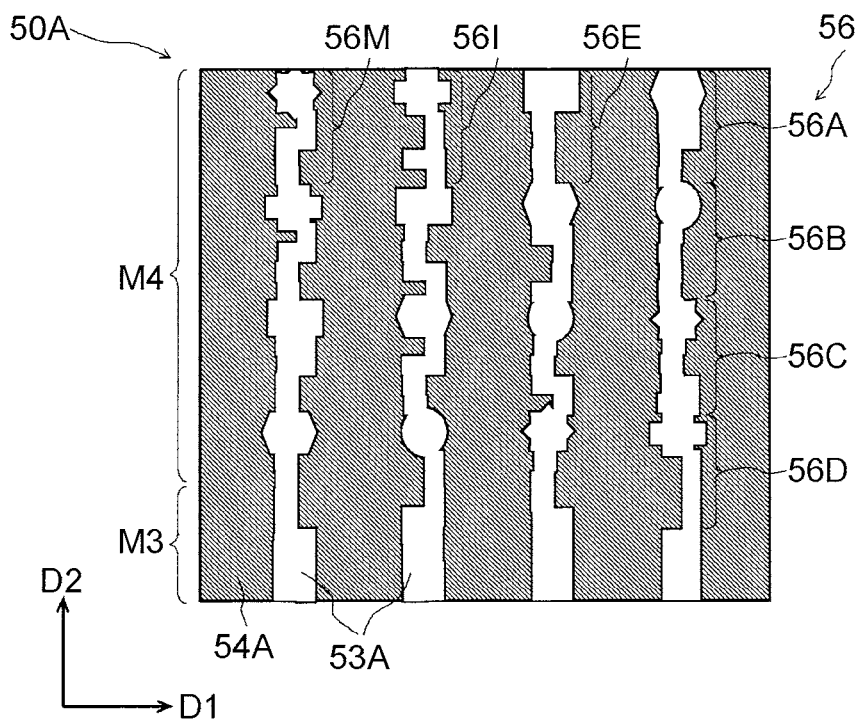
FIG. 30 is a plan view of an example of the first mask.

FIG. 30 is a plan view of an example of the third mask area M3 and the fourth mask area M4 of the first mask 50A. When the fourth mask area M4 of the second mask 50B does not have the second through-hole 53B, the first through-holes 53A of the fourth mask area M4 of the first mask 50A make up the through sections 56. The fourth mask area M4 may include two or more kinds of through sections 56 arranged in the second mask direction D2. For example, the fourth mask area M4 may include the first through section 56A, the second through section 56B, a third through section 56C, and a fourth through section 56D. Thus, the width of the first through-hole 53A in the first mask direction D1 can be varied according to a location. The two through sections 56 arranged in the second mask direction D2 may be connected in the second mask direction D2. In the third mask area M3, the size of the first through-hole 53A in the first mask direction D1 may be constant.

Figure 31:
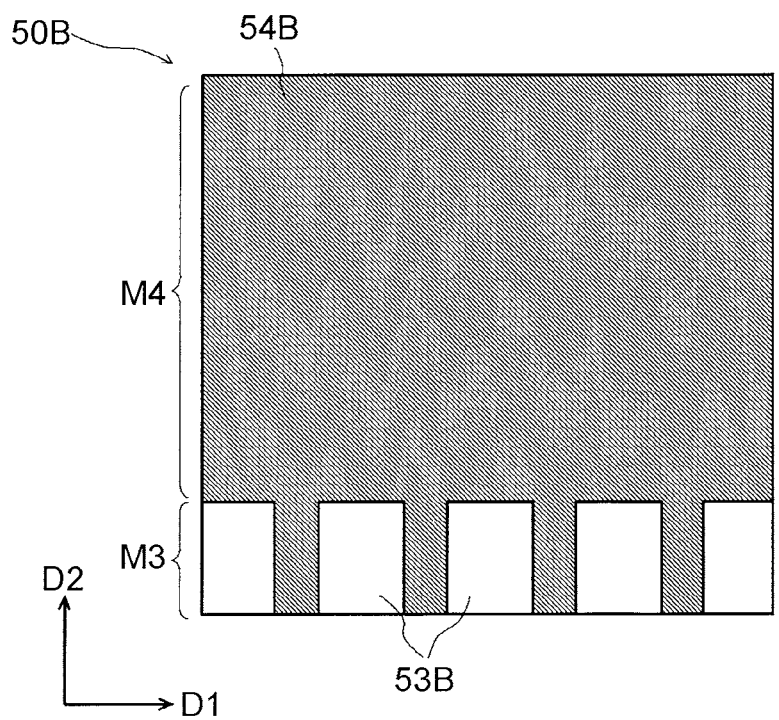
FIG. 31 is a plan view of an example of the second mask.

FIG. 31 is a plan view of an example of the third mask area M3 and the fourth mask area M4 of the second mask 50B. The fourth mask area M4 does not need to have the second through-hole 53B. In the third mask area M3, the size of the second through-hole 53B in the first mask direction D1 may be constant.

The gap G11 between two electrode lines 140L can be varied according to a location by forming the second electrode 140 using the first mask 50A and the second mask 50B shown in FIGS. 28 to 31. Therefore, it is possible to reduce constructive interference between light waves diffracted at the time of passing through the transmission areas 104. Therefore, it is possible to reduce entry of high-intensity diffracted light into the sensor. Thus, for example, it is possible to reduce blurring of an image generated by the sensor.

Figure 32:
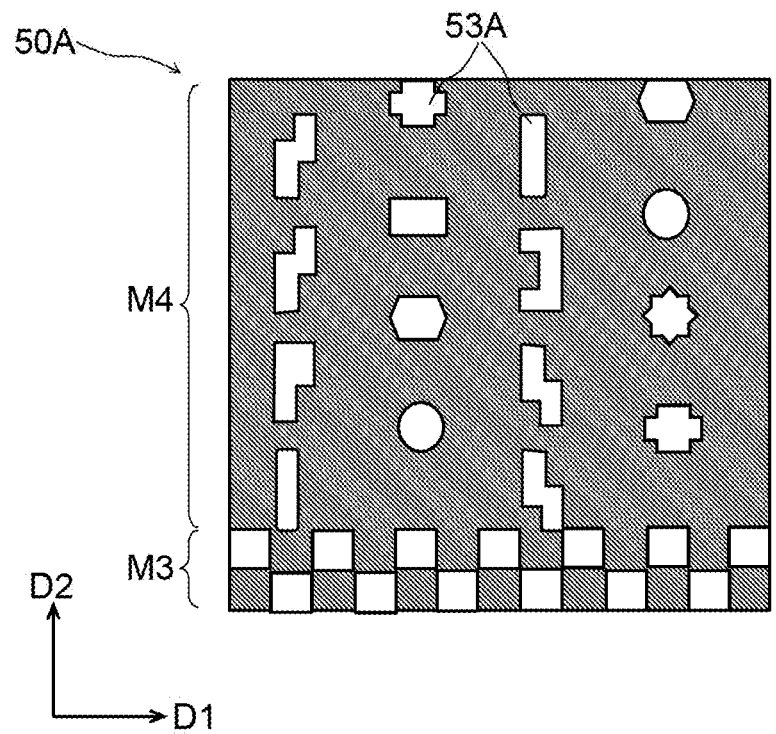
FIG. 32 is a plan view of an example of the first mask.
Figure 33:
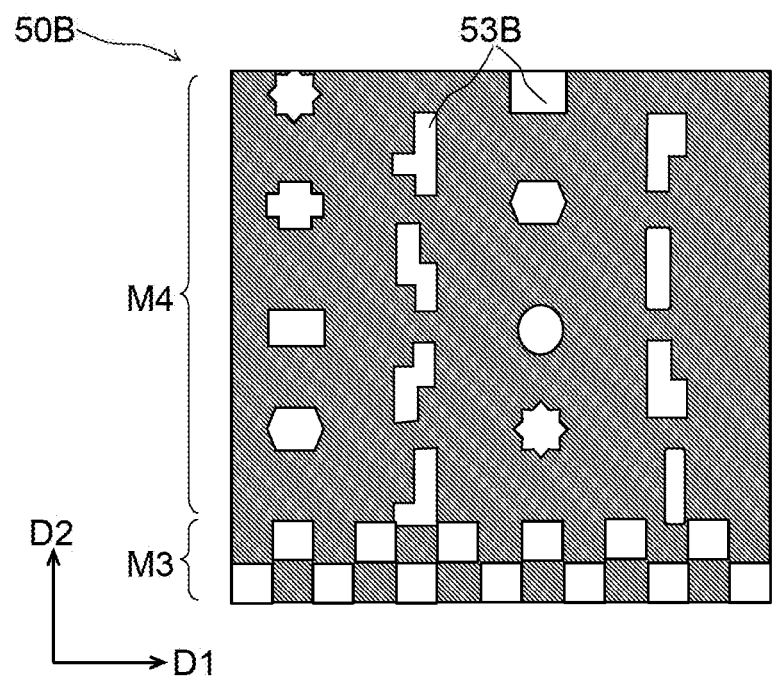
FIG. 33 is a plan view of an example of the second mask.

An example in which the second electrode 140 is formed by using two masks 50 will be described with reference to FIGS. 32 and 33. FIG. 32 is a plan view of an example of the first mask 50A. FIG. 33 is a plan view of an example of the second mask 50B.

As shown in FIG. 32, the third mask area M3 of the first mask 50A may have the plurality of first through-holes 53A. The arrangement of the first through-holes 53A may be a staggered arrangement. For example, a line connecting the centers of the first through-holes 53A may be zigzag. As shown in FIG. 33, the third mask area M3 of the second mask 50B may have the plurality of second through-holes 53B. The arrangement of the second through-holes 53B may be a staggered arrangement similar to the arrangement of the first through-holes 53A. For example, a line connecting the centers of the second through-holes 53B may be zigzag.

Although not shown in the drawing, in the mask stack 55 that includes the first mask 50A and the second mask 50B, each second through-hole 53B of the third mask area M3 may be located between two first through-holes 53A arranged in the first mask direction D1. Each of the second through-holes 53B of the third mask area M3 may be located between two first through-holes 53A arranged in the second mask direction D2. In the mask stack 55, one second through-hole 53B may be connected to four first through-holes 53A.

As shown in FIG. 32, the fourth mask area M4 of the first mask 50A may have two or more kinds of first through-holes 53A arranged in the second mask direction D2. Thus, the width of the first through-hole 53A in the first mask direction D1 can be varied according to a location. Similarly, as shown in FIG. 33, the fourth mask area M4 of the second mask 50B may have two or more kinds of second through-holes 53B arranged in the second mask direction D2. Thus, the width of the second through-hole 53B in the first mask direction D1 can be varied according to a location.

Although not shown in the drawing, in the mask stack 55 that includes the first mask 50A and the second mask 50B, each second through-hole 53B of the fourth mask area M4 may be located between two first through-holes 53A arranged in the second mask direction D2. In the mask stack 55, each second through-hole 53B may be connected to two first through-holes 53A.

Figure 34:
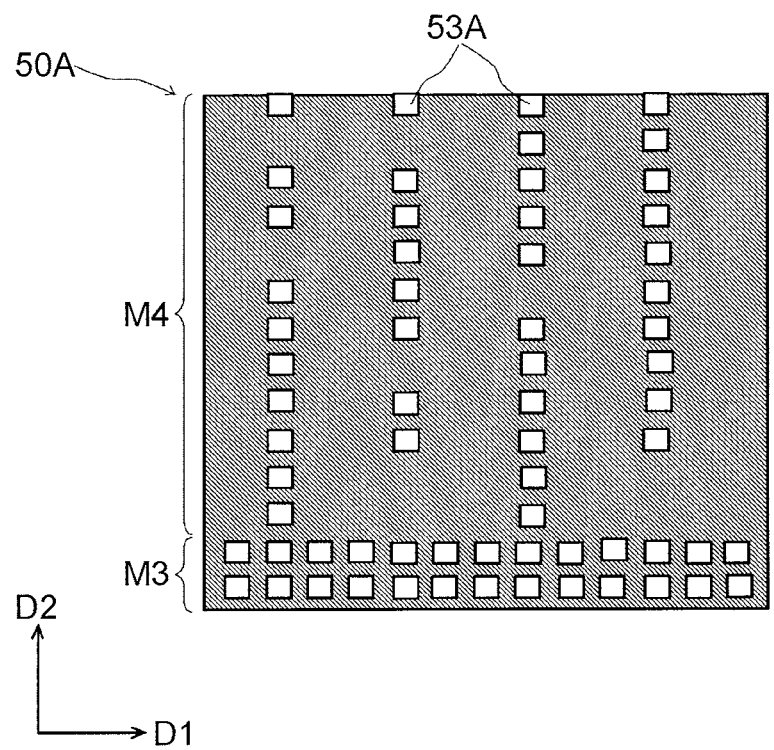
FIG. 34 is a plan view of an example of the first mask.
Figure 35:
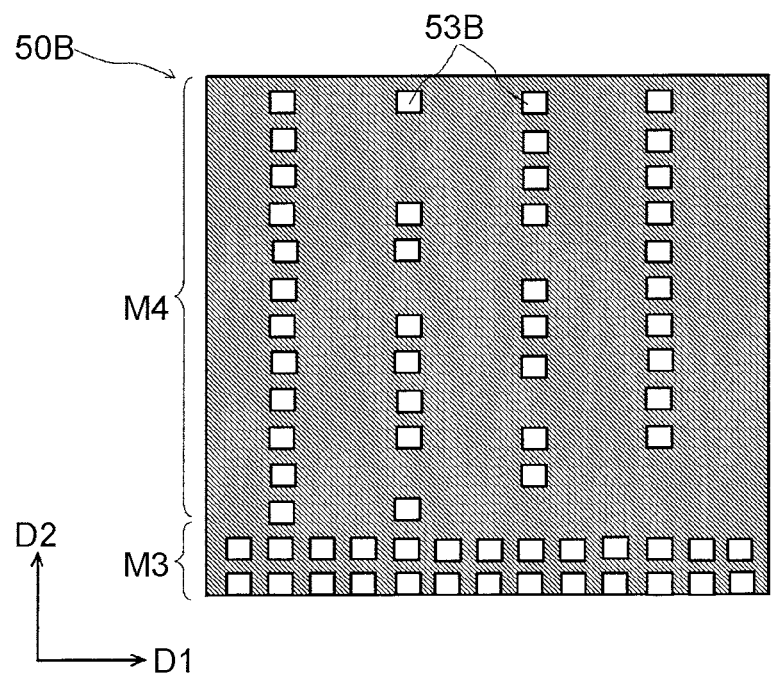
FIG. 35 is a plan view of an example of the second mask.
Figure 36:
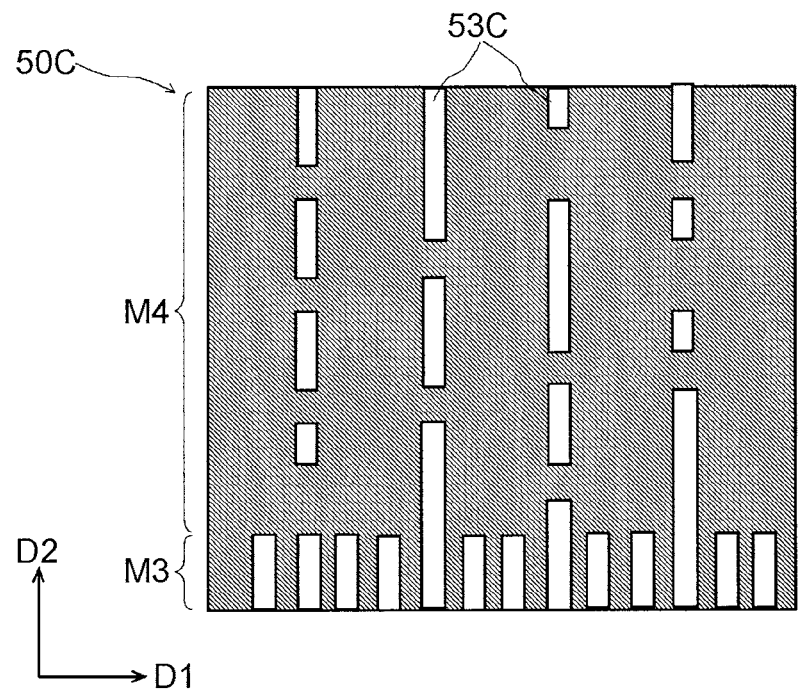
FIG. 36 is a plan view of an example of the third mask.
Figure 37:
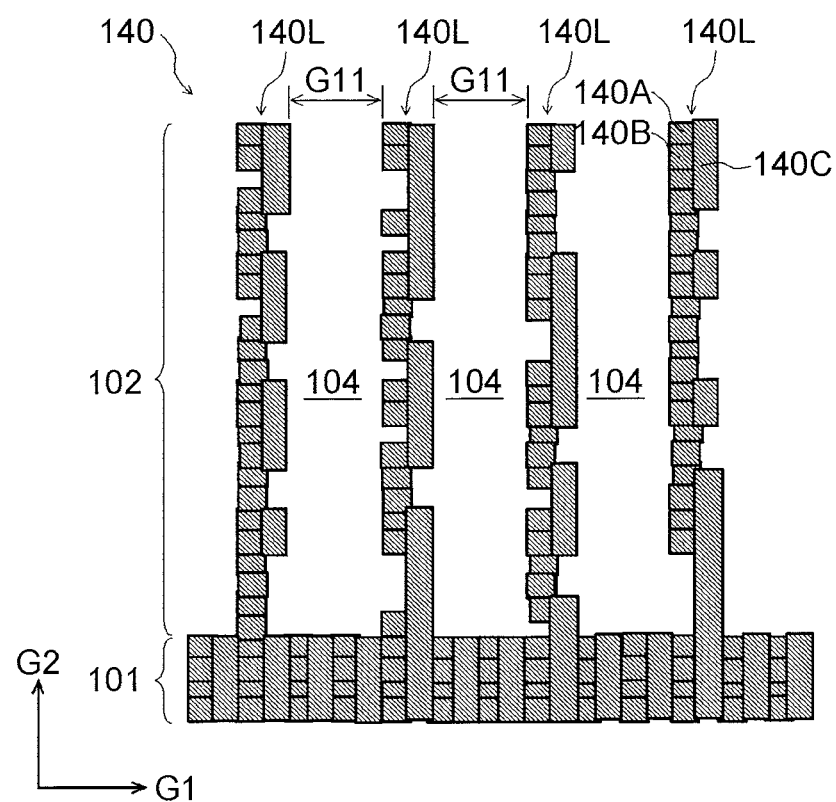
FIG. 37 is a plan view of an example of the second electrode in the second display area.

An example in which the second electrode 140 is formed by using three masks 50 will be described with reference to FIGS. 34 to 37. FIG. 34 is a plan view of an example of the first mask 50A. FIG. 35 is a plan view of an example of the second mask 50B. FIG. 36 is a plan view of an example of the third mask 50C. FIG. 37 is a plan view of an example of the second electrode 140. The second electrode 140 includes the first layers 140A, the second layers 140B, and the third layers 140C.

As shown in FIG. 34, the fourth mask area M4 of the first mask 50A may have the plurality of first through-holes 53A arranged irregularly in the second mask direction D2. As shown in FIG. 35, the fourth mask area M4 of the second mask 50B may have the plurality of second through-holes 53B arranged irregularly in the second mask direction D2. As shown in FIG. 36, the fourth mask area M4 of the third mask 50C may have the plurality of third through-holes 53C arranged irregularly in the second mask direction D2. Although not shown in the drawing, in the mask stack 55 that includes the first mask 50A, the second mask 50B, and the third mask 50C, each first through-hole 53A may be connected to the second through-hole 53B in the second mask direction D2. In the mask stack 55, the first through-hole 53A and the second through-hole 53B may be connected to the third through-hole 53C in the first mask direction D1.

FIG. 37 is a plan view of an example of the second electrode 140. The second electrode 140 includes the first layers 140A, the second layers 140B, and the third layers 140C. The first layers 140A are formed by using the first mask 50A shown in FIG. 34. The second layers 140B are formed by using the second mask 50B shown in FIG. 35. The third layers 140C are formed by using the third mask 50C shown in FIG. 36.

As shown in FIG. 37, the gap G11 may vary irregularly according to a location in the first element direction G1 or the second element direction G2. Thus, it is possible to reduce constructive interference between light waves diffracted at the time of passing through the transmission areas 104.

An example in which the electrode lines 140L are meandering will be described with reference to FIGS. 45 and 46.

Figure 45:
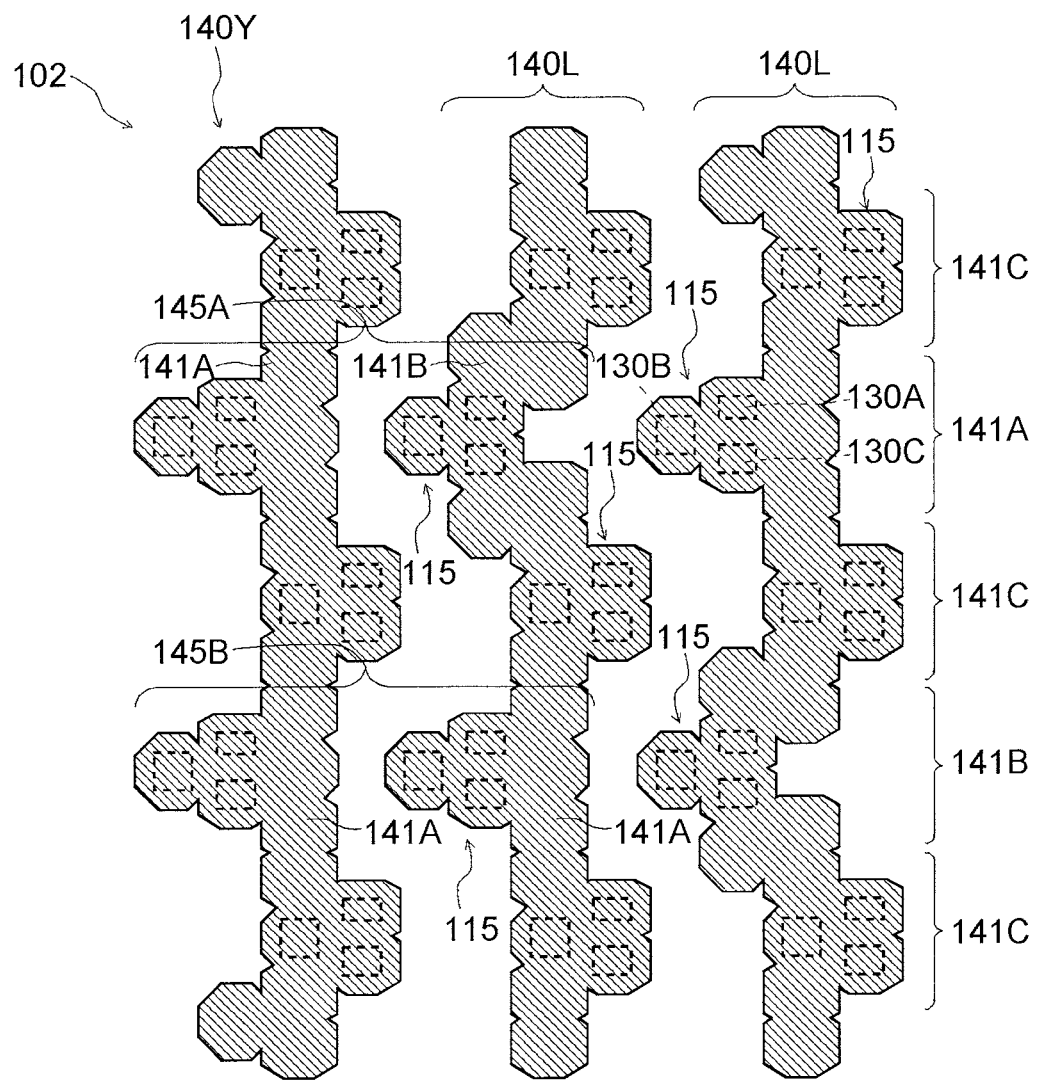
FIG. 45 is a plan view of an example of the second electrode in the second display area.
Figure 45:
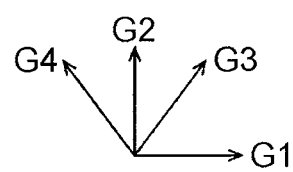

FIG. 45 is a plan view of an example of the second electrode 140Y in the second display area 102. The second electrode 140Y includes two or more electrode lines 140L arranged in the first element direction G1. Each of the electrode lines 140L may include the first electrode section 141A, the second electrode section 141B, and the third electrode section 141C.

The third electrode section 141C may be located between the first electrode section 141A and the second electrode section 141B in the second element direction G2. The third electrode section 141C may be connected to the first electrode section 141A and the second electrode section 141B. In other words, the first electrode section 141A and the second electrode section 141B may be electrically connected via the third electrode section 141C.

The third electrode section 141C may be located between the two first electrode sections 141A in the second element direction G2. The third electrode section 141C may be connected to the two first electrode sections 141A. In other words, the two first electrode sections 141A may be electrically connected via the third electrode section 141C.

The third electrode section 141C may be located between the two second electrode sections 141B in the second element direction G2. The third electrode section 141C may be connected to the two second electrode sections 141B. In other words, the two second electrode sections 141B may be electrically connected via the third electrode section 141C.

The first electrode section 141A, the second electrode section 141B, and the third electrode section 141C each may correspond to one element 115. One element 115 may include the first element 115A, the second element 115B, and the third element. When viewed in the second element direction G2, the element 115 corresponding to the first electrode section 141A and the element 115 corresponding to the second electrode section 141B may overlap each other. When viewed in the second element direction G2, the plurality of elements 115 respectively corresponding to the third electrode sections 141C may overlap each other. When viewed in the second element direction G2, the element 115 corresponding to the third electrode section 141C does not need to overlap the element 115 corresponding to the first electrode section 141A or the element 115 corresponding to the second electrode section 141B. For example, each of the electrode lines 140L may include the plurality of elements 115 arranged in a staggered manner.

Figure 46:
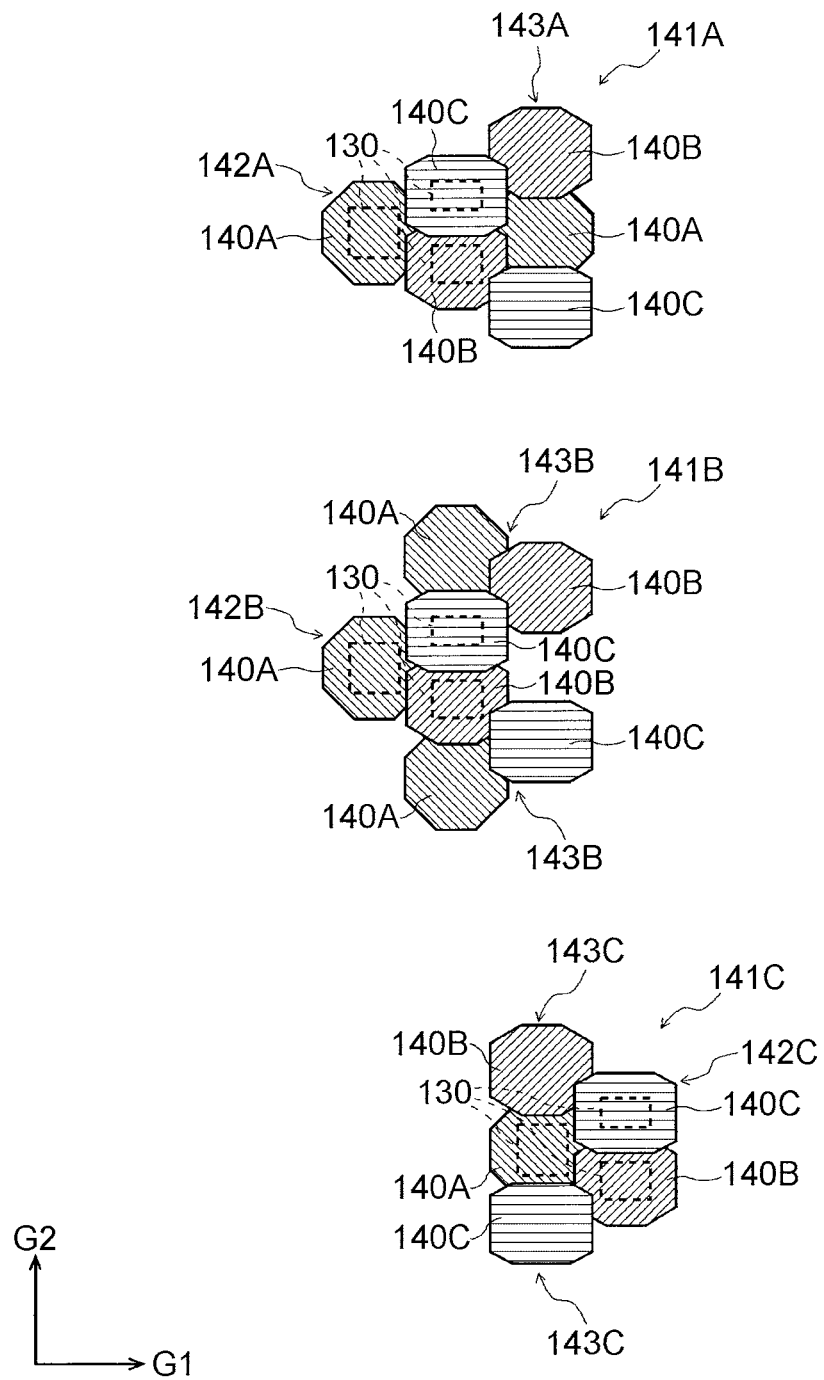
FIG. 46 is a plan view of an example of a first electrode section, a second electrode section, and a third electrode section of the second electrode.

FIG. 46 is a plan view of an example of the first electrode section 141A, the second electrode section 141B, and the third electrode section 141C. The first electrode section 141A may have the first pixel section 142A and the first connection section 143A. The second electrode section 141B may have the second pixel section 142B and the second connection sections 143B. The third electrode section 141C may have a third pixel section 142C and third connection sections 143C. The third connection section 143C may be connected to the first connection section 143A or the second connection section 143B.

Each of the first pixel section 142A, the second pixel section 142B, and the third pixel section 142C may include one first layer 140A that overlaps one organic layer 130, one second layer 140B that overlaps one organic layer 130, and one third layer 140O that overlaps one organic layer 130. The first pixel section 142A, the second pixel section 142B, and the third pixel section 142C may have the same shape.

When viewed in the second element direction G2, the first pixel section 142A and the second pixel section 142B may overlap each other. When viewed in the second element direction G2, the plurality of third pixel sections 142C may overlap each other. When viewed in the second element direction G2, the third pixel section 142C does not need to overlap the first pixel section 142A or the second pixel section 142B.

The shape of the first connection section 143A may be different from the shape of the second connection section 143B or the shape of the third connection section 143C. The shape of the second connection section 143B may be the same as the shape of the third connection section 143C or may be different from the shape of the third connection section 143C.

An example of the organic device 100 will be described with reference to FIGS. 47 and 48.

Figure 47:
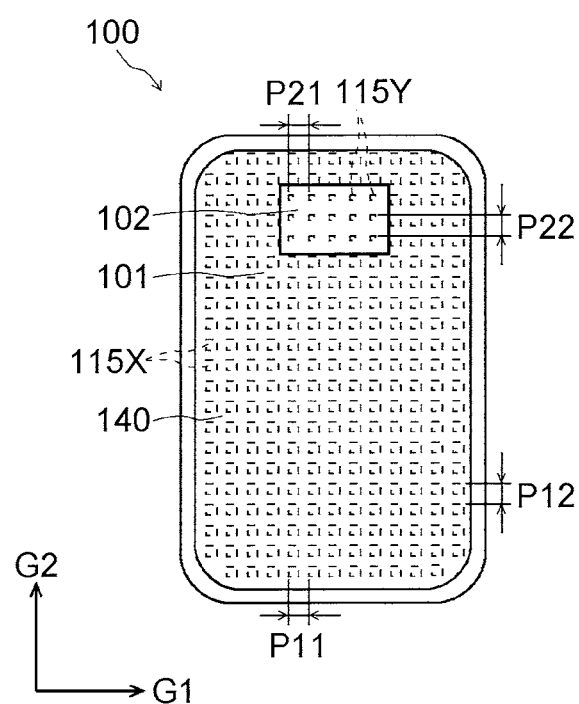
FIG. 47 is a plan view of an example of the organic device.

FIG. 47 is a plan view of an example of the organic device 100. The elements 115 located in the first display area 101 are also referred to as elements 115X. The elements 115 located in the second display area 102 are also referred to as elements 115Y.

In the first display area 101, organic layers of the elements 115X may be arranged at the eleventh pitch P11 in the first element direction G1. In the second display area 102, organic layers of the elements 115Y may be arranged at the twelfth pitch P12 in the first element direction G1. The twelfth pitch P12 may be the same as the eleventh pitch P11. Since the twelfth pitch P12 is the same as the eleventh pitch P11, it is possible to reduce the visual difference between the first display area 101 and the second display area 102.

In the first display area 101, organic layers of the elements 115X may be arranged at the twenty-first pitch P21 in the second element direction G2. In the second display area 102, organic layers of the elements 115Y may be arranged at the twenty-second pitch P22 in the second element direction G2. The twenty-second pitch P22 may be the same as the twenty-first pitch P21. Since the twenty-second pitch P22 is the same as the twenty-first pitch P21, it is possible to reduce the visual difference between the first display area 101 and the second display area 102.

Figure 48:
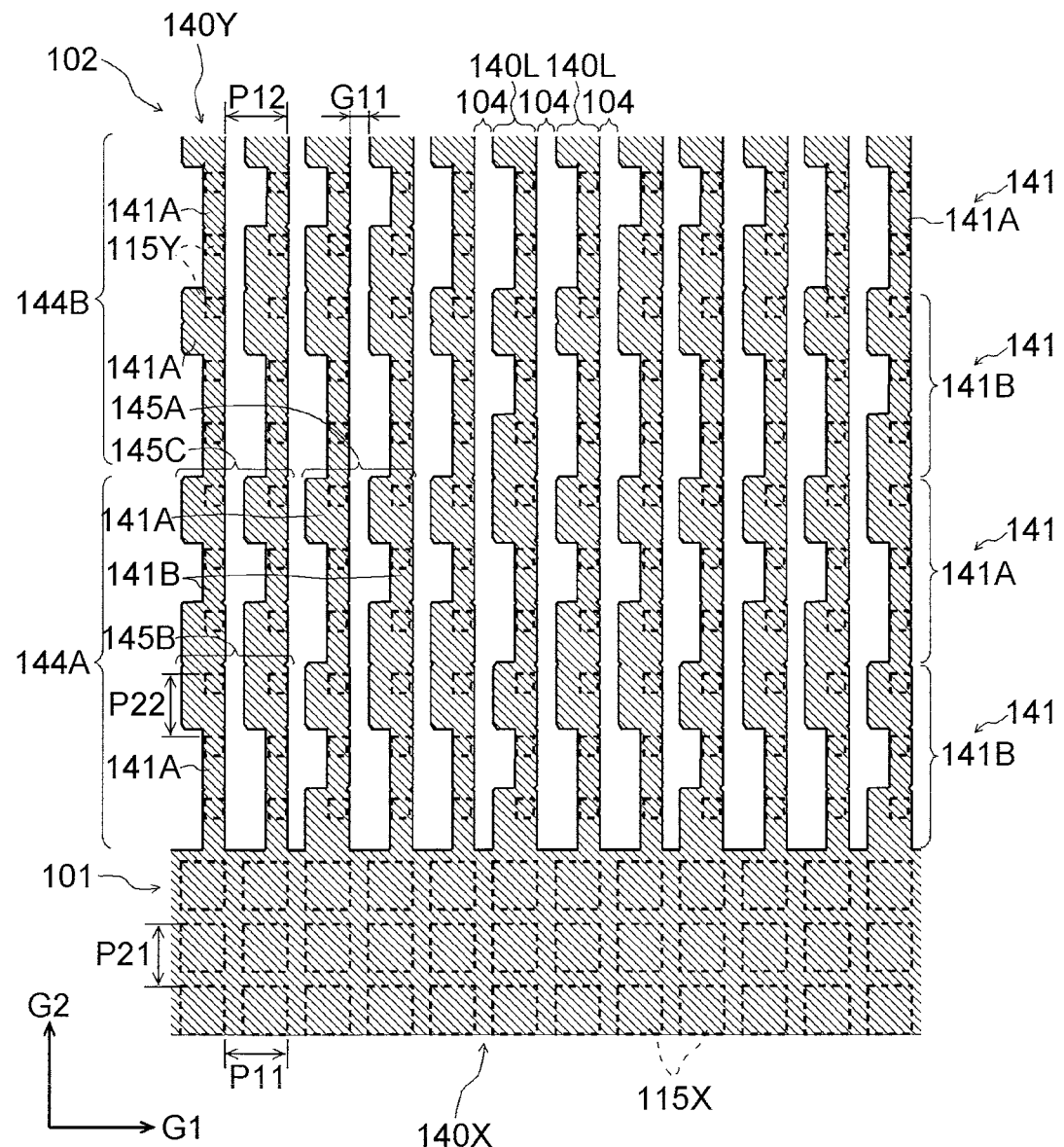
FIG. 48 is a plan view of an example of the second display area.

FIG. 48 is a plan view of an example of the second display area 102 shown in FIG. 47. The area of the element 115Y in the second display area 102 may be less than the area of the element 115X in the first display area 101. For example, the area of the organic layer of the element 115Y in the second display area 102 may be less than the area of the organic layer of the element 115X in the first display area 101. For example, the area of the first electrode of the element 115Y in the second display area 102 may be less than the area of the first electrode of the element 115X in the first display area 101. When the area of the element 115Y is less than the area of the element 115X, the transmission areas 104 are able to be formed in the second display area 102 as shown in FIG. 48. The plurality of electrode lines 140L, as well as the elements 115Y, may be arranged at the twelfth pitch P12 in the first element direction G1.

The ratio of the area of the first electrode of the element 115Y to the area of the first electrode of the element 115X, for example, may be greater than or equal to 0.1, may be greater than or equal to 0.2, or may be greater than or equal to 0.3. The ratio of the area of the first electrode of the element 115Y to the area of the first electrode of the element 115X, for example, may be less than or equal to 0.5, may be less than or equal to 0.7, or may be less than or equal to 0.9. The range of the ratio of the area of the first electrode of the element 115Y to the area of the first electrode of the element 115X may be determined by a first group consisting of 0.1, 0.2, and 0.3 and/or a second group consisting of 0.5, 0.7, and 0.9. The range of the ratio of the area of the first electrode of the element 115Y to the area of the first electrode of the element 115X may be determined by a combination of any one of the values in the first group and any one of the values in the second group. The range of the ratio of the area of the first electrode of the element 115Y to the area of the first electrode of the element 115X may be determined by a combination of any two of the values in the first group. The range of the ratio of the area of the first electrode of the element 115Y to the area of the first electrode of the element 115X may be determined by a combination of any two of the values in the second group. For example, the ratio of the area of the first electrode of the element 115Y to the area of the first electrode of the element 115X may be greater than or equal to 0.1 and less than or equal to 0.9, may be greater than or equal to 0.1 and less than or equal to 0.7, may be greater than or equal to 0.1 and less than or equal to 0.5, may be greater than or equal to 0.1 and less than or equal to 0.3, may be greater than or equal to 0.1 and less than or equal to 0.2, may be greater than or equal to 0.2 and less than or equal to 0.9, may be greater than or equal to 0.2 and less than or equal to 0.7, may be greater than or equal to 0.2 and less than or equal to 0.5, may be greater than or equal to 0.2 and less than or equal to 0.3, may be greater than or equal to 0.3 and less than or equal to 0.9, may be greater than or equal to 0.3 and less than or equal to 0.7, may be greater than or equal to 0.3 and less than or equal to 0.5, may be greater than or equal to 0.5 and less than or equal to 0.9, may be greater than or equal to 0.5 and less than or equal to 0.7, or may be greater than or equal to 0.7 and less than or equal to 0.9.

An example of a method of forming the transmission area 104 will be described with reference to FIGS. 49 to 52. Specifically, an example in which an inhibition layer is formed on the substrate 110 before a process of forming the second electrode 140 will be described. The inhibition layer has properties such that a conductive material of the second electrode 140 is difficult to be deposited.

Figure 49:
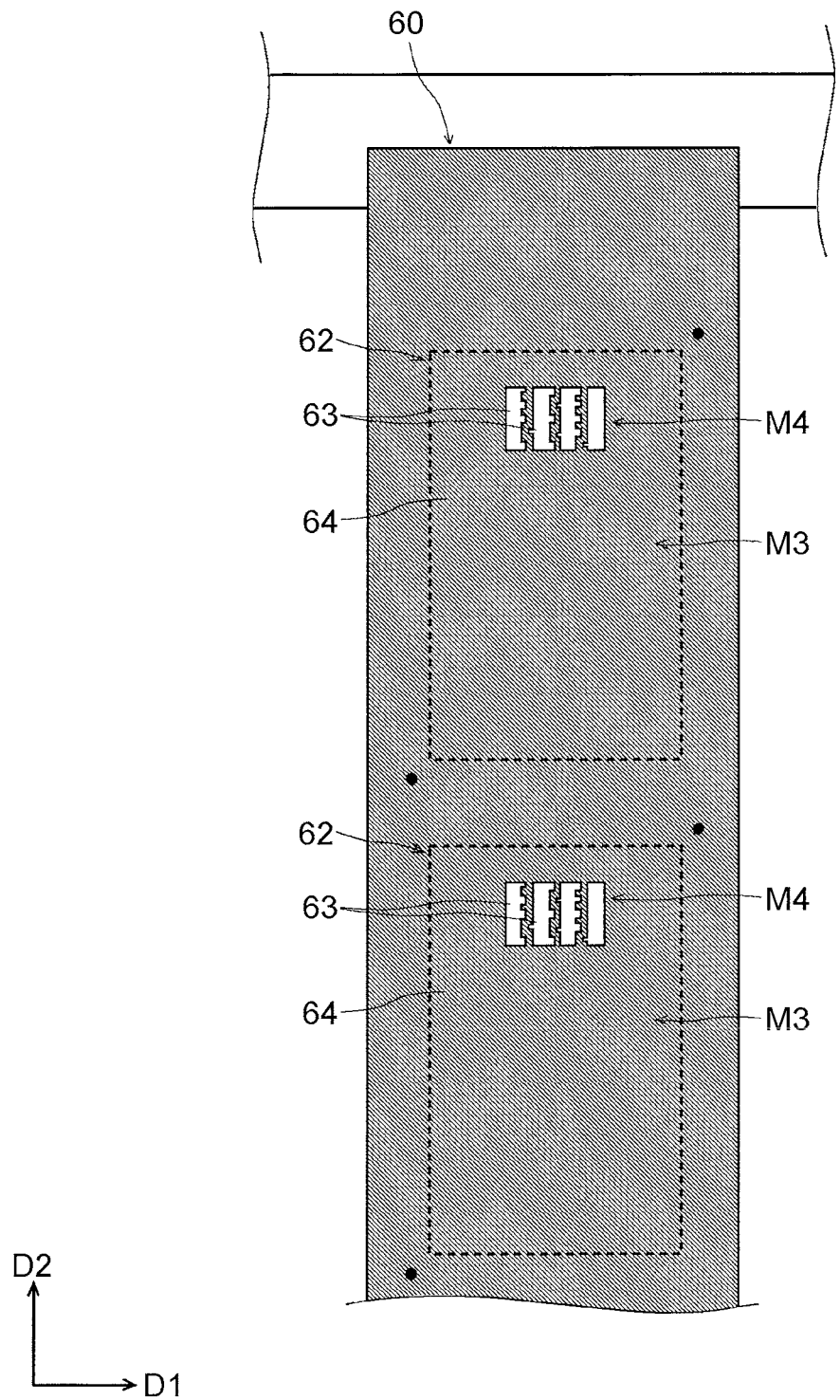
FIG. 49 is a plan view of an example of a mask for forming an inhibition layer.

FIG. 49 is a plan view of an example of a mask 60 for forming an inhibition layer. The mask 60 includes at least one cell 62. The cell 62 has through-holes 63 and a blocking area 64. The mask 60 may include two or more cells 62. One cell 62 may correspond to the display area of one organic EL display device, that is, one screen.

The mask 60, as well as the mask 50, includes the third mask area M3 and the fourth mask area M4. The third mask area M3 corresponds to the first display area 101 of the organic device 100. The fourth mask area M4 corresponds to the second display area 102 of the organic device 100.

The third mask area M3 includes the blocking area 64. The third mask area M3 does not need to have the through-hole 63. In other words, the entire third mask area M3 may be made up of the blocking area 64.

The fourth mask area M4 have the through-holes 63 and the blocking areas 64. The through-holes 63 in the fourth mask area M4 correspond to the transmission areas 104. For example, the fourth mask area M4 may have the plurality of through-holes 63 arranged in the first mask direction D1. The through-holes 63 may cross the fourth mask area M4 in the second mask direction D2. The blocking areas 64 of the fourth mask area M4 correspond to the second electrode 140Y. For example, the fourth mask area M4 may have the plurality of blocking areas 64 arranged in the first mask direction D1. For example, the blocking areas 64 may extend in the second mask direction D2. For example, each of the blocking areas 64 of the fourth mask area M4 may have a first end and a second end connected to the blocking area 64 of the third mask area M3. The second end is located on the side opposite to the first end in the second mask direction D2.

Figure 50:
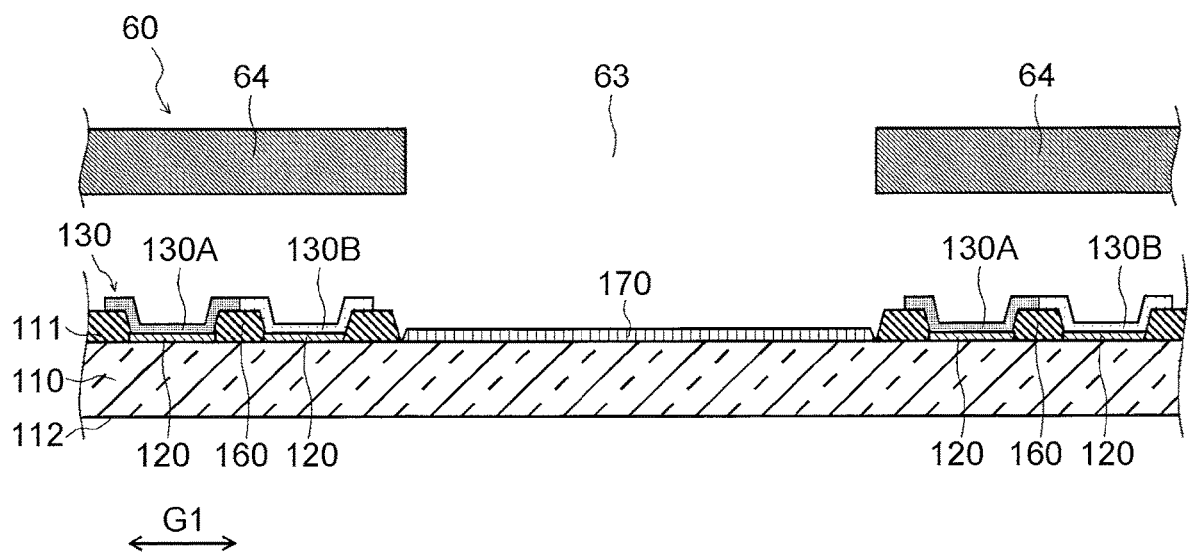
FIG. 50 is a sectional view of an example of a process of forming an inhibition layer.

FIG. 50 is a sectional view of an example of an inhibition layer forming process of forming an inhibition layer 170. The inhibition layer forming process is performed after a process of forming the organic layers 130 and before a process of forming the second electrode 140.

The inhibition layer forming process may include a process of depositing the material of the inhibition layer 170 on the substrate 110 via the mask 60. As shown in FIG. 50, the inhibition layer 170 is formed in areas of the substrate 110, which overlap the through-holes 63.

Figure 51:
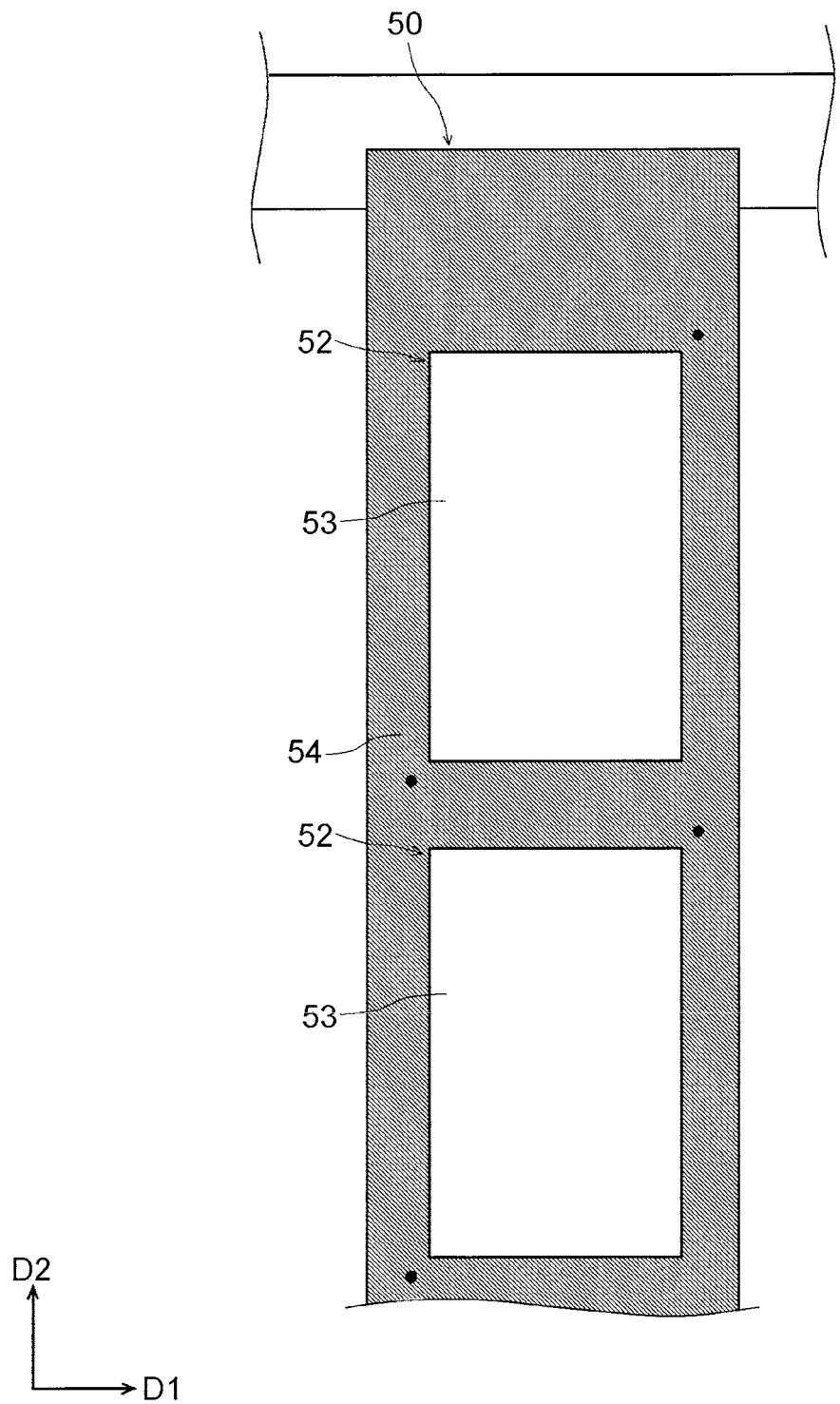
FIG. 51 is a plan view of an example of a mask for forming a second electrode.

FIG. 51 is a plan view of an example of the mask 50 for forming the second electrode 140. The mask 50 includes at least one cell 52. Each cell 52 is made up of the through-hole 53. Each cell 52 is surrounded by the blocking area 54.

Figure 52:
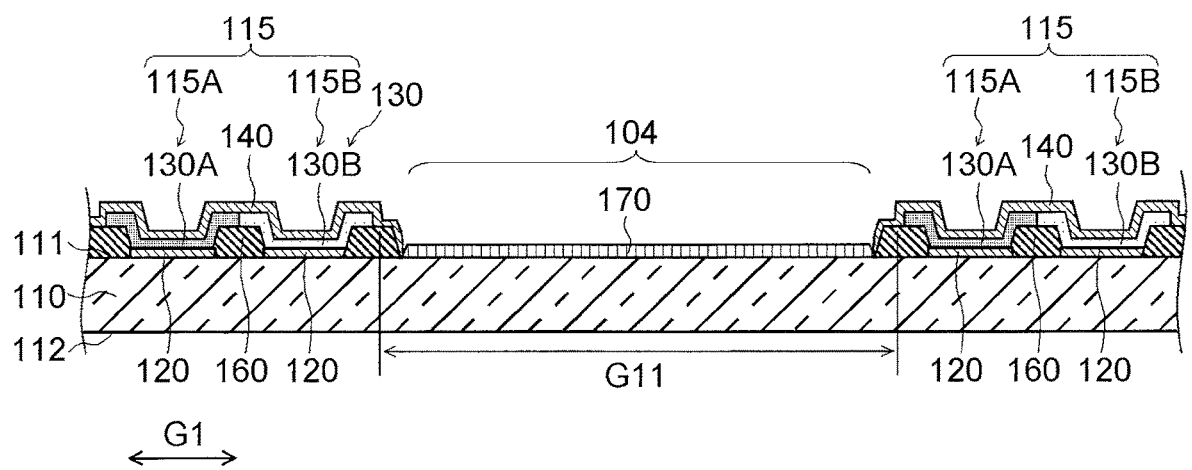
FIG. 52 is a sectional view of an example of a process of forming the second electrode.

FIG. 52 is a sectional view of an example of a process of forming the second electrode 140. The second electrode 140 is formed by depositing the material of the second electrode 140 on the substrate 110 via the mask 50 shown in FIG. 51. As described above, the inhibition layer 170 has properties such that a conductive material of the second electrode 140 is difficult to be deposited. As shown in FIG. 52, it is possible to inhibit formation of the second electrode 140 on the inhibition layer 170.

Therefore, the area in which the inhibition layer 170 is formed is able to function as the transmission area 104.

The inhibition layer 170 has transparency. For example, the transmittance of a stack that includes the substrate 110 and the inhibition layer 170 is preferably higher than or equal to 70% and more preferably higher than or equal to 80%. The transmittance of the stack that includes the substrate 110 and the inhibition layer 170 is able to be measured by a method of testing a total light transmittance of plastic-transparent material, which is in conformity with JIS K7361-1.

The material of the inhibition layer 170 may be the material of a nucleation inhibiting coating, described in WO2017072678A1 or WO2019150327A1. Examples of the material of the inhibition layer 170 may include organic materials, such as low-molecular organic materials and organic polymers. Examples of the organic materials may include polycycle aromatic compounds. A polycycle aromatic compound includes an organic molecule that includes a core portion and at least one terminal portion bound to the core portion. An organic molecule may include one or plurality of hetero atoms, such as nitrogen, sulfur, oxygen, phosphorus, and aluminum. The number of terminal portions may be greater than or equal to one, may be greater than or equal to two, may be greater than or equal to three, or may be greater than or equal to four. When the organic molecule includes two or more terminal portions, the two or more terminal portions may be the same or may be different.

The terminal portion may include a biphenylyl part expressed by any one of the following chemical structures (1-a), (1-b), and (1-c).

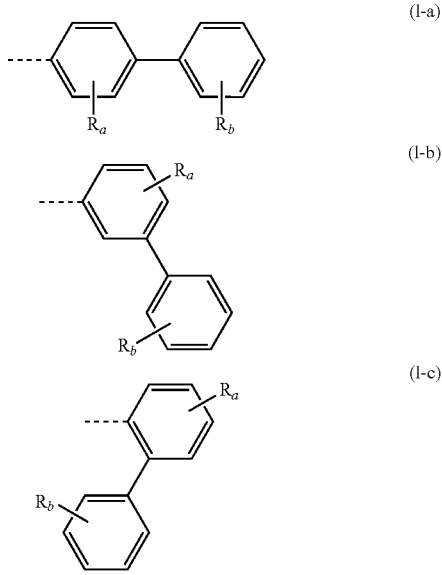

The substituents Ra and Rb each may be independently selected from among deuterium, fluorine, alkyls including $C_1$ to $C_4$ alkyls, cycloalkyl, arylated alkyl, silyl, aryl, heteroaryl, fluoroalkyl, and any combination of these.

An example of a method of forming the transmission area 104 will be described with reference to FIGS. 53 and 54. Specifically, an example in which the transmission area 104 is formed by partially removing the second electrode 140 will be described.

Figure 53:
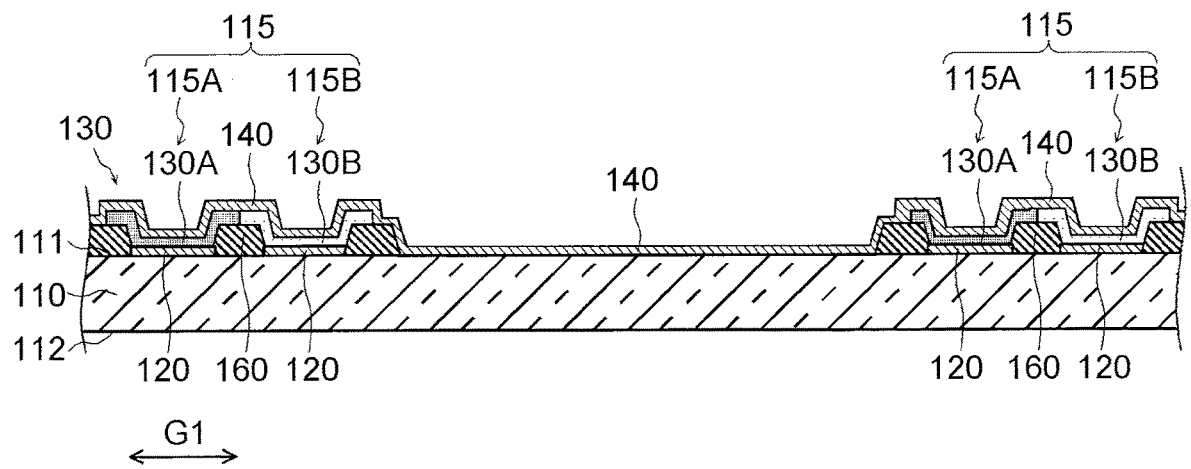
FIG. 53 is a sectional view of an example of the process of forming the second electrode.
Figure 54:
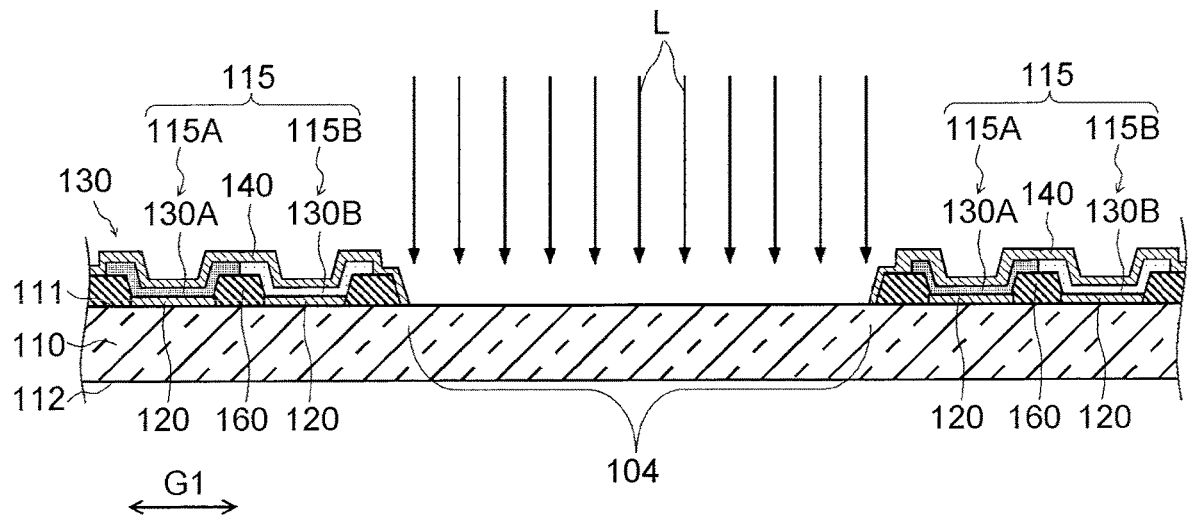
FIG. 54 is a sectional view of an example of a process of removing the second electrode.

FIG. 53 is a sectional view of an example of a process of forming the second electrode 140. The second electrode 140 shown in FIG. 53 is formed by depositing the material of the second electrode 140 on the substrate 110 via the mask 50 shown in FIG. 51. In this case, the second electrode 140 is formed in the entire first display area 101 and the entire second display area 102.

After a process of forming the second electrode 140, a process of partially removing the second electrode 140 is performed. For example, as shown in FIG. 54, laser L is partially applied to the second electrode 140 in the second display area 102. Because the second electrode 140 irradiated with laser L flies out, the transmission area 104 is formed.

Although not shown in the drawing, laser L may be applied to the second electrode 140 via a laser mask. The laser mask has a through-hole corresponding to the transmission area 104.

EXAMPLES

Next, the embodiment of the present disclosure will be further specifically described by way of examples. The embodiment of the present disclosure is not limited to the following examples without departing from the scope of the present disclosure.

Example 1

Diffraction of light having passed through between the electrode lines 140L was tested by simulation.

Figure 38:
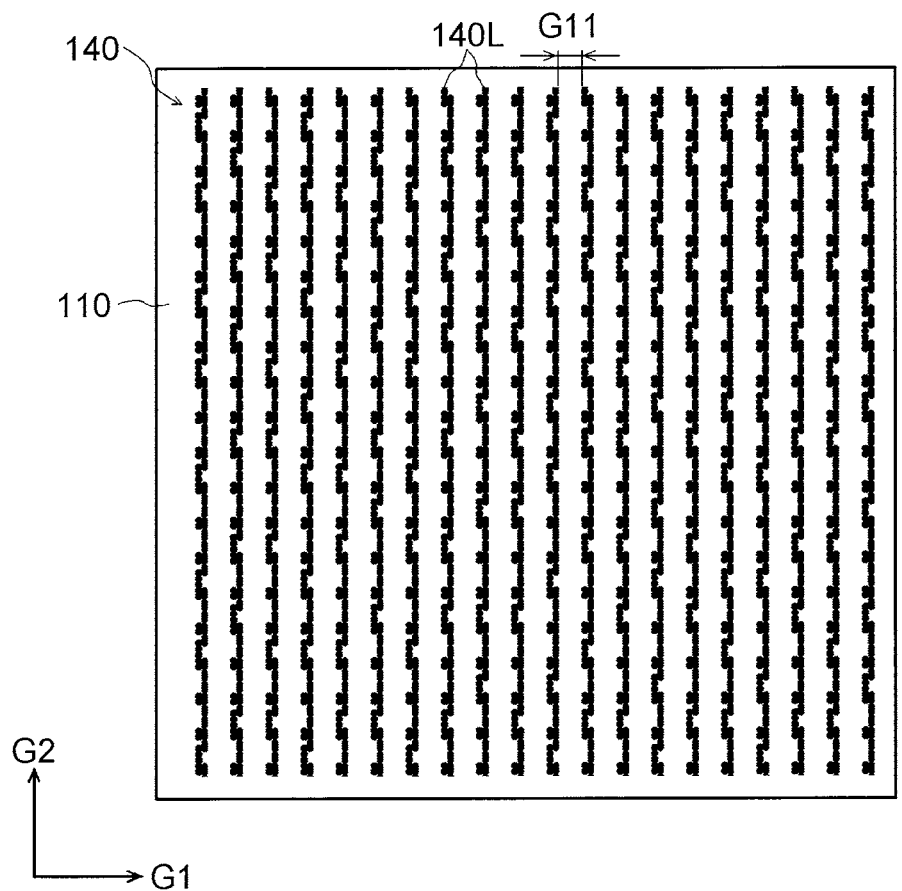
FIG. 38 is a plan view of a second electrode according to Example 1.

The substrate 110 and the second electrode 140 shown in FIG. 38 were designed. The second electrode 140 includes the plurality of electrode lines 140L arranged in the first element direction G1. The electrode lines 140L are the same as the electrode lines 140L shown in FIG. 3. The gap G11 varies irregularly according to a location in the first element direction G1 and the second element direction G2.

Figure 39:
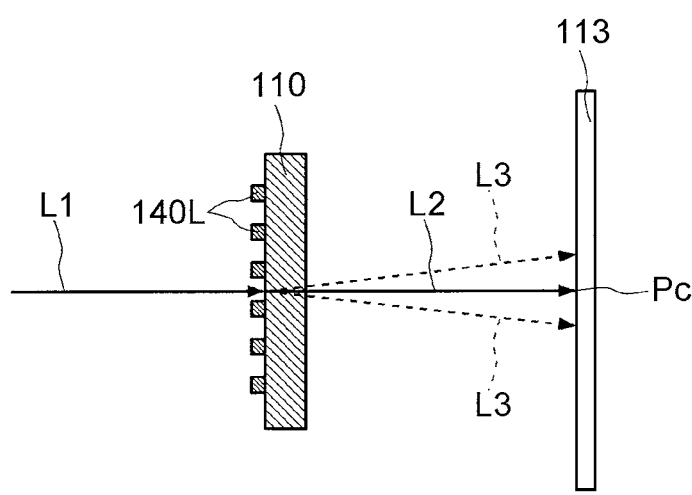
FIG. 39 is a diagram of a method of evaluating the diffraction properties of the second electrode.

Based on the configuration shown in FIG. 39, an intensity distribution of light that passes through between the electrode lines 140L and reaches a screen 113 was calculated by simulation. Initially, light L1 was caused to enter the substrate 110 in the direction normal to the substrate 110. Subsequently, diffraction of light, caused by the electrode lines 140L, was calculated by simulation. The reference sign L2 represents light that travels straight and reaches the screen 113 without diffraction. The reference sign Pc represents a point that the light L3 reaches on the screen 113. The reference sign L3 represents light diffracted when passing through between the electrode lines 140L. The wavelength of the light L1 is 550 nm. The distance between the electrode lines 140L and the screen 113 is 5000 mm. Refraction of light due to the substrate 110 was ignored.

Figure 40:
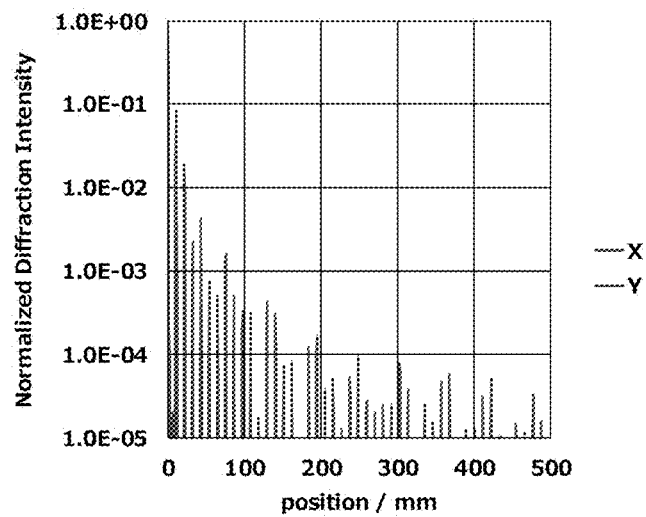
FIG. 40 is a graph of evaluation results of the second electrode of Example 1.
Figure 41:
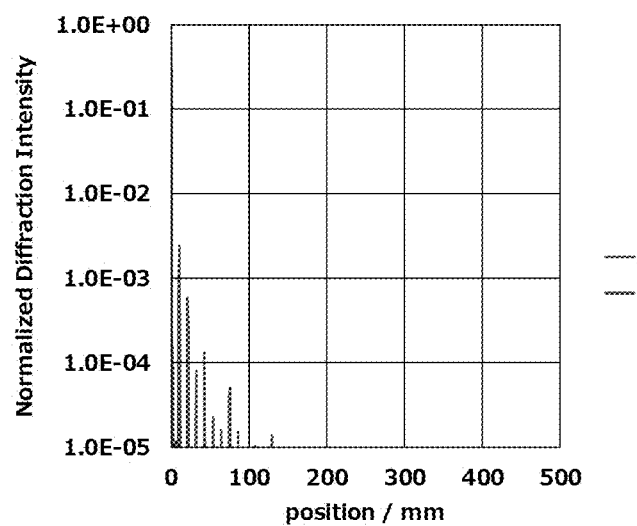
FIG. 41 is a graph of evaluation results of the second electrode of Example 1.

The results of the simulation are shown in FIGS. 40 and 41. The abscissa axis represents a distance from point Pc. The ordinate axis represents the intensity of light having reached the screen 113. FIG. 40 shows simulation results in the case where the transmittance of each electrode line 140L is set to 0%. FIG. 41 shows simulation results in the case where the transmittance of each electrode line 140L is set to 60%.

Example 2

Figure 42:
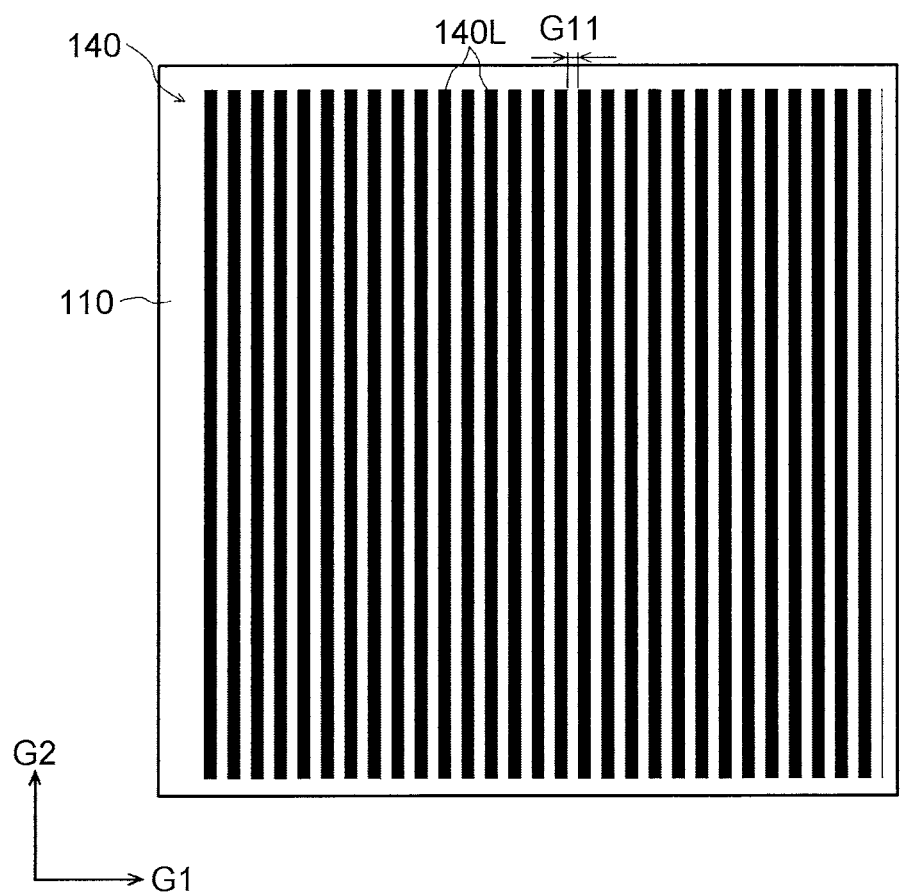
FIG. 42 is a plan view of a second electrode in a second display area according to Example 2.

The substrate 110 and the second electrode 140 shown in FIG. 42 were designed. The second electrode 140 includes the plurality of electrode lines 140L arranged in the first element direction G1. The electrode lines 140L are the same as the electrode lines 140L shown in FIG. 22. The gap G11 is constant regardless of a location in the first element direction G1 and the second element direction G2.

Figure 43:
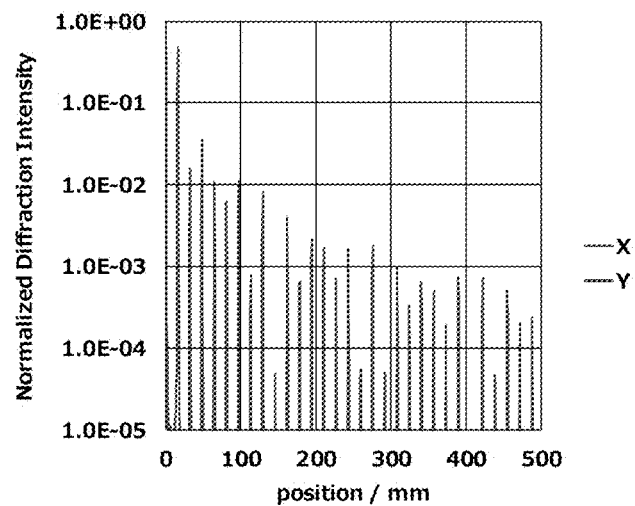
FIG. 43 is a graph of evaluation results of the second electrode of Example 2.
Figure 44:
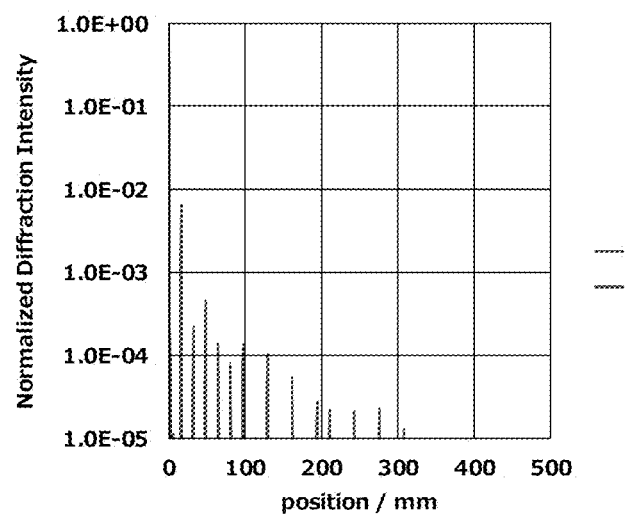
FIG. 44 is a graph of evaluation results of the second electrode of Example 2.

An intensity distribution of light that passes through between the electrode lines 140L and reaches the screen 113 was calculated by simulation. The results of the simulation are shown in FIGS. 43 and 44. FIG. 43 shows simulation results in the case where the transmittance of each electrode line 140L is set to 0%. FIG. 44 shows simulation results in the case where the transmittance of each electrode line 140L is set to 60%.

As is apparent from the comparison between FIG. 40 and FIG. 43 and the comparison between FIG. 41 and FIG. 44, high-intensity diffracted light L3 reaching the screen 113 is reduced by varying the gap G11 irregularly.

The invention claimed is:
1. An organic device comprising:
a substrate;
first electrodes disposed on the substrate;
organic layers respectively disposed on the first electrodes; and a second electrode disposed on the organic layers, wherein when the organic device is viewed in a direction normal to the substrate, the organic device includes a first display area that includes the second electrode at a first occupancy and a second display area that includes the second electrode at a second occupancy lower than the first occupancy, in the second display area, the organic layers are arranged in a first direction and in a second direction that intersects with the first direction, the second electrode includes electrode lines arranged in the first direction, each of the electrode lines includes electrode sections that are arranged in the second direction and that overlap the organic layers, any adjacent two of the electrode sections in the second direction are connected to each other, and the electrode sections include a first electrode section having a first shape and a second electrode section having a second shape different from the first shape.

2. The organic device according to claim 1, wherein the first electrode section includes a first pixel section that overlaps the organic layer, and a first connection section connected to the first pixel section, the second electrode section includes a second pixel section that overlaps the organic layer, and a second connection section connected to the second pixel section, and a shape of the first connection section is different from a shape of the second connection section.

3. The organic device according to claim 2, wherein an area of the first connection section is different from an area of the second connection section.

4. The organic device according to claim 2, wherein the first connection section includes a first connection end connected to the first pixel section, and a second connection end disposed on a side opposite to the first connection end in the second direction, a location of the first connection end in the first direction is the same as a location of the second connection end in the first direction, the second connection section includes a third connection end connected to the second pixel section, and a fourth connection end is posed on a side opposite to the third connection end in the second direction, and a location of the third connection end in the first direction is different from a location of the fourth connection end in the first direction.

5. The organic device according to of claim 1, wherein the first electrode section includes a first pixel section that overlaps the organic layer, and a first connection section connected to the first pixel section, the second electrode section includes a second pixel section that overlaps the organic layer, and a second connection section connected to the second pixel section, and a shape of the first pixel section is different from a shape of the second pixel section.

6. The organic device according to claim 5, wherein an area of the first pixel section is different from an area of the second pixel section.

7. The organic device according to claim 5, wherein a size of the first pixel section in the first direction is different from a size of the second pixel section in the first direction.

8. The organic device according to claim 1, wherein the electrode sections include a first electrode connection at which the first electrode section and the second electrode section are connected in the second direction, and a second electrode connection at which the first electrode section and the first electrode section are connected in the second direction.

9. The organic device according to claim 1, wherein the electrode sections include a first electrode array in which the first electrode section and the second electrode section are arranged in the first direction, and a second electrode array in which the first electrode section and the first electrode section are arranged in the first direction.

10. The organic device according to claim 1, wherein the electrode sections include a third electrode section that has a third shape different from the first shape and different from the second shape.

11. A group of masks having a first mask direction and a second mask direction that intersects with the first mask direction, the group of the masks comprising:

two or more masks, wherein each of the masks includes a blocking area and through-holes, when a mask stack in which the two or more masks are stacked is viewed in a direction normal to the masks, the mask stack includes a through area that overlaps the through-holes, when the mask stack is viewed in the direction normal to the masks, the mask stack has a first mask area that includes the through area with a first open area ratio, and a second mask area that includes the through area with a second open area ratio less than the first open area ratio, in the second mask area, the through area includes through lines arranged in the first mask direction, each of the through lines includes through sections arranged in the second mask direction, any adjacent two of the through sections in the second mask direction are connected to each other, and the through sections include a first through section having a first through shape and a second through section having a second through shape different from the first through shape.

12. The group of the masks according to claim 11, wherein the first through section includes a first main section, and a first sub-section connected to the first main section, the second through section includes a second main section, and a second sub-section connected to the second main section, and a shape of the first sub-section is different from a shape of the second sub-section.

13. The group of the masks according to claim 12, wherein an area of the first sub-section is different from an area of the second sub-section.

14. The group of the masks according to claim 12, wherein the first sub-section includes a fifth connection end connected to the first main section, and a sixth connection end disposed on a side opposite to the fifth connection end in the second mask direction, a location of the fifth connection end in the first mask direction is the same as a location of the sixth connection end in the first mask direction, the second sub-section includes a seventh connection end connected to the second main section, and an eighth connection end disposed on a side opposite to the seventh connection end in the second mask direction, and a location of the seventh connection end in the first mask direction is different from a location of the eighth connection end in the first mask direction.

15. The group of the masks according to claim 11, wherein
the first through section includes a first main section, and a first sub-section connected to the first main section,
the second through section includes a second main section, and a second sub-section connected to the second main section, and
a shape of the first main section is different from a shape of the second main section.

16. The group of the masks according to claim 15, wherein an area of the first main section is different from an area of the second main section.

17. The group of the masks according to claim 15, wherein a size of the first main section in the first mask direction is different from a size of the second main section in the first mask direction.

18. The group of the masks according to claim 11, wherein the through sections include a first mask connection at which the first through section and the second through section are connected in the second mask direction, and a second mask connection at which the first through section and the first through section are connected in the second mask direction.

19. The group of the masks according to claim 11, wherein the through sections include a first mask array in which the first through section and the second through section are arranged in the first mask direction, and a second mask array in which the first through section and the first through section are arranged in the first mask direction.

20. The group of the masks according to claim 11, wherein the through sections include a third through section having a third through shape different from the first through shape and different from the second through shape.

21. A mask having a first mask direction and a second mask direction that intersects with the first mask direction, the mask comprising:
a blocking area; and
through-holes, wherein
when the mask is viewed in a direction normal to the mask, the mask has a third mask area that includes the through-holes at a third open area ratio, and a fourth mask area that includes the through-holes at a fourth open area ratio less than the third open area ratio,
in the third mask area, the through-holes are arranged at a fifteenth pitch in the first mask direction,
in the fourth mask area, a gap between two of the through-holes arranged in the first mask direction is greater than the fifteenth pitch, and
the fourth mask area includes the through-holes each having a shape different from a shape of each of the through-holes of the third mask area.

22. The mask according to claim 21, wherein
in the third mask area, each of the through-holes includes a main hole and a sub-hole,
a gap between the main hole and the sub-hole is greater than or equal to 5 μm and less than or equal to 40 μm,
in the fourth mask area, the through-holes include first-type through-holes and second-type through-holes, and
the number of the main holes of the first-type through-holes is different from the number of the main holes of the second-type through-holes, or the number of the sub-holes of the first-type through-holes is different from the number of the sub-holes of the second-type through-holes.

23. The mask according to claim 22, wherein, in the fourth mask area, the through-holes include a first hole array in which the first-type through-hole and the second-type through-hole are arranged in the first mask direction, and a second hole array in which the first-type through-hole and the first-type through-hole are arranged in the first mask direction.

24. The mask according to claim 22, wherein, in the fourth mask area, the through-holes include a fourth hole array in which the first-type through-hole and the second-type through-hole are arranged in the second mask direction, and a fifth hole array in which the second-type through-hole and the second-type through-hole are arranged in the second mask direction.

25. A manufacturing method for an organic device, the manufacturing method comprising:
a second electrode forming step of forming a second electrode on organic layers respectively on first electrodes on a substrate by using the group of the masks according to claim 11, wherein
the second electrode forming step includes
a step of forming a first layer of the second electrode by vapor deposition using a first one of the masks; and
a step of forming a second layer of the second electrode by vapor deposition using a second one of the masks.

* * * * *